United States Patent
Wulff et al.

(10) Patent No.: US 12,143,159 B2
(45) Date of Patent: Nov. 12, 2024

(54) RADIO-FREQUENCY SIGNAL PROCESSING SYSTEMS AND METHODS

(71) Applicant: Distributed Spectrum Inc., New York, NY (US)

(72) Inventors: Alexander Wulff, New York, NY (US); Benjamin Harpe, New York, NY (US); Isaac Struhl, New York, NY (US)

(73) Assignee: Distributed Spectrum Inc., New York, NY (US)

( * ) Notice: Subject to any disclaimer, the term of this patent is extended or adjusted under 35 U.S.C. 154(b) by 121 days.

(21) Appl. No.: 17/871,258

(22) Filed: Jul. 22, 2022

(65) Prior Publication Data

US 2023/0027182 A1 Jan. 26, 2023

Related U.S. Application Data

(60) Provisional application No. 63/232,605, filed on Aug. 12, 2021, provisional application No. 63/225,130, filed on Jul. 23, 2021.

(51) Int. Cl.
*H04B 7/15* (2006.01)
*G01S 5/02* (2010.01)
(Continued)

(52) U.S. Cl.
CPC ........ *H04B 17/102* (2015.01); *G01S 5/02213* (2020.05); *H04B 7/15* (2013.01);
(Continued)

(58) Field of Classification Search
CPC ........ G01S 5/02; G01S 5/02213; G01S 7/288; H02J 5/005; H02J 50/00; H02J 50/20;
(Continued)

(56) References Cited

U.S. PATENT DOCUMENTS 9,485,266 B2 11/2016 Baxley et al.
9,485,267 B2 11/2016 Baxley et al.
(Continued)

FOREIGN PATENT DOCUMENTS

EP 3 910 822 A1 11/2021

OTHER PUBLICATIONS

International Search Report and Written Opinion mailed Oct. 6, 2022, in connection with International Application No. PCT/US22/38012.

(Continued)

*Primary Examiner* — Shawkat M Ali
(74) *Attorney, Agent, or Firm* — Wolf, Greenfield & Sacks, P.C.

(57) ABSTRACT

The present disclosure provides radio-frequency (RF) systems that can detect the presence of RF signals received by the system, as well as determine characteristics such as the operating frequency of RF signals, the type of RF source that transmitted each RF signal, and/or the location of each RF source with high precision and sensitivity while using low cost, scalable electronics that are versatile enough for deployment in a variety of environments. Such systems can employ a network of RF sensors that can coordinate in response to communication with a computer to perform any such detection and/or determination using trained models executed onboard the RF sensors and/or the computer. RF signals may have unique characteristics when received at one or more RF sensors that may be detected using trained models described herein, even in high noise or non-line of sight (LOS) environments and with low cost, low resolution RF receiver hardware.

18 Claims, 26 Drawing Sheets

(51) Int. Cl.
| | |
|---|---|
| *H04B 17/10* | (2015.01) |
| *H04B 17/13* | (2015.01) |
| *H04B 17/18* | (2015.01) |
| *H04B 17/391* | (2015.01) |
| *H04W 4/38* | (2018.01) |
| *G06F 18/214* | (2023.01) |
| *H04B 1/00* | (2006.01) |
| *H04B 17/27* | (2015.01) |
| *H04L 27/00* | (2006.01) |

(52) U.S. Cl.
CPC .............. *H04B 17/13* (2015.01); *H04B 17/18* (2015.01); *H04B 17/3911* (2015.01); *H04B 17/3913* (2015.01); *H04W 4/38* (2018.02); *G06F 18/214* (2023.01); *H04B 1/0003* (2013.01); *H04B 17/27* (2015.01); *H04L 27/0002* (2013.01)

(58) Field of Classification Search
CPC ......... H02J 50/80; H04B 7/15; H04B 10/116; H04B 15/02; H04B 17/10; H04B 17/13; H04B 17/18; H04B 17/21; H04B 17/26; H04B 17/391; H04B 17/3911; H04B 17/3913; H04L 1/00; H04L 27/00; H04L 27/0002; H04L 29/06; H04L 29/08; H04W 4/38; H04W 24/00; H04W 27/04; H04W 27/08; H04W 64/00
USPC ........ 375/211, 219, 295, 340; 381/312, 315, 381/317
See application file for complete search history.

(56) References Cited

U.S. PATENT DOCUMENTS

| | | | |
|---|---|---|---|
| 9,551,781 B2 | 1/2017 | Baxley et al. | |
| 9,560,060 B2 | 1/2017 | Baxley et al. | |
| 9,591,013 B2 | 3/2017 | Baxley et al. | |
| 9,635,044 B2 | 4/2017 | Baxley et al. | |
| 9,736,175 B2 | 8/2017 | Baxley et al. | |
| 9,739,868 B2 | 8/2017 | Baxley et al. | |
| 9,880,256 B2 | 1/2018 | Baxley et al. | |
| 9,945,928 B2 | 4/2018 | Baxley et al. | |
| 10,104,098 B2 | 10/2018 | Baxley et al. | |
| 10,122,736 B2 | 11/2018 | Baxley et al. | |
| 10,338,191 B2 | 7/2019 | Baxley et al. | |
| 10,473,749 B1 | 11/2019 | Baxley et al. | |
| 10,578,730 B2 | 3/2020 | Cardno et al. | |
| 11,259,197 B2 | 2/2022 | Dzierwa et al. | |
| 2013/0064328 A1 | 3/2013 | Adnani et al. | |
| 2016/0127907 A1 | 5/2016 | Baxley et al. | |
| 2016/0127931 A1 | 5/2016 | Baxley et al. | |
| 2017/0222719 A1 | 8/2017 | Haas et al. | |
| 2017/0238304 A1 | 8/2017 | Ling et al. | |
| 2018/0324595 A1 | 11/2018 | Shima | |
| 2020/0136711 A1* | 4/2020 | Cao ....................... | H04B 7/0626 |
| 2020/0142022 A1* | 5/2020 | Baxley ................. | G01S 5/0054 |
| 2020/0252412 A1 | 8/2020 | Prasad Koppisetti et al. | |
| 2021/0091829 A1 | 3/2021 | Shake et al. | |
| 2022/0386249 A1 | 12/2022 | Meshkati et al. | |
| 2023/0021777 A1 | 1/2023 | Wulff et al. | |
| 2023/0027893 A1 | 1/2023 | Wulff et al. | |
| 2023/0228834 A1* | 7/2023 | Gummadi ............... | G01S 5/145 342/458 |

OTHER PUBLICATIONS

[No Author Listed], Fireside Hacks: A Conversation with Distributed Spectrum | NSIN Track. YouTube. Oct. 19, 2021. https://www.youtube.com/watch?v=CquBWk4Jq4E [Last Accessed Aug. 17, 2020]. 3 pages.
[No Author Listed], Modular, Real-Time RF Spectrum. Distributed Spectrum. 2021. 9 pages.
[No Author Listed], Modular and Highly-Scalable Spectrum. Distributed Spectrum, LLC. 2021. 1 page.
[No Author Listed], Report ITU-R SM.2355-1. SM Series Spectrum Management. 2019. 34 pages.
[No Author Listed], Radio Frequency Detection, Spectrum Analysis, and Direction Finding Equipment. Market Survey Report. NUSTL. Apr. 2019. 22 pages.
[No Author Listed], RTL-SDR Blog V3 Datasheet. https://www.rtl-sdr.com [Last Accessed Aug. 17, 2022] 8 pages.
[No Author Listed], TDOA Transmitter Localization with RTL-SDRs. Panoradio SDR. Jun. 8, 2022. 14 pages.
Aksu et al. Requirements for Spectrum Monitoring in Industrial Environments. NISTIR 8195. Nov. 2017. 24 pages.
Bhattacharya et al., Selection of Sensors for Efficient Transmitter Location. IEEE Infocom. 2020:2410-2419.
Cheng et al., An Algorithm for Jammer Localization in Wireless Sensor Networks. IEEE 26th International Conference on Advanced Information Networking and Applications. 2012:724-731.
Ezzati et. al. Distributed Spectrum Sensing Using Radio Environment Maps in Cognitive Radio Networks. Wireless Pers Communication. 2018;101:2241-2254.
Figueiredo et al., Low Cost SDR Solution for Spectrum Sensing. ResearchGate. Jul. 2015. 6 pages.
Hanna et al., Deep Learning Based Transmitter Identification using Power Amplifier Nonlinearity. arXiv:. Nov. 12, 2018; 1811. 04521(1):7 pages.
Harp et al., Machine Vision and Deep Learning for Deep Learning for Classificaiton of Radio SETI Signals. arXiv: Feb. 6, 2019;1902. 02426: 31 pages.
Haykin et al., Cogntive Radio: Brain-empowered wireless communcations. IEEE Journal on Selected Areas in Comm. Feb. 2005;23(2):201-220.
Kumar et al., LTE Radio Analytics Made Easy and Accessible. SIGCOMM. Aug. 17-22, 2014. 12 pages.
Li et al., A Deep Convolutional Network for Multi-Type Signal Detection in Spectrogram. Preprints. May 12, 2020. 13 pages.
Li et al., Scaling Deep Learning Models for Spectrum Anomaly Detection. ACM.Jul. 2-5, 2019. 10 pages.
Morin et al., Deep Learning-based Transmitter identification on the physical layer. 2020. 23 pages.
Mosiane et al., Radio Frequency Interference Detection Using Machine Learning. IEEE Radio and Antenna Days of the Indian Ocean. IOP Conf. Series: Materials Science and Engineering. 2017;198(012012):5 pages.
Nika et al., Empirical Validation of Commodity Spectrum Monitoring. SenSys. Nov. 14-16, 2016. 12 pages.
O'Shea et. al., Practical Signal Detection and Classification in GNU Radio. Proceedings of the SDR 07. Technical Conference and Product Exposition. 2007. 6 pages.
Pfammatter et al., A Software-defined Sensor Architecture for Large-scale Wideband Spectrum Monitoring. IPSN. Apr. 14-16, 2015. 12 pages.
Robertson et al., Distributed Transmitter Localization by Power Difference of Arrival (PDOA) on a Network of GNU Radio Sensors. Naval Research Laboratory. Feb. 3, 2015:16 pages.
Schmitz et al., Demonstration Abstract: Real-time Indoor Localization with TDOA and Distributed Software Defined Radio. IEEE. 2016. 2 pages.
Yiwere et al., Sound Source Distance Estimation Using Deep Learning: An Image Classifcaiton Approach. Sensors. 2020;20(172):19 pages.
Zha et al., A Deep Learning Framework for Signal Detection and Modulation Classification. Sensors. 2019; 19(4042): 21 pages.
Zubow et al., DeepTxFinder: Multiple Transmitter Localization by Deep Learning in Crowdsourced Spectrum Sensing. 2020 29th International Conference on Computer Communications and Networks (ICCCN). 2020:1-8.
U.S. Appl. No. 17/871,225, filed Jul. 22, 2022, Wulff et al.
U.S. Appl. No. 17/871,293, filed Jul. 22, 2022, Wulff et al.
PCT/US22/38012, Oct. 6, 2022, International Search Report and Written Opinion.

(56) References Cited

OTHER PUBLICATIONS

International Preliminary Report on Patentability dated Feb. 1, 2024, in connection with International Application No. PCT/US2022/038012.
[No Author Listed], OmniSIG Sensor and the DeepWave AIR-T. DeepSig Blog. Apr. 13, 2021. 4 pages. https://www.deepsig.ai/news/omnisig-sensor-and-the-deepwave-air-t (Last accessed Aug. 7, 2023).
O'Shea et al., Over the Air Deep Learning Based Radio Signal Classification. arXiv:1712.04578v1. 13 pages, Dec. 13, 2017.

* cited by examiner

RADIO-FREQUENCY SIGNAL PROCESSING SYSTEMS AND METHODS

RELATED APPLICATIONS

This application claims the benefit under 35 U.S.C. § 119(e) of U.S. Provisional Application Ser. No. 63/232,605, filed Aug. 12, 2021, and entitled, "RADIO-FREQUENCY SIGNAL PROCESSING SYSTEMS AND METHODS," which is herein incorporated by reference in its entirety.

This application claims the benefit under 35 U.S.C. § 119(e) of U.S. Provisional Application Ser. No. 63/225,130, filed Jul. 23, 2021, and entitled, "RADIO-FREQUENCY SIGNAL PROCESSING SYSTEMS AND METHODS," which is herein incorporated by reference in its entirety.

BACKGROUND

Radio-frequency (RF) systems may include one or more transmitters and/or receivers and may be deployed in indoor and/or outdoor environments, such as for short and long range communication and/or radar applications. Such RF systems are susceptible to RF interference from other transmitters in the environment that broadcast RF signals in the operating frequency range of the RF system.

Some existing systems detect the presence of RF signals using one or more RF receivers. Some existing systems process RF signals to determine the location of the source of the RF signals. For example, in a time difference of arrival (TDOA) system, multiple RF receivers may be positioned in different locations to receive and process the same RF signal, and time differences between the arrival of the RF signal at the different RF receivers may be used to determine the location of the source of the RF signal relative to the RF receivers.

BRIEF SUMMARY

The present disclosure provides RF systems and techniques for detecting the presence of RF signals received by the system, as well as determining the type of RF source that transmitted the RF signals, and/or the location of the RF source with high precision and sensitivity while using low cost, scalable electronics that are versatile enough for deployment in a variety of environments. Underlying such systems and techniques are trained models that may be executed by a processor and configured to detect the presence of received RF signals, as well as classify the type of RF source that sent the RF signals, and/or determine the location of the RF source in the operating environment of the system. The inventors recognized that RF signals may be detected and RF sources classified and located based on unique RF signal characteristics that are detectable using trained models described herein, even in high noise or non-line of sight (LOS) environments and with low cost, low resolution RF receiver hardware. Moreover, systems described herein may employ a computer (e.g., server) communicatively coupled to a network of RF sensors and configured to instruct the RF sensor network to scan for one or more detected RF signals and provide the computer with RF characteristic data for localizing the RF source of the detected RF signal(s).

The inventors recognized that existing systems for RF signal detection are inflexible, which limits the utility of such systems in a wide variety of applications. For example, such systems typically employ one or more matched filters each configured to detect the presence of a specific RF signal in the operating environment of the system, which requires the system to have the appropriate matched filters in order to detect RF signals, and therefore prevents such systems from detecting RF signals the systems weren't specifically designed to detect. As a result, existing systems for RF signal detection are not suitable for applications in which it is desirable to detect unexpected or arbitrary RF signals in the environment.

The inventors also recognized that existing systems for RF source localization are expensive, which makes such systems unsuitable for large scale implementations. For example, TDOA systems are required to calculate the precise arrival times of received RF signals in order to locate the source of the RF signals with sufficient accuracy to be useful. To demonstrate the importance of precise timing in such a system, RF signals travel through air at the speed of light, which is approximately 1 foot per nanosecond (ft/ns). A TDOA system that is expected to precisely locate an RF source within a few feet of the source location would allow, at most, a few nanoseconds of error in determining the arrival times of received signals. To achieve that level of performance, such systems rely on RF receivers with expensive, high resolution electronics with ultra-precise, synchronized clocks and/or high digital signal sampling rates. As a result of the high cost of the receivers, existing systems that need a dense arrangement of receivers for precise source location are restricted to small operating environments. Likewise, systems that need full coverage over a large operating area are restricted to low density sensor arrangements, which may compromise precision in non-line of sight (LOS) environments and/or when locating low-power transmitters. Currently, a typical system employing high resolution electronics and ultra-precise clocks costs hundreds of thousands of dollars to implement. A low-end system having a small number of sensors currently costs at least tens of thousands of dollars to implement.

The inventors also recognized that existing RF source localization systems have varied performance over different environments, such as high noise and non-LOS environments. In a high noise environment, low power signals may be drowned out by noise, requiring high cost ultra-sensitive or high dynamic range electronics. In non-LOS environments, signals may reflect off of one or more surfaces between the transmitter and receiver, thereby introducing multipath errors into source location processes that may compromise location accuracy. Accordingly, non-LOS environments typically demand dense arrangements of sensors, resulting in high implementation costs.

To overcome the problems of existing systems, the inventors developed RF systems employing one or more trained models that may be executed by one or more processors, allowing the processor(s) to input received RF radiation to the trained model(s) and detect, using one or more output(s) of the trained model(s), the presence, RF source type, location, and/or operating condition of an RF source that transmitted the RF signals. Some aspects of the present disclosure relate to an RF sensor that may be included in such systems, the RF sensor having an RF antenna and a processor operatively coupled to memory. For example, the RF antenna may be configured to receive RF signals and provide the RF signals to the processor. In some embodiments, the processor may be configured to receive RF radiation via the RF antenna and input RF radiation data, indicating characteristics of the RF radiation, to a trained model. For example, the RF radiation may include digital samples of the RF radiation (e.g., direct samples, spectrally filtered samples, in-phase and/or quadrature samples, and/or demodulated samples), and the RF radiation data may include a time-frequency representation of the RF radiation, such as a spectrogram.

According to various embodiments, the processor may be configured to, based on an output from a trained model, detect the presence of an RF signal among the RF radiation, classify an RF source of an RF signal that is present among the RF radiation, and/or determine whether an RF source of an RF signal present among the RF radiation has deviated from a predetermined operating condition. For example, the processor may be configured to execute the trained model, and the output of the trained model may be generated in response to providing the RF radiation data as an input to the trained model. The inventors recognized that, by using the output of a trained model, the RF sensor may be configured to detect the presence of a wide variety of received RF signals, classify a wide variety of RF sources, and/or determine the operating condition of an RF source with high sensitivity and in a wide variety of environments while using cost-effective hardware, which in turn allows for many RF sensors to be deployed in the same system at low cost. As one example, some RF sensors described here may be made for less than $50 each.

In some embodiments, the processor may be configured to provide, as the input to the trained model, a time-frequency representation of the RF radiation, such as a spectrogram of the RF radiation. For example, the output of the trained model may indicate, in the RF radiation data provided to the trained model, an indication of which portion(s) of the time-frequency representation correspond(s) to the RF signal. In some embodiments, the processor may be configured to detect, based on the output from the trained model, the presence of a plurality of RF signals among the RF radiation. For example, the output of the trained model may indicate multiple portions of the RF radiation data that correspond to respective RF signals, at least some of which being received at the same time.

In some embodiments, the processor may be configured to determine the center frequency of the RF signal based on the output of the trained model. Alternatively or additionally, in some embodiments, the processor may be configured to determine the operating frequency band of the RF signal based on the output of the trained model. Alternatively or additionally, in some embodiments, the processor may be further configured to determine a power level of the RF signal at the operating frequency based on the output of the trained model. For example, spectrogram data derived from the RF signal, such as the center frequency, operating frequency band, and/or power level at the operating frequency (center frequency and/or band) may be useful for determining the type of RF source that transmitted the RF signal.

In some embodiments, the trained model executed by the processor may include a trained statistical classifier (TSC) and/or a trained regression model that is configured to detect the presence of the RF signal among the RF radiation. For example, the trained model may include a TSC configured to classify the operating frequency of the RF signal from among a plurality of operating frequencies. In this example, the TSC may be a neural network, such as a convolutional neural network (CNN), trained on RF signals having various operating frequencies to classify RF signals by operating frequency. As another example, the trained model may include a trained regression model configured to output an indication of the presence of the RF signal among the RF radiation. In this example, the regression model may be trained, using a loss function, on RF signals having various characteristics such as operating frequencies and/or power levels to detect the presence of various types of RF signals.

In some embodiments, the TSC and/or trained regression model may be configured to classify the RF source of the RF signal from among the plurality of RF sources, and/or determine whether the operating condition of the RF source has deviated from the predetermined operating condition. For example, the TSC may be configured to classify the RF source from among the plurality of RF sources, and/or classify the operating condition of the RF source as within or deviated from the predetermined operating condition. Alternatively or additionally, the trained regression model may be configured to output an indication of whether and how far the operating condition of the RF source has deviated from the predetermined operating condition. In some embodiments, the TSC and/or regression model may be trained on a variety of RF sources, such as including RF sources associated with the operating environment of the system as well as RF sources not associated with the operating environment (e.g., potentially interfering devices). Alternatively or additionally, the TSC and/or regression model may be trained over a period of time to determine the operating condition of various RF sources, such that deviation from predetermined operating conditions may be contrasted therefrom.

In some embodiments, the RF sensor may include RF front-end circuitry configured to digitally sample the RF radiation to provide digital samples of the RF radiation to the processor. For example, the RF front-end circuitry may include one or more receive (e.g., low-noise) amplifiers, mixers, filters, and/or analog-to-digital converters (ADCs) coupled between the RF antenna and the processor. In some embodiments, the processor, memory, and RF antenna may be supported by a housing. For example, the processor, memory, and RF-front end circuitry may be contained within the housing with the RF antenna mounted in and/or on the housing. In some embodiments, the RF radiation may have a frequency greater than or equal to 1 megahertz (MHz), and the RF front-end circuitry (e.g., the ADC) may be configured to digitally sample the RF radiation at a digital sampling rate that is less than 50 million samples per second (Msamp/sec).

In some embodiments, the RF sensor may include a network interface configured to connect to a communication network, and the processor may be configured to send RF characteristic data indicating characteristics of the RF signal, RF source, and/or operating condition of the RF source to a second processor over the communication network. For example, the processor may be configured to send the RF characteristic data in response to detecting the RF signal, classifying the RF source (e.g., as not among the RF sources among the operating environment), and/or determining that the RF source has deviated from the predetermined operating condition (e.g., below expected transmission power and/or below expected signal-to-noise ratio). In some embodiments, the processor may be configured to send the RF characteristic data in response to detecting the RF signal, and the second processor may be (e.g., part of a server computer) may be configured to classify the type of RF source that transmitted the RF signal based on the characteristics of the RF signal indicated by the processor of the RF sensor and/or determine the operating condition of the RF source. In some embodiments, the RF characteristic data may include digital samples of the RF radiation, such as digital samples that include the RF signal. Alternatively or additionally, the RF characteristic data may include a time period, frequency range, power level, and/or signal-to-noise ratio (SNR) of the RF signal. Alternatively or additionally, in some embodiments, the RF characteristic data may include an indication of a class of the RF source and/or an indication of the operating condition of the RF source.

In some embodiments, the processor of the RF sensor may be configured to receive instructions over the communication network that cause the processor to selectively transmit digital samples of the RF radiation (e.g., having the time period of reception, frequency range, and/or power level of the RF signal). For example, in response to receiving RF characteristic data from the RF sensor indicating a received RF signal, the second processor may be configured to instruct the RF sensor (and/or other RF sensors of the system) to selectively transmit digital samples of received RF radiation at the operating frequency of the detected RF signal. In this example, RF radiation subsequently received by one or more RF sensors of the system may be used to determine the location of the RF source, as described further herein.

The inventors have further developed techniques for efficient deployment of RF sensors. To this end, some aspects of the present disclosure relate to an RF sensor configured to selectively transmit an indication of a subset of RF radiation over a communication network. In some embodiments, an RF sensor may include an RF antenna and a processor operatively coupled to memory and configured to select, from among RF radiation data (e.g., digital samples) indicating RF radiation received via the RF antenna, a subset of the RF radiation data and transmit, over a communication network, RF characteristic data indicating the subset of the RF radiation data. For example, the processor may be configured to receive digital samples of the RF radiation, select a subset of the digital samples, and transmit the subset of digital samples and/or characteristics thereof (e.g., a time period, frequency range, power level, and/or SNR) over the communication network. The inventors recognized that selecting a subset of RF radiation data for transmitting an indication of the subset of RF radiation data may reduce the amount of data transmitted by the RF sensor, thereby facilitating deployment of a network of RF sensors using low-bandwidth network links.

According to various embodiments, the processor may be configured to select a subset of digital samples based on a time period of reception, frequency range, and/or power level of the subset of digital samples. For example, the processor may be configured to select the subset corresponding to a predetermined time period, frequency range, and/or power level. Alternatively or additionally, the processor may be configured to select the subset of digital samples based on instructions, received over the communication network (e.g., from a server) indicating the time period of reception, frequency range, and/or power level for selection. Further alternatively or additionally, the processor may be configured to input the digital samples to a trained model and identify the subset of digital samples for selection based on an output from the trained model. For example, the output from the trained model may indicate that the subset of digital samples (e.g., in a time period of reception and/or frequency range and/or at a power level) includes a detected RF signal, a detected RF signal from a particular class of RF source, and/or a detected RF signal from an RF source that has deviated from its predetermined operating condition.

In some embodiments, the subset of RF radiation transmitted may include spectrally filtered samples, in-phase and/or quadrature (I/Q) samples, and/or demodulated samples. For example, spectral filtering, I/Q sampling, and/or demodulation may be performed onboard the RF sensor, thereby further reducing the amount of data transmitted by the RF sensor.

The inventors have further developed techniques for coordinated operation of RF sensors, which also facilitates efficient deployment of an RF sensor network. To this end, some aspects of the present disclosure relate to an RF source determination system. In some embodiments, an RF source determination system may include a processor operatively coupled to a memory and configured to, in response to determining an RF source is present in an operating environment of the system, instruct at least one RF sensor, over a communication network, to provide RF radiation data indicating a subset of RF radiation received by the RF sensor(s) (e.g., a subset of digital samples of the received RF radiation). For example, the subset of RF radiation may correspond, at least in part, to an RF signal received from the RF source. In some embodiments, the processor may be further configured to receive the RF radiation data from the RF sensor(s). The inventors recognized that instructing one or more RF sensors to provide targeted RF radiation data (e.g., corresponding to a received RF signal) allows the RF sensors to be made at low cost, such as with narrow sampling bandwidth and/or with a low sampling rate.

In some embodiments, the processor may be configured to instruct the RF sensor(s) to select digital samples corresponding, at least in part, to a time period of reception, frequency range, and/or power level of the received RF signal. In some embodiments, the processor may be configured to instruct the RF sensor(s) to select the digital samples from among digital samples previously received and stored in the memory of the RF sensor(s). For example, the RF sensor(s) may store previously received digital samples that may be loaded and transmitted to the processor for historical analysis (e.g., detection, classification, and/or localization using previously received signals). Alternatively or additionally, the processor may be configured to instruct the RF sensor(s) to select the digital samples from among digital samples received following the instruction.

It should be appreciated that the selected digital samples may have been received in at least some other time periods, and/or have other frequency ranges and/or power levels, such as within a close threshold (e.g., 5-10%) of the time, frequency, and/or power level of the RF signal.

In some embodiments, the processor may be configured to determine that the RF source is present in the operating environment by detecting the RF signal among RF radiation received by the RF sensor(s). For example, the processor may be configured to detect the presence of the RF signal among the RF radiation based on an output of a trained model generated in response to receiving digital samples of the RF radiation as an input.

In some embodiments, the processor may be configured to receive RF characteristic data from a first RF sensor indicating the RF signal (e.g., digital samples, characteristics of the RF signal, etc.), and, in response, instruct a second RF sensor to provide second RF radiation data (e.g., digital samples and/or a spectrogram) indicating the subset of RF radiation data corresponding, at least in part, to the RF signal. In some embodiments, the processor may be configured to, by instructing the second RF sensor, override selection of the subset of RF radiation by the second RF sensor. For example, prior to the instruction, the second RF sensor may be preconfigured to select a subset of RF radiation. Alternatively or additionally, the second RF sensor may be configured to select a subset of RF radiation based on an output of a trained model generated in response to receiving RF radiation data (e.g., digital samples) as an input. In some embodiments, the processor may be configured to determine a location of the RF source in the operating environment based on the first and second RF radiation data.

In some embodiments, the system further includes a first RF sensor that includes an RF antenna and the processor, and the instructed RF sensor(s) include a second RF sensor. For example, the first RF sensor may be configured to instruct the second RF sensor. In this or another example, the first RF sensor may be configured as a controlling RF sensor (e.g., temporarily and/or permanently) and the second RF sensor may be configured as a subordinate RF sensor (e.g., temporarily and/or permanently). In some embodiments, the processor may be configured to determine that the RF source is present in the operating environment based on RF radiation received at the RF antenna of the first RF sensor.

Some aspects of the present disclosure relate to an RF signal determination system, comprising a first RF sensor and a second RF sensor. In some embodiments, the first RF sensor may comprise a first RF antenna and at least one first processor operatively coupled to a first memory and configured to select, from among first RF radiation data indicating first RF radiation received by the first RF antenna, a first subset of the first RF radiation data and transmit, over a communication network, first RF characteristic data indicating the first subset of the first RF radiation data. For example, the first RF radiation data may include digital samples of the first RF radiation (e.g., direct samples, spectrally filtered samples, in-phase and/or quadrature samples, and/or demodulated samples), and the first subset of the first RF radiation data may include a subset of the digital samples, such as corresponding to a first time period of reception, frequency range, and/or power level. In this example, the first RF characteristic data may include digital samples, characteristics thereof, such as a time period, frequency range, and/or power level, and/or the output of a trained model indicating the characteristics.

In some embodiments, the second RF sensor may comprise a second RF antenna and at least one second processor operatively coupled to a second memory and configured to select, from among second RF radiation data indicating second RF radiation received by the second RF antenna, a second subset of the second RF radiation data and transmit, over the communication network, second RF characteristic data indicating the second subset of the second RF radiation data. For example, the second RF radiation data may include digital samples, and the subset of the second RF radiation data may include a subset of the digital samples, such as corresponding to a second time period of reception, frequency range, and/or power level, such as described for the first RF radiation data. The inventors recognized that RF sensors transmitting RF characteristic data indicating respective subsets of received RF radiation facilitates efficient network deployment, as the RF sensors may include low-cost hardware.

In some embodiments, the first processor(s) may be configured to select the first subset of the first digital samples according to first predetermined RF radiation selection criteria stored in the first memory and the second processor(s) may be configured to select the second subset of the second digital samples according to second predetermined RF radiation selection criteria stored in the second memory. For example, the predetermined RF radiation selection criteria may be stored in memory during configuration of the RF sensors, and/or when previous instructions were received at the RF sensors.

In some embodiments, the first RF antenna may be configured to receive the first RF radiation, at least in part, at a same time the second RF antenna is configured to receive the second RF radiation. In some embodiments, the first subset of the first digital samples and the second subset of the digital samples correspond to a same time period, frequency range, and/or power level. In some embodiments, the first processor(s) may be configured to select the first subset of the first digital samples in response to receiving a first command over the communication network. Alternatively or additionally, in some embodiments, the second processor(s) may be configured to select the second subset of the second digital samples in response to receiving a second command over the communication network. As one example, the first and second RF sensors may be configured to select the same time period, frequency range, and/or power level due to receiving a same command over the communication network, such as following detection of an RF signal by the system.

In some embodiments, the first processor(s) may be configured to input the first digital samples to a trained model, identify, based on an output from the trained model generated in response to receiving the first digital samples as an input, the first subset of the first digital samples as indicating an RF signal among the first RF radiation, and select the first subset of the first digital samples in response to identifying the first subset of the first digital samples as indicating the RF signal. For example, the trained model may be trained to detect RF signals among digital samples (e.g., in a spectrogram of digital samples) such that the output of the trained model indicates the time period, frequency, and/or power level corresponding to an RF signal for selection by the RF sensor. In some embodiments, the second processor(s) may be configured to select the second subset of the second digital samples according to predetermined RF radiation selection criteria stored in the second memory. For example, while the first RF sensor may be configured to execute a trained model to identify digital samples for selection, the second RF sensor may be configured to select digital samples based on predetermined criteria, which may result in selection of different subsets.

In some embodiments, the second subset of the second digital samples may include a larger quantity of data than the first subset of the first digital samples. For example, the first subset of digital samples may include a shorter time period of reception, narrower frequency range, and/or more limited range of power levels than the second subset of digital samples, such as due to a precise identification, by the trained model, of digital samples corresponding to one or more RF signals.

In some embodiments, the second processor(s) may be configured to transmit the second RF characteristic data over the communication network at a higher data rate than the first processor(s) are configured to transmit the first RF characteristic data over the communication network. For example, the first RF sensor may be configured to select a smaller subset of digital samples for transmission, and/or to only transmit the output of a trained model in the first RF characteristic data, permitting the first RF sensor to transmit the RF characteristic data over a lower bandwidth link than the second RF sensor.

In some embodiments, the first RF sensor may further comprise a first software-defined radio (SDR) configured to provide the first digital samples and the second RF sensor may further comprise a second SDR configured to provide the second digital samples. In some embodiments, the first SDR may be configured to provide the first digital samples at a faster sampling rate than the second SDR is configured to provide the second digital samples. For example, the first processor(s) may be configured to process the first digital samples at a faster processing rate than the second processor(s) are configured to process the second digital samples, facilitating a higher digital sampling rate for the first SDR. In some embodiments, the first processor(s) may comprise a field programmable gate array (FPGA), graphical processing unit (GPU), and/or application specific integrated circuit (ASIC) configured to select the first subset of the first digital samples and a general purpose processor configured to transmit the first RF characteristic data over the communication network. For example, one or more dedicated FPGAs, GPUs, and/or ASICs may be used for digital sample processing and/or to execute one or more trained models.

In some embodiments, the first RF sensor may further comprise a first battery configured to provide power for operating the first RF sensor and the second RF sensor may further comprise a second battery configured to provide power for operating the second RF sensor.

Some aspects of the present disclosure relate to an RF signal classification system that may include at least one RF sensor configured to receive RF radiation from an operating environment and at least one processor operatively coupled to a memory. In some embodiments, the processor may be configured to classify an RF source of an RF signal among the RF radiation based on an output from a trained model, the output generated by the trained model in response to receiving RF characteristic data, indicating characteristics of the RF radiation (e.g., digital samples, a spectrogram, and/or a time period, frequency range, and/or power level), as an input. For example, the trained model may include a TSC trained on various types of RF sources. In some embodiments, the processor may be further configured to determine, based on an RF source class of the RF source, whether the RF source is among a plurality of known RF sources associated with the operating environment. For example, the trained model may be trained to recognize the plurality of known RF sources associated with the operating environment. In some embodiments, in response to determining that the RF source is not among the plurality of RF sources associated with the operating environment, the processor may be configured to notify at least one device that the RF source is present in the operating environment. For example, the at least one device may include a computer and/or mobile device with a user interface to alert a user of the presence of the RF source. By classifying an RF source of received RF signals and determining whether the RF source is among known RF sources, systems described herein may be useful for determining whether the received RF signals are from recognized or unrecognized transmitters, and/or whether such signals are from malicious and/or interfering devices and/or devices of trespassers (e.g., intentional or unintentional).

In some embodiments, the processor may be configured to execute a TSC that is configured to classify the RF source from among a plurality of RF source classes. For example, the TSC may be trained on RF characteristic data associated with various RF sources to classify RF characteristic data by RF source. In some embodiments, the TSC may include a CNN.

In some embodiments, the system may include a first RF sensor configured to receive the RF radiation and generate the RF characteristic data indicating, at least in part, a time period of reception, frequency range, and/or power level of the RF signal. In some embodiments, the system may further include a second RF sensor, and the processor may be configured to, in response to classifying the RF sensor, send instructions to the second RF sensor to cause the second RF sensor to provide RF characteristic data indicating, at least in part, at least one of the time period of reception, frequency range, and/or power level of the RF signal. For example, the first RF sensor may be configured to provide digital samples and/or an indication of a time period, frequency range, and/or power level to the processor, thereby indicating the presence of the RF source. In this example, the second RF sensor may be configured to provide digital samples and/or an indication of a time period, frequency range, and/or power level to the processor used to classify the RF source. In this or another example, classification may be performed iteratively, such as a first classification using an RF signal from the RF source received by one RF sensor and a second classification using an RF signal from the RF source received by another RF sensor.

In some embodiments, the processor may be configured to, in response to classifying the RF source, send instructions to the second RF sensor to override the second RF from selecting a subset of RF radiation. In some embodiments, the processor may be configured to send the instructions to the second RF sensor based on a location of the second RF sensor. For example, the processor may be configured to determine, based on the location of the second RF sensor (e.g., absolute and/or relative to the first RF sensor), that the second RF sensor received an RF signal from the RF source. Alternatively or additionally, the processor may be configured to send the instructions to the second RF sensor based on a time period of reception, frequency range, and/or power level of RF radiation previously received by the second RF sensor (e.g., historical data transmitted from and/or stored in the second RF sensor). In this or another example, the processor may be configured to send instructions to a selected group of RF sensors based on location and/or historical data. In some cases, groups of RF sensors may be iteratively selected, such as starting with a large group of RF sensors before moving onto smaller groups of RF sensors (e.g., having larger received power levels and/or higher SNR corresponding to the RF signal).

In some embodiments, the RF sensor(s) of the system may include a first processor of the system that is configured to detect the RF signal among the RF radiation received by the RF sensor(s) and transmit the RF characteristic data (e.g., digital samples and/or a time period, frequency range, and/or power level) over a communication network to a second processor of the system, the second processor being configured to classify the RF source of the RF signal. For example, RF signal detection may be performed onboard one or more of the RF sensor(s), and RF signal classification may be performed elsewhere in the system, such as on a server computer. Alternatively or additionally, in some embodiments, the RF sensor(s) may include a first processor of the system that is configured to transmit the RF characteristic data (e.g., digital samples) over a communication network to a second processor of the system, the second processor being configured to detect the RF signal among the RF radiation and classify the RF source of the RF signal. For example, the RF sensor(s) may be configured to provide digital samples of the RF radiation to the second processor for RF signal detection and RF source classification.

Some aspects of the present disclosure relate to an RF source localization system comprising a processor operatively coupled to a memory. In some embodiments, the processor may be configured to receive RF characteristic data (e.g., digital samples) from first and second RF sensors over a communication network, the RF characteristic data indicating characteristics of RF radiation received at the first and second RF sensors. For example, the RF characteristic data may include digital samples and/or the outputs of trained models executed by the RF sensors to detect the presence of RF signals in the RF radiation. In some embodiments, the processor may be configured to determine the location of an RF source of an RF signal present in the RF radiation based on the output from a trained model, the output generated in response to the trained model receiving the RF characteristic data as an input. By using a trained model to determine the location of the RF source of the RF signal, the system may employ lower cost RF sensors that do not need ultra-precise timing and/or high resolution sampling while still accurately determining the location of an RF source.

In some embodiments, the trained model may comprise a TSC configured to classify the location of the RF source from among a plurality of locations. For example, the TSC may be a neural network, such as a CNN, trained on RF characteristic data (e.g., spectrograms, digital samples, and/or a time period, frequency range, and/or power level) indicating RF signals transmitted from a plurality of different locations in the operating environment of the system. In some embodiments, the TSC may be configured to classify the location of the RF source based on power levels of the RF radiation received at the first and second RF sensors. For example, depending on distance and/or such environmental factors as multipath reflections, received RF signals present in the RF radiation may have different power levels that contribute to the trained model's classifications (e.g., based on power levels of RF signals used to train the model). In some embodiments, the trained model may include a trained regression model configured to output an indication of the location of the RF source. For example, the trained regression model may be trained, using a loss function, on RF radiation data indicating RF signals transmitted from a plurality of different locations in the operating environment of the system.

In some embodiments, the first RF sensor may be positioned in a first location, the second RF sensor may be positioned in a second location different from the first location, and the RF characteristic data may identify the first and second RF sensors. For example, the trained model may be trained using RF signals received by the first and second RF sensors, which can prepare the trained model to classify RF signals received by at least one of the first and second RF sensors. In some embodiments, the system may include the first and second RF sensors, and the first and second RF sensors may be configured to detect the presence of the RF signals among RF radiation received at the first and second RF sensors and provide the RF characteristic data to the processor of the system. For example, the first and/or second RF sensors may be configured to execute trained models configured to detect the presence of RF signals among the RF radiation, such as described above.

In some embodiments, the RF characteristic data may include first RF characteristic data indicating characteristics of RF radiation received at the first RF sensor and second RF characteristic data indicating characteristics of RF radiation received at the second RF sensor. For example, the first and second RF radiation may each include an RF signal received from the same RF source. In some embodiments, the processor may be further configured to, in response to receiving the first RF characteristic data from the first RF sensor, send instructions to the second RF sensor that causes the second RF sensor to provide the second RF characteristic data. For example, the first RF characteristic data may indicate the presence of an RF signal and/or the classification of an RF source of the RF signal, in response to which, the processor may be configured to instruct the second RF sensor to select and transmit the second RF characteristic data in search of the same RF signal and/or RF source classification for localization.

In some embodiments, the RF radiation may have a frequency greater than or equal to 1 MHz, and the RF sensors may include RF front-end circuitry configured to digitally sample the RF radiation at a digital sampling rate that is less than 50 Msamp/sec. In some embodiments, the processor of the system may be configured to determine the location of the RF source based on the RF characteristic data even when the first and second RF sensors have reference clocks that are offset in time by more than 100 nanoseconds (ns) from one another. In some embodiments, the processor may be configured to determine the location of the RF source even when the first and second reference clocks are offset in frequency. For example, the trained model may be trained to classify and/or regress the location without the need for ultra-precise clock synchronization among the RF sensors.

In some embodiments, the processor of the system may also be configured to classify the RF source of the RF signals from among a plurality of RF sources, such as described above.

Some aspects of the present disclosure relate to an RF signal determination system. In some embodiments, the system may comprise a processor operatively coupled to a memory and configured to receive RF characteristic data (e.g., digital samples, a spectrogram, and/or a time period, frequency range, and/or power level) indicating characteristics of RF radiation received at an RF sensor and input the RF characteristic data to at least one trained feed-forward model (e.g., a feed-forward CNN). In some embodiments, the processor may be configured to, based on an output from the trained model, perform at least one of: (A) detecting at least one RF signal among the RF radiation; (B) classifying among a plurality of RF sources, an RF source of at least one RF signal that is present among the RF radiation; and/or (C) determining a location of an RF source of at least one RF signal that is present among the RF radiation. The inventors recognized that feed-forward models such as feed-forward CNNs may be suitable for applications in which the model is executed efficiently on low cost hardware, such as onboard an RF sensor, though embodiments described herein are not so limited.

In some embodiments, the system may further comprise the RF sensor, with the RF sensor comprising the processor, an RF antenna configured to receive the RF radiation, and an SDR configured to receive the RF radiation from the RF antenna and provide the RF characteristic data (e.g., digital samples) to the processor. For example, the processor may be configured to perform any or each of detecting the RF signal(s), classifying the RF source, and/or locating the RF source onboard the RF sensor.

In some embodiments, the system may further comprise the RF sensor, with the RF sensor comprising an RF antenna configured to receive the RF radiation, an SDR configured to receive the RF radiation from the RF antenna and generate the RF characteristic data comprising digital samples of the RF radiation, and a second processor configured to transmit the RF characteristic data to the processor. For example, the RF radiation may be received and digitally sampled at an RF sensor and then the resulting RF characteristic data may be transmitted to the processor (e.g., on a server and/or another RF sensor).

It should be appreciated that aspects of RF systems described herein may be implemented alone or in various combinations. As one example, an RF system described herein may include RF sensors that are configured to detect the presence of RF signals among received RF radiation using a trained model, as well as one or more processors communicatively coupled to the RF sensors and configured to (i) classify the RF source of the received RF signals based on data from the RF sensors, determine an operating condition of the RF source, and/or (iii) determine the location of the RF source. As another example, an RF system described herein may include RF sensors that are configured to detect the presence of RF signals among received RF radiation, classify the RF source of the received RF signals, and/or determine an operating condition of the RF source, and one or more processors communicatively coupled to the RF sensors and configured to determine the location of the RF source. As yet another example, an RF system described herein may include a first RF sensor configured to detect the presence of RF signals among received RF radiation, classify the RF source of the received RF signals, and/or determine an operating condition of the RF source, one or more processors communicatively coupled to the first RF sensor and to a second RF sensor and configured to instruct the second RF sensor to selectively transmit RF characteristic data (e.g., digital samples, a spectrogram, and/or a time period, frequency range, and/or power level) corresponding to an RF signal among the RF radiation received by the first RF source.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

I. Introduction

As mentioned above, the inventors developed RF systems employing one or more trained models that may be executed by one or more processors, allowing the processor(s) to input RF radiation and/or characteristic data indicating characteristics of received RF radiation to the trained model(s)

and detect, using one or more output(s) of the model(s), the presence of one or more RF signals among the RF radiation, as well as the type of RF source that transmitted each RF signal, and/or location of each RF source. Described herein are examples of RF sensors, systems, and methods implementing such techniques that may be used alone or in combination.

II. Example System for RF Classification and/or Regression

Figure 1:
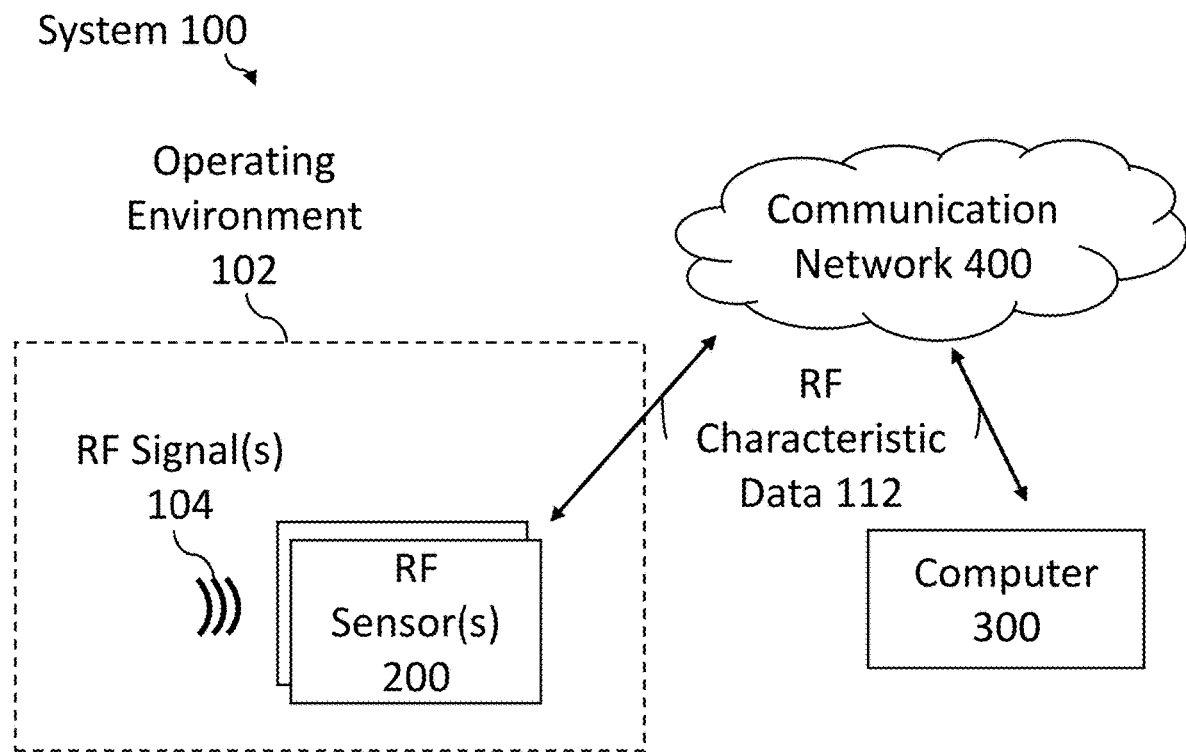
FIG. 1 is a block diagram of an example radio-frequency (RF) classification and/or regression system, according to some embodiments.

FIG. 1 is a block diagram of an example radio-frequency (RF) classification and/or regression system 100, according to some embodiments. As shown in FIG. 1, system 100 may include one or more RF sensors 200 configured to receive RF signals 104 in an operating environment 102 of the system 100 and a computer 300 communicatively coupled to the RF sensor(s) 200 via a communication network 400. In some embodiments, RF sensor(s) 200 and/or computer 300 may be configured to detect the presence of received RF signals 104 among RF radiation received by RF sensor(s) 200. Alternatively or additionally, in some embodiments, RF sensor(s) 200 and/or computer 300 may be configured to classify and/or regress the type and/or location of the RF source of the RF signals 104, as described further herein.

According to various embodiments, the operating environment 102 may be indoor, outdoor, or partially indoor and partially outdoor. For instance, the operating environment 102 may be as small as a single room, or as large as a neighborhood and/or city. In one example, the operating environment 102 may be a compound spanning multiple buildings. As another example, the operating environment 102 may be a warehouse. In yet another example, the operating environment 102 may be a city and/or a neighborhood within a city, as embodiments described herein are not so limited. Depending on the application and/or operating environment 102, RF sensors 200 may be placed in various arrangements and at various densities. For example, in a dense environment with a high degree of signal attenuation (e.g., due to LOS obstruction and/or multipath reflections), a correspondingly dense arrangement of RF sensors 200 may be deployed.

In some embodiments, RF sensor(s) 200 may be configured to receive RF radiation in the operating environment 102 of system 100. For example, one RF sensor 200 may be positioned in the operating environment 102 and have one or more RF antennas configured to receive RF radiation. Alternatively, multiple RF sensors 200 may be positioned in the operating environment 102, such as in different respective locations. In some embodiments, the RF sensor(s) 200 may be configured to receive RF radiation having a frequency of at least 1 MHz, such as 50 MHz, 900 MHz, 2.4 gigahertz (GHz), 30 GHz, and/or higher. In some embodiments, the RF sensor(s) 200 may also include RF front-end circuitry, such as one or more filters, amplifiers, tuners, and/or ADCs configured to receive, condition, demodulate, and/or digitally sample received RF radiation for processing. In some embodiments, some or all components of the RF front-end circuitry and/or RF antenna(s) may be contained in a dedicated system-on-chip (SoC) and/or a software-defined radio (SDR). For example, the SoC and/or SDR may be configured to selectively tune to one or more operating frequencies to scan for RF signal(s) 104. In some embodiments, the SDR may have an adjustable sampling rate to suit various possible processing speeds of the RF sensor 200 (e.g., a high sampling rate for use with fast processing speed, etc.).

In some embodiments, RF sensor(s) 200 may be configured to detect the presence of one or more RF signals 104 among the RF radiation received by RF sensor(s) 200. For example, each RF sensor 200 may include a processor operatively coupled to memory and configured to receive RF radiation from the RF antenna(s) of the RF sensor 200 (e.g., via RF front-end circuitry) and provide, as an input to a trained model, RF radiation data indicating characteristics of the RF radiation. For instance, the RF radiation data may include digital samples of the RF radiation and/or a time-frequency representation (e.g., spectrogram) derived from digital samples. In this example, the trained model may be configured to detect the presence of RF signals 104 by determining which portion (e.g., time period, frequency range, and/or power level) of the RF radiation data correspond to the RF signal(s) 104.

In some embodiments, the processor may be configured to obtain the RF radiation data from received, filtered, demodulated, and/or digitally sampled RF radiation. For example, the processor may be configured to perform a Fourier Transform on digital samples of the RF radiation and generate a time-frequency representation and/or spectrogram of the RF radiation over a plurality of discretely sampled time periods, which may be provided as the input to the trained model.

In some embodiments, the processor may be configured to determine, using the output of the trained model, the operating frequency of the RF signal(s) 104, such as the center frequency, operating frequency band, and/or the power level of the RF signal(s) 104 at any such frequency or frequencies. In some embodiments, the trained model may be configured to detect the presence of multiple RF signals 104 among the RF radiation, at least some of which may be received at the same time and/or within a predetermined time interval of one another. In some embodiments, the trained model may be trained using real RF signals received by RF sensor 200 in the operating environment 102. Alternatively or additionally, the trained model may be trained with RF radiation data generated using one or more real RF signals. For example, a large amount of RF radiation data may be generated to train the model to detect a wide variety of RF signals, thereby simulating training the model with a large dataset of real RF signals while using only a small number of real RF signals. Alternatively or additionally, the trained model may be trained with RF radiation data generated using one or more simulated RF signals. For example, a simulated RF signal may be generated to have characteristics in common with real RF signals, such as various types of modulation.

In some embodiments, RF sensor(s) 200 may be configured to transmit RF characteristic data 112 to computer 300 indicating characteristics of received RF radiation (e.g., the presence of RF signal(s) 104), such as using a wired connection and/or wirelessly. For example, RF sensor(s) 200 may include a network interface (e.g., coupled to and/or executed by the processor) configured to connect to communication network 400 such that RF sensor(s) 200 are configured to send RF characteristic data 112 indicating the operating frequency and/or power level of the RF signal(s) 104 to computer 300 over communication network 400. In some embodiments, RF characteristic data 112 may include one or more outputs from a trained model executed by the RF sensor(s) 200 and/or RF radiation data, such as digital samples that include RF signal(s) 104, and/or a time period of reception, frequency range, and/or power level of RF signal(s) 104. In some embodiments, RF sensor(s) 200 may be configured to transmit RF characteristic data 112 to computer 300 each time an RF signal 104 is detected at the RF sensor(s) 200. Alternatively, in some embodiments, RF sensor(s) 200 may be configured to transmit RF characteristic data 112 to computer 300 only when certain RF signals 104 are detected, such as having at least one of a set of predetermined characteristics, such as one or more operating frequencies, power levels, and/or combinations thereof. Alternatively or additionally, in some embodiments, RF sensor(s) 200 may be configured to transmit RF characteristic data 112 to computer 300 only when a new RF signal 104 is detected, such as when the detected RF signal 104 is not associated with the operating environment 102, when first the RF signal 104 is detected by the system, or when the RF signal 104 is first detected after a predetermined time period has passed (e.g., one hour, one day, etc.). In some embodiments, computer 300 may be configured to classify and/or regress the type and/or location of the RF source that transmitted the RF signal(s) 104 based on the RF characteristic data 112 received from the RF sensor(s) 200. For example, computer 300 may include a processor operatively coupled to memory and configured to execute a trained model and provide the RF characteristic data 112 to the trained model as an input. In this example, the trained model may be configured to classify and/or regress the type and/or location of the RF source of RF signal(s) 104, such as using digital samples of the RF radiation and/or based on the operating frequency, modulation type, and/or power level(s) of RF signal(s) 104 indicated in the RF characteristic data 112. In some embodiments, computer 300 may be configured to classify the type of RF source that transmitted the RF signal(s) 104 using a first trained model and to classify and/or regress the location of the RF source using a second trained model. For example, the first trained model may be trained using RF characteristic data indicating characteristics of RF signals transmitted by a variety of RF source types, such as cell phones and Bluetooth and/or Wi-Fi devices. In this example, the second trained model may be trained using RF characteristic data indicating characteristics of RF signals transmitted from a variety of locations within the operating environment 102 of system 100. Alternatively or additionally, in some embodiments, the trained models may be trained using a large dataset of RF characteristic data generated based on a small number of RF signals received in the operating environment 102, which may simulate training the models based on a large number of real RF signals. Alternatively or additionally, the trained models may be trained using RF characteristic data generated based on one or more simulated RF signals.

In some embodiments, computer 300 may be configured to distinguish between RF signals 104 associated with the operating environment 102 and other RF signals 104 that are not associated with the operating environment 102. For example, phase modulated (PM) communication traffic at 10 GHz may be associated with the operating environment 102, and an unauthorized person could enter the operating environment 102 with a non-associated mobile communication device that transmits PM signals at 900 MHz. In this example, the trained models executed by computer 300 may be trained to classify the PM communication traffic and the mobile communication device PM signals separately, allowing computer 300 and/or an operator thereof to detect the presence of the unauthorized person based on the trained model outputs described herein. In some embodiments, computer 300 may be configured to determine when a new RF signal 104 (e.g., not associated with the operating environment 102) has been detected.

In some embodiments, computer 300 may be configured to, based on RF characteristic data 112, determine whether an RF source of RF signal 104 has deviated from a predetermined operating condition. For example, the RF source may be associated with the operating environment 104 but may have a deteriorated operating condition, such as lower power transmission than expected for normal operation. In some embodiments, computer 300 may be configured to determine a power level of the RF signal 104 using the RF characteristic data 112 and compare the power level to a predetermined power level stored in the memory that is indicative of the predetermined operating condition (e.g., expected power level of transmission). For example, computer 300 may be configured to determine the power level using digital samples of RF characteristic data 112 and/or a time period, frequency range, and/or power level indicated in RF characteristic data 112. In some embodiments, computer 300 may be configured to classify and/or regress the operating condition of the RF source, such as by providing RF characteristic data 112 to a trained model trained on RF characteristic data indicating various operating conditions of the RF source. Alternatively or additionally, the trained model may be trained over a period of operation of the RF source such that the trained model output indicates deviation of the operating condition of the RF source with respect to the observed period of operation. In some embodiments, computer 300 may be alternatively or additionally configured to determine whether an RF sensor has deviated from a predetermined operating condition, such as due to lower than expected SNR and/or failing to receive RF radiation (and/or detect RF signals) confirmed to be present using other RF sensors.

In some embodiments, communication network 400 may be a wired and/or wireless local area network (LAN), a cell phone network, a Bluetooth network, the internet, or any other such network. For example, RF sensor(s) 200 and computer 300 may be positioned in remote locations relative to one another, such as with RF sensor(s) 200 deployed in the operating environment 102. In some embodiments, RF sensors 200 described herein may be used with various types of communication links within communication network 400, such as low bandwidth communication links. In one example, an RF sensor 200 described herein may be configured to transmit messages (e.g., RF characteristic data 112) at a data rate less than or equal to 50 kilobits per second (kbps), such as 30 kbps, 20 kbps, or less. For instance, low bandwidth communication described herein may use a Low Power Wide Area Networking (LPWAN) communication protocol, such as the LoRaWAN protocol. In some embodiments, RF sensor 200 may be configured to transmit RF characteristic data 112 in messages having as few as 100 bytes, 50 bytes, or even 10 bytes. It should also be appreciated that multiple communication links of various bandwidths may be used herein, such as one RF sensor 200 connected to computer 300 over LoRaWAN and another RF sensor 200 connected to computer 300 over 802.11ac, as embodiments described herein are not so limited.

According to various embodiments, system 100 may be flexibly implemented to support distribution of the operations described herein among one or more RF sensors 200 and/or computer 300. In some embodiments, RF sensors 200 may be configured to select a subset of RF radiation received at the RF sensor 200 and transmit, over communication network 400 (e.g., to computer 300), RF characteristic data indicating the subset of the RF radiation. As one example, RF sensors 200 may be configured to select digital samples of RF radiation for transmission based on the time period of reception, frequency range, and/or power level of the digital samples. For instance, the RF sensor 200 may receive instructions (e.g., from computer 300) to select the digital samples, with the instructions indicating the time period of reception, frequency, and/or power level (e.g., corresponding to an RF signal recently received by another RF sensor 200 in the system 100). Alternatively or additionally, the RF sensor 200 may be preconfigured to select digital samples based on the time period of reception, frequency range, and/or power level, such as under a pre-configuration in which multiple RF sensors 200 select different subsets of digital samples for transmission. In any or each of these examples, computer 300 may be configured to detect the presence of an RF signal among the transmitted RF characteristic data, classify the RF source of the RF signal, determine an operating condition of the RF source, and/or locate the RF source in the operating environment 102.

In some embodiments, at least one RF sensor 200 may be configured to select a subset of digital samples for transmission by inputting digital samples of the RF radiation (e.g., a spectrogram) to a trained model and identifying the digital samples for transmission based on the output of the trained model. For example, the output of the trained model may indicate the time period of reception, frequency range, and/or power level of the digital samples corresponding to an RF signal. Alternatively or additionally, the output of the trained model may indicate that the RF source of the RF signal is not associated with the operating environment 102. Further alternatively or additionally, the output of the trained model may indicate that the operating condition of the RF source has deviated from a predetermined operating condition.

In some embodiments, heterogeneous arrangements and/or configurations of RF sensors 200 may be flexibly deployed in system 100. For example, a first RF sensor 200 may be configured to execute a trained model and identify a first subset of RF radiation received at the first RF sensor 200 for selecting and transmitting first RF characteristic data to computer 300. In this example, a second RF sensor may be configured to select and second RF characteristic data according to predetermined RF radiation criteria (e.g., a predetermined time period, frequency range, and/or power level) stored in the memory of the second RF sensor. Alternatively or additionally, the second RF sensor 200 may be configured to select and transmit the second RF characteristic data in response to instructions received from computer 300. For instance, the first RF sensor 200 may have a first SDR configured to provide digital samples of received RF radiation faster than a second SDR of the second RF sensor 200, and/or the first RF sensor 200 may have greater onboard processing resources than the second RF sensor 200, facilitating execution of one or more trained models onboard the first RF sensor 200.

In some embodiments, the first RF sensor 200 may be configured to detect an RF signal, classify an RF source, and/or determine an operating condition of the RF source, in response to which computer 300 may be configured to instruct the second RF sensor 200 to select the second subset of RF radiation for RF characteristic data transmission. In some cases, second RF sensor 200 may be instructed to select the second subset of RF radiation from among RF characteristic data previously generated and stored in the memory of the second RF sensor 200, such as digital samples of previously received RF radiation (e.g., at or around the time the first RF sensor 200 received the RF signal). For example, RF sensors 200 may be configured to store and/or cache previously generated RF radiation data (e.g., digital samples) to be accessed upon instruction from computer 300. In some embodiments, computer 300 may be configured to classify the RF source, determine the operating condition of the RF source, and/or locate the RF source using RF characteristic data from the first and second RF sensors 200.

In some embodiments, computer 300 may be configured to detect the presence of an RF signal among RF radiation received by an RF sensor 200, such as by inputting RF radiation data (e.g., digital samples, a spectrogram, etc.) from the RF sensor 200 to a trained model and identifying the RF signal among the RF radiation data. For example, RF sensors 200 may have low onboard processing resources and may be configured to transmit a large quantity of RF characteristic data (e.g., including digital samples) over a high-bandwidth link of communication network 400. Alternatively or additionally, an RF sensor may have enough onboard processing resources to detect an RF signal, classify the RF source, and/or determine the operating condition of the RF source, facilitating transmission of a small quantity of RF characteristic data over a low-bandwidth link of communication network 400, according to the needs of the particular deployment.

While computer 300 is described herein as classifying and/or regressing the type of RF source that transmitted the RF signal 104 and/or classifying and/or regressing the operating condition of the RF source, it should be appreciated that such processing may be alternatively or additionally performed by RF sensor 200. For example, RF characteristic data 112 transmitted to computer 300 may alternatively or additionally include an RF source classification result and/or an indication of the operating condition of the RF source, as embodiments described herein are not so limited. It should also be appreciated that, in some embodiments, computer 300 may be implemented onboard one or more RF sensors 200. For example, system 100 may be at least partially decentralized, such as having at least one of RF sensors 200 designated as a controlling device for at least a portion of system operation.

In some embodiments, RF sensor(s) 200 may be deployed in stationary locations (e.g., without moving during operation of system 100). Alternatively or additionally, in some embodiments, RF sensor(s) 200 may be positioned on (e.g., mounted on and/or carried by) one or more vehicles, such as wheeled, aerial, manned, and/or unmanned vehicles in and/or around the operating environment 102. In one example, a known location of the vehicle (e.g., determined using a GPS receiver) and/or a known relative distance between multiple vehicles supporting respective RF sensors 200 may be used to determine the location of an RF source (e.g., by providing such information as and/or within RF characteristic data 112). For instance, RF sensors 200 onboard multiple vehicles traversing an operating environment 102 may be configured to collaboratively detect RF signals and/or classify and/or locate RF sources in the operating environment 102 so as to map the RF sources present as the vehicles traverse the operating environment 102. In another example, a known location of an RF source localized using system 100 may be used to determine the location of the vehicle (e.g., using a trained localization model).

In some embodiments, an RF sensor may be deployed in a standalone configuration, such as onboard a vehicle, for monitoring RF radiation having predetermined characteristics. For example, the RF sensor may be configured to monitor a frequency range used by one or more electronic systems (e.g., an RF-based navigation system) onboard a vehicle for anomalies and/or disruption potentially affecting the electronic system(s). In some embodiments, indications of detected and/or classified RF signals and/or RF sources may be transmitted to the vehicle's onboard computing system. In some embodiments, trained models onboard such RF sensors may be trained to recognize RF signals transmitted from RF sources onboard and/or associated with the vehicle and to distinguish and/or classify other RF signals and/or RF sources (e.g., not associated with the vehicle).

III. RF Signal Detection Techniques

The inventors developed RF signal detection techniques that may be implemented using system 100 of FIG. 1. For example, such techniques may be implemented using a trained model executed by RF sensor(s) 200 and/or computer 300, as described further herein.

Figure 2A:
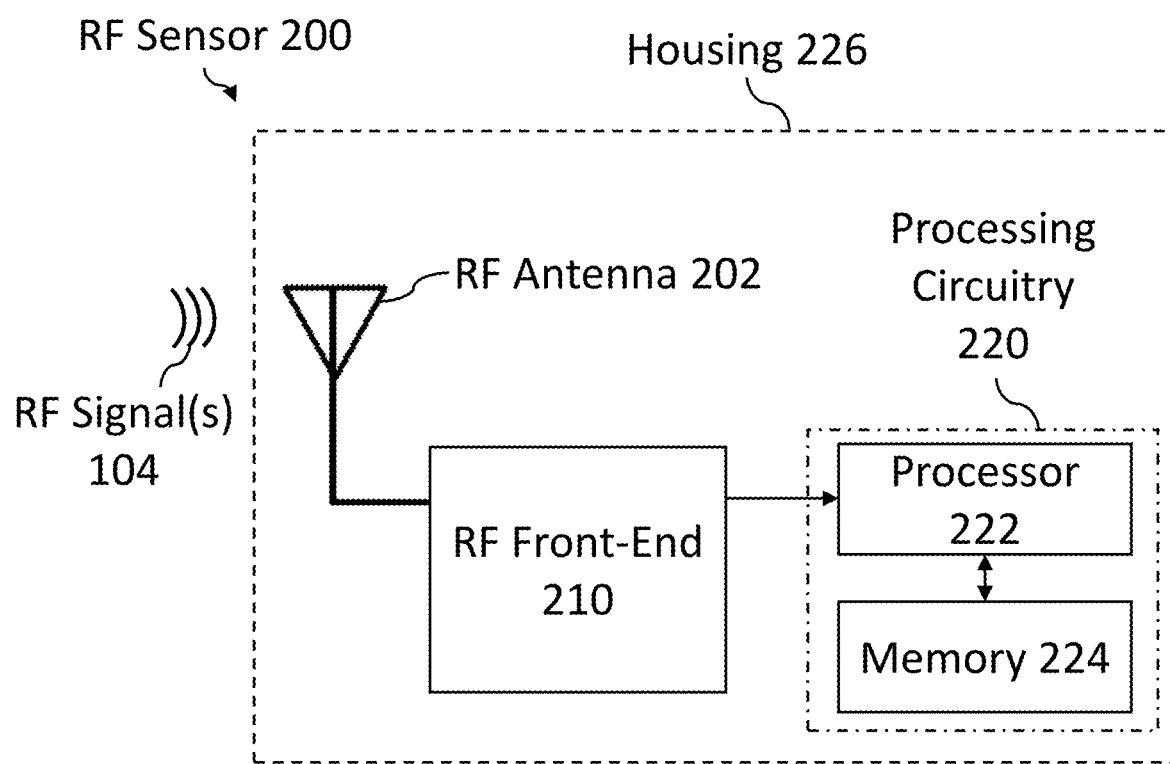
FIG. 2A is a block diagram of an example RF sensor that may be included in the system of FIG. 1, according to some embodiments.

FIG. 2A is a block diagram of RF sensor 200 of system 100, according to some embodiments. As shown in FIG. 2A, RF sensor 200 may include an RF antenna 202, RF front-end circuitry 210 coupled to RF antenna 202, and RF signal detection circuitry 220. In some embodiments, RF antenna 202 may be configured to receive and provide RF radiation to RF front-end circuitry 210, and RF-front-end circuitry 210 may be configured to condition, demodulate, and/or digitally sample the RF radiation to provide to RF signal detection circuitry 220. In some embodiments, RF antenna 202, RF front-end circuitry 210, and RF signal detection circuitry 220 may be integrated together, such as on the same printed circuit board and/or within a common housing 226, such as shown in FIG. 2A. It should be appreciated that, in some embodiments, RF sensor 200 may include more than one RF antenna that share RF front-end circuitry 210 or each have their own associated RF front-end circuitry.

In some embodiments, RF sensor 200 may further include a power supply, such as a universal serial bus (USB) power receiver and/or wireless power receiver and/or a battery. For example, the USB power receiver may be compatible with commercially available USB power chargers (e.g., AC to DC and/or DC to DC, such as for charging from an onboard vehicle battery). In some embodiments, low-power processing onboard RF sensor 200 may allow RF sensor to consume an average of less than 10 watts (W) of power, making RF sensor 200 operable using an onboard battery.

In some embodiments, RF antenna(s) 202 of RF sensor(s) 200 may be oriented and/or positioned differently from one another (e.g., facing in different and/or orthogonal directions and/or at different heights) so as to obtain a diverse range of RF radiation over a large area and/or over multiple polarizations.

In some embodiments, RF signal detection circuitry 220 may be configured to detect the presence of RF signal(s) 104 among received RF radiation. For example, as shown in FIG. 2A, RF signal detection circuitry 220 may include a processor 222 operatively coupled to memory 224. In some embodiments, processor 222 may be configured to execute a trained model and provide, as an input to the trained model, RF radiation data indicating characteristics of the received RF radiation. For example, processor 222 may be configured to detect the presence of the RF signal(s) 104 using an output of the trained model. For example, the output of the trained model may indicate portions of the RF radiation data (e.g., digital samples) that correspond to the RF signal(s) 104. In some embodiments, memory 224 may be non-volatile memory configured to store instructions that, when executed, cause processor 222 to execute the trained model. According to various embodiments, processor 222 may include a general purpose processor (e.g., a central processing unit), a graphics processing unit (GPU), a reduced instruction set computer (RISC) processor, an application specific processor (e.g., an application specific integrated circuit (ASIC)), and/or a reprogrammable processor (e.g., a field programmable gate array (FPGA)). In some embodiments, processor 222 may include random access memory (RAM) configured to load instructions from memory 224 for executing a trained model.

In some embodiments, processor 222 may be configured to receive, from RF front-end circuitry 210, digital samples, such as filtered samples, in-phase and/or quadrature (I/Q) samples, and/or demodulated samples, of received RF radiation and provide RF radiation data to the trained model based on and/or including the digital samples. For example, processor 222 may be configured to provide digital time domain and/or frequency domain samples to the trained model as RF radiation data. Alternatively or additionally, processor 222 may be configured to obtain a time-frequency representation of the digital samples, such as a spectrogram, to provide to the trained model as RF radiation data. For example, processor 222 may be configured to perform a Discrete Fourier Transform (DFT), such as a Fast Fourier Transform (FFT), of the RF radiation and obtain a time-frequency representation of the digital samples for one or more discrete time intervals. In some embodiments, processor 222 may be further configured to filter out time and/or frequency components of the RF radiation having below a predetermined power threshold. For example, such components of the RF radiation may have a low likelihood of including RF signals.

In some embodiments, the output of the trained model may indicate the presence of one or more RF signals 104 in the RF radiation data provided to the trained model. For example, the output of the trained model may indicate which portion(s) of the RF radiation data (e.g., which digital samples and/or time, frequency, and/or power components of a spectrogram) correspond to the RF signal(s) 104. In some embodiments, the output of the trained model may include a classification of the RF signal(s) 104 as having one of several discrete operating frequencies (e.g., center frequencies, operating frequency ranges), and/or a regression of the operating frequency of the RF signal(s) 104. In some embodiments, processor 222 may be further configured to store inputs and/or outputs of the trained model in memory 224. In some embodiments, stored inputs and/or outputs may be retrieved from memory 224 upon a command received from computer 300 over communication network 400 (e.g., for transmitting as RF characteristic data).

It should be appreciated that, while a single processor 222 is shown in RF signal detection circuitry 220, some embodiments may include multiple processors 222. For example, a first processor 222 (e.g., an FPGA, GPU, and/or ASIC) may be configured to receive digital samples from RF front-end 210 and execute the trained model, and a second processor 222 (e.g., a general purpose processor) may be configured to generate and/or transmit RF characteristic data 112 over the communication network 400.

Figure 2B:
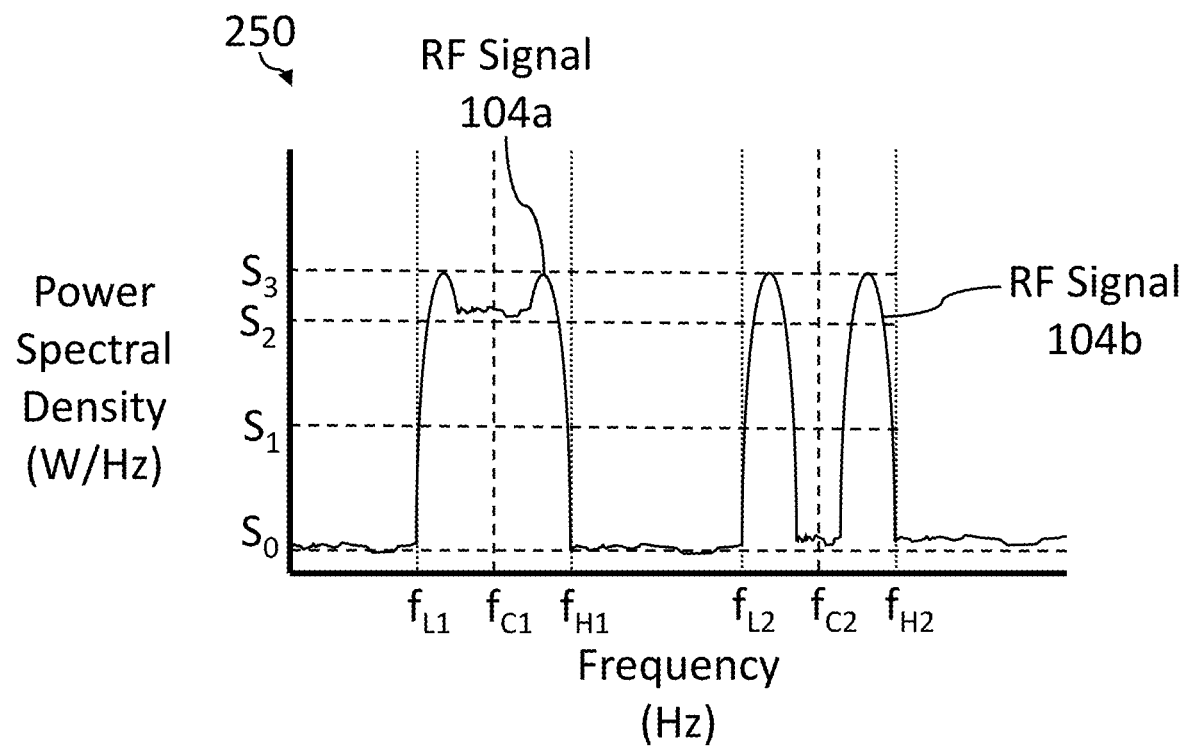
FIG. 2B is a graph of power spectral density of RF radiation that may be received by the RF sensor of FIG. 2A vs. frequency, according to some embodiments.
Figure 2C:
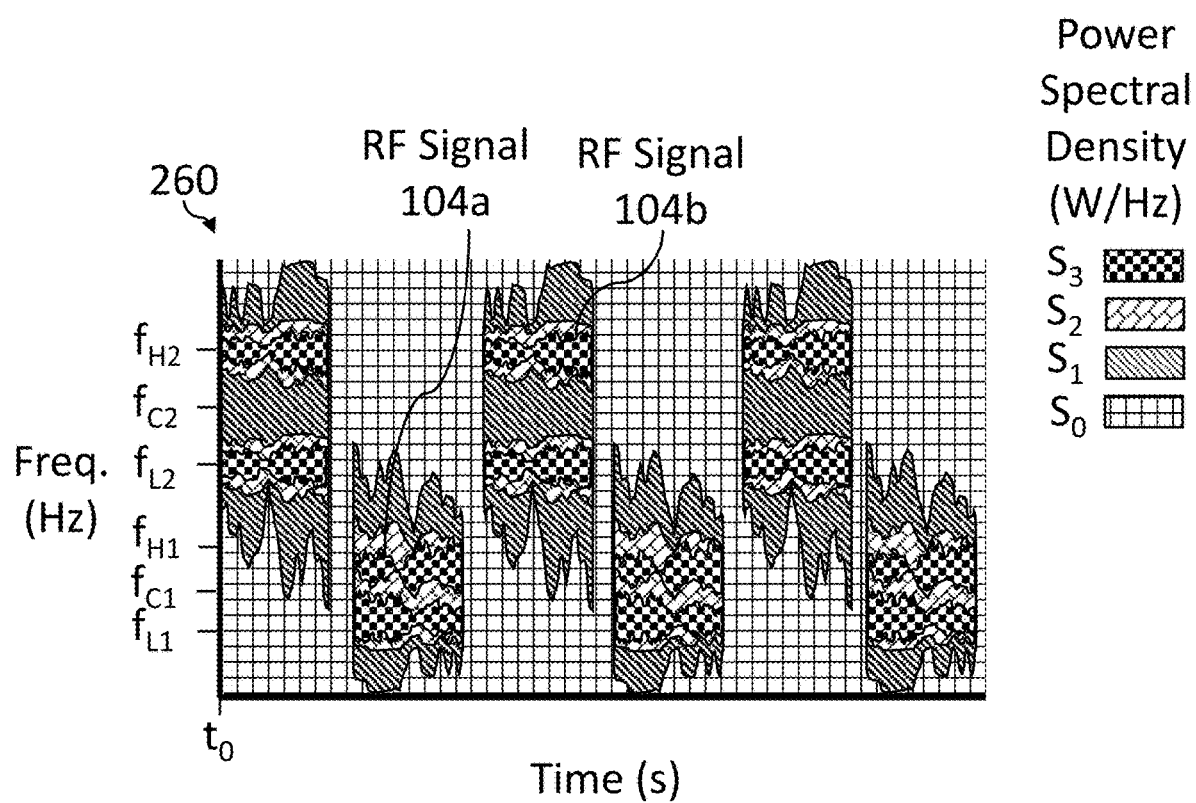
FIG. 2C is a spectrogram of the RF radiation of FIG. 2B, according to some embodiments.

FIG. 2B is a graph 250 of power spectral density of RF radiation that may be received by RF sensor 200 vs. frequency, according to some embodiments. In some embodiments, RF radiation received by RF sensor 200 may include one or more RF signals, such as RF signals 104a and 104b shown in FIG. 2B. In some embodiments, the power spectral density shown in graph 250 may be obtained by processor 222 of RF signal detection circuitry 220 by performing a DFT on digital samples of RF radiation received by antenna 202, such as directly or after the RF radiation has been digitally sampled, spectrally filtered, I/Q sampled, and/or demodulated by RF front-end circuitry 210 and provided to RF signal detection circuitry 220 as RF radiation data. In some embodiments, the power spectral density of RF radiation received at processor 222 may be at least partially filtered compared to the RF radiation received at antenna 202. Alternatively or additionally, processor 222 may be configured to filter out at least a portion of the RF radiation prior to providing RF radiation data to the trained model.

As shown in graph 250, each RF signal 104a and 104b may have a center frequency $f_C$ and an operating frequency band defined from its uppermost frequency $f_H$ and lowermost frequency $f_L$. For example, in graph 250, RF signal 104a is shown as a dual sideband reduced carrier (DSB-RC) signal, with peak power spectral density $S_3$ in the sidebands of the operating frequency band between center frequency $f_{C1}$ and uppermost frequency $f_{H1}$ and between center frequency $f_{C1}$ and lowermost frequency $f_{L1}$, and with at least power spectral density $S_2$ at the center frequency $f_{C1}$. Also shown in graph 250, RF signal 104b is shown as a dual sideband suppressed carrier (DSB-SC) signal, with peak power spectral density $S_3$ in the sidebands of the operating frequency band between center frequency $f_{C2}$ and uppermost frequency $f_{H2}$ and between center frequency $f_{C2}$ and lowermost frequency $f_{L2}$. In this example, the minimum power spectral density $S_0$ of RF signal 104b may be approximately 0 W/Hz at center frequency $f_{C2}$, though the minimum power spectral density $S_0$ will usually be nonzero due to the presence of noise in the operating environment 102 in which RF sensor 200 is positioned.

In some embodiments, a trained model executed by processor 222 of RF sensor 200 may be configured to detect the presence of RF signals 104a and 104b among RF radiation data provided to the trained model that includes the power spectral density data of graph 250, the spectrogram 260, and/or corresponding digital samples. For example, the trained model may be configured to output an indication of which portion(s) of the graph 250 and/or spectrogram 260 correspond to RF signals 104a and 104b. In this example, the output of the trained model may indicate the center frequency, lowermost frequency, and/or uppermost frequency of each RF signal 104a and 104b. Alternatively or additionally, the trained model may be configured to indicate the power spectral density of RF signal 104a and/or 104b at one or each such determined frequency.

In some embodiments, the trained model may be trained to detect the presence of RF signals among received RF radiation, and/or determine the operating frequency of received RF signals by providing RF signals to the trained models having various frequencies, modulation types, and/or power spectral density levels. In some embodiments, the trained model may be trained using RF signals transmitted and/or received in the operating environment 102 such that the trained model accounts for unique characteristics of the operating environment 102. For example, the operating environment 102 may include features (e.g., buildings, trees, etc.) that may impact the RF radiation, as well as the frequency, phase, and/or power spectral density levels of received RF signals. In this example, training the model using RF signals transmitted and/or received from the operating environment 102 may allow the model to detect received RF signals and/or determine the operating frequency of received RF signals even when such features are present. In some embodiments, the trained model may be trained using an input dataset generated based on real RF signals transmitted in the operating environment 102. For example, the input dataset may be generated using a system configured to receive one or more real RF signals and generate a large quantity of RF radiation data that may be used to train the model. Alternatively or additionally, the system may be configured to receive one or more simulated RF signals and generate RF radiation data using the simulated RF signal(s).

It should be appreciated that the representation of RF signals 104a and 104b as DSB-RC and DSB-SC, amplitude modulated (AM) signal is one example, and that RF signal(s) 104 could have any type of modulation, such as double sideband full carrier (DSB-FC), and/or with single sideband (SSB) rather than double sideband modulation. Alternatively or additionally, RF signal(s) 104 could be quadrature amplitude modulated (QAM), PM, and/or frequency modulated (FM).

Figure 2D:
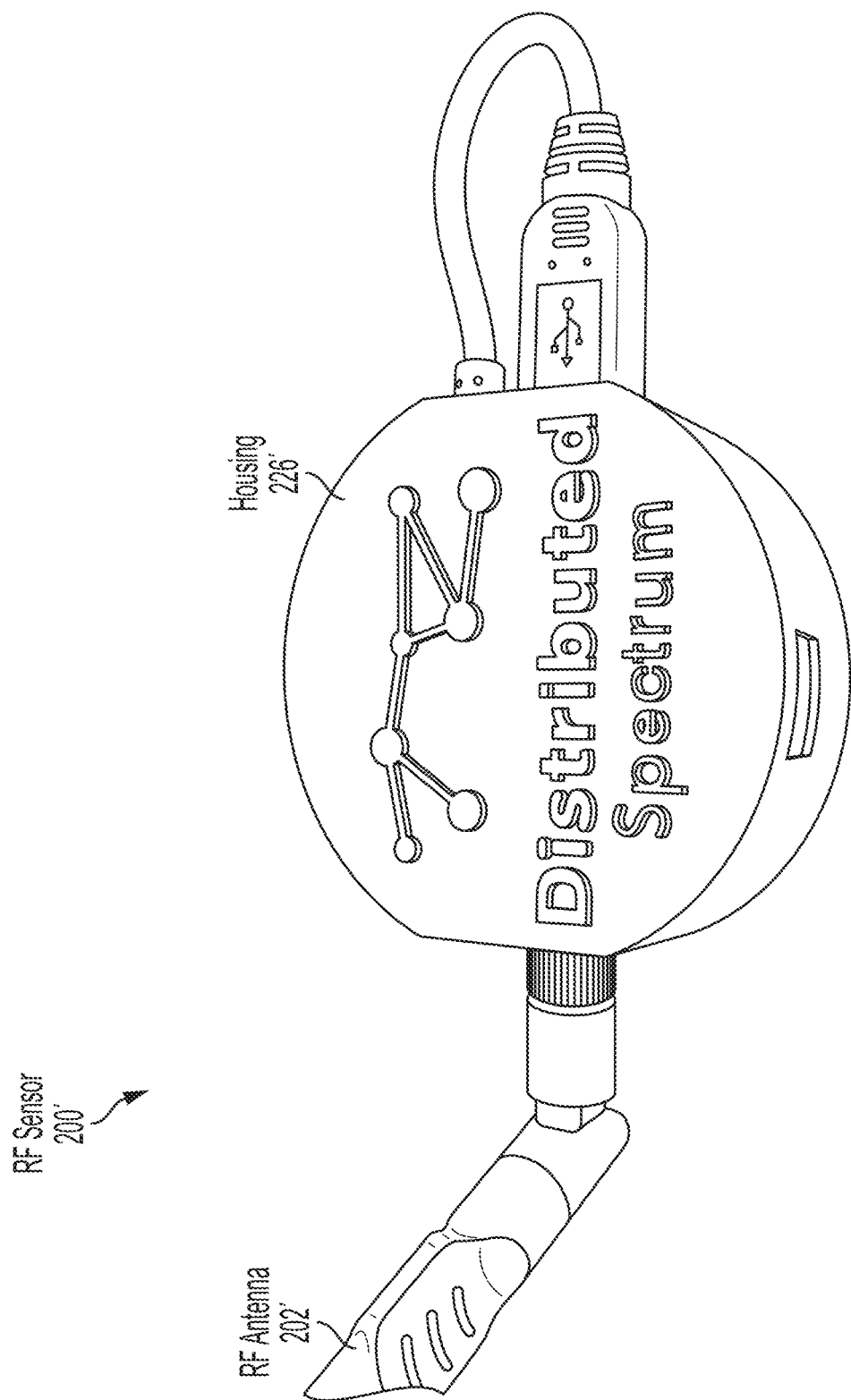
FIG. 2D is a top perspective view of another example RF sensor that may be included in the system of FIG. 1, according to some embodiments.

FIG. 2D is a top perspective view of another example RF sensor 200' that may be included in system 100, according to some embodiments. In some embodiments, RF sensor 200' may be configured in the manner described herein for RF sensor 200. For example, as shown in FIG. 2D, RF sensor 200' includes RF antenna 202'. Also shown in FIG. 2D, RF sensor 200' includes a housing 226' supporting RF antenna 202'. In some embodiments, housing 226' may be formed using hard plastic, such as acrylonitrile butadiene styrene (ABS) plastic. In some embodiments, housing 226' may be less than 10 inches in diameter, such as less than 5 inches in diameter. In some embodiments, housing 226' may be approximately the size of a hockey puck.

In some embodiments, housing 226' may contain other components of RF sensor 200', such as an RF front-end and one or more processors. In some embodiments, housing 226' may contain an SDR electrically connected to RF antenna 202' (e.g., via a coaxial connector integrated with RF antenna 202') and one or more processors (e.g., mounted on a circuit board) electrically connected to the SDR (e.g., via the illustrated USB cable).

Figure 3:
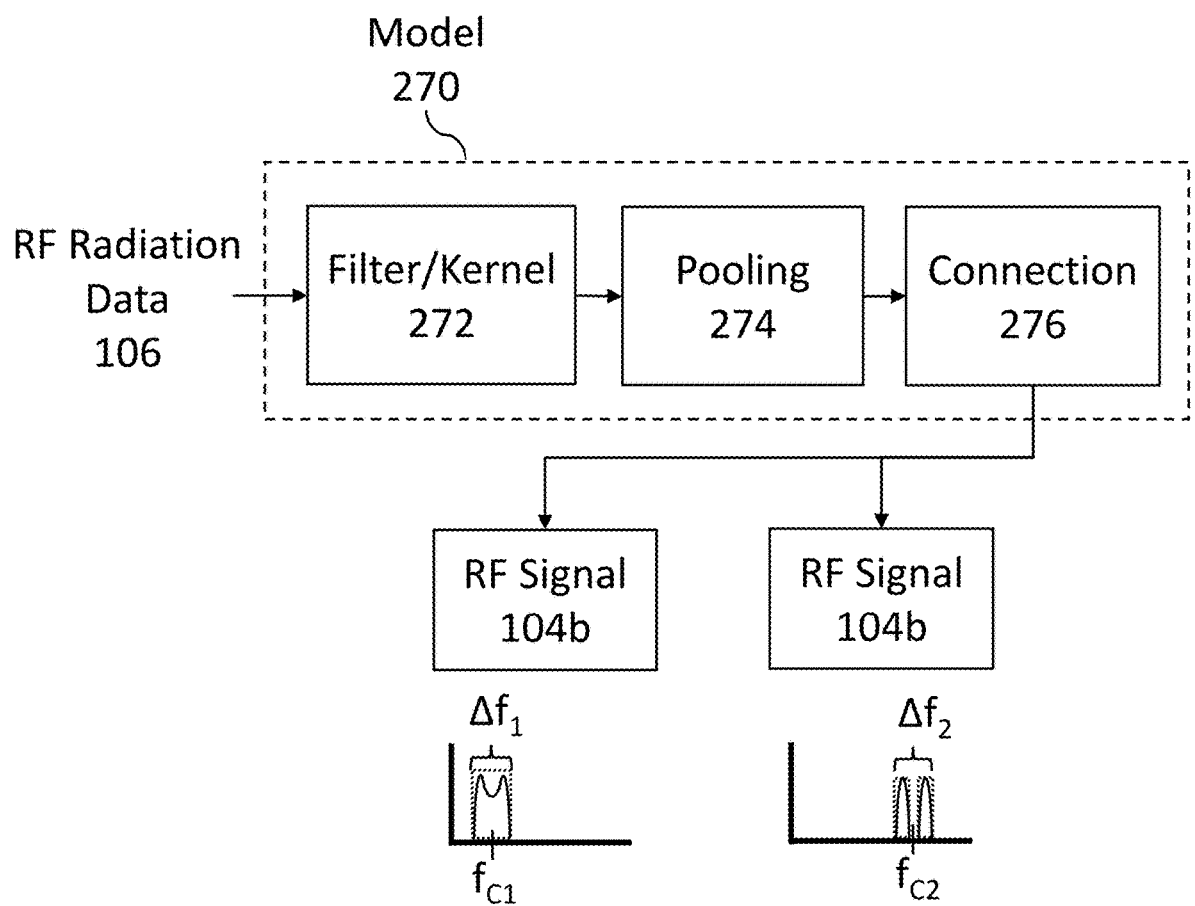
FIG. 3 is a block diagram of an example RF signal detection model that may be executed by one or more processors of the RF sensor of FIG. 2A, according to some embodiments.

FIG. 3 is a block diagram of an example RF signal detection model 270 that may be executed by one or more processors 222 of RF sensor 200, according to some embodiments. In some embodiments, model 270 may be configured to receive RF radiation data 106 indicating characteristics of RF radiation received by RF sensor 200 and provide an output indicating the presence of one or more RF signal(s) 104 among the RF radiation data 106. For example, the RF radiation data 106 may indicate power levels for different time and/or frequency components of the RF radiation. As shown in FIG. 3, model 270 may include filter and/or kernel layers 272, pooling layers 274, and connection layers 276. According to various embodiments, RF radiation data 106 may include digital samples of received RF radiation, power spectral density data of the RF radiation, and/or a time-frequency representation of the RF radiation such as a spectrogram.

In some embodiments, filter and/or kernel layers 272 may include one or more weighted vectors for applying to (e.g., convolving with) RF radiation data 106. For example, the filter and/or kernel layers 272 may be configured with weights set when training model 270 such that, when applied to RF radiation data 106, the outputs of filter and/or kernel layers 272 indicate which portions of RF radiation data 106 correspond to one or more RF signals. Alternatively or additionally, the outputs of filter and/or kernel layers 272 may indicate operating frequency characteristics of the RF signal(s) such as the center, uppermost, and/or lowermost frequencies of RF signal(s). In some embodiments, the filter and/or kernel layers 272 may be applied to (e.g., convolved with) time domain samples of RF radiation data 106, each indicating the power level of the RF radiation at the sampled moment in time. In some embodiments, outputs from multiple filter and/or kernel layers 272 may be pooled using pooling layers 274 to highlight portions of RF radiation data 106 that are most indicative of the presence of one or more RF signals and/or the operating frequency of the RF signal(s).

In some embodiments, connection layers 276 may be configured to detect the presence of one or more RF signals in RF radiation data 106 based on outputs from pooling layers 274. For example, the connection layers 276 may be configured to apply a loss function, used to train the model 270, to the outputs from pooling layers 274 to predict the RF signal(s) are present in RF radiation data 106, and/or the operating frequency (e.g., center, uppermost, and/or lowermost frequencies) of the RF signal(s). In some embodiments, connection layers 276 may be configured to output a confidence score for each detected RF signal and/or regressed operating frequency output. For example, during training, model 270 may be more highly rewarded for outputting accurate results with high confidence scores and/or more severely penalized for outputting inaccurate results with high confidence scores. Alternatively or additionally, in some embodiments, the connection layers 276 may be configured to classify the presence and/or operating frequency of RF signal(s) from among a plurality of portions of the RF radiation data 106 and/or operating frequencies.

In some embodiments, connection layers 276 may be configured to apply an intersection-over-union (IOU) loss function to outputs from pooling layers 274 to detect the presence of the RF signal(s). For example, connection layers 276 may be configured to select a portion of the RF radiation data 106 indicated as corresponding to an RF signal and apply the IOU loss function to the selected portion, with the output of the loss function indicating whether and/or to what extent (e.g., how likely and/or how much of) the selected portion of the RF radiation data 106 corresponds to an RF signal. In this example, the IOU loss function may result from training the model 270 to minimize the difference between selected portions of RF radiation data 106 and labeled portions of RF radiation data 106 corresponding to RF signals. In some embodiments, the IOU loss function may further result from weighted penalties that increase for larger differences between selected and labeled portions of RF radiation data. Alternatively or additionally, in some embodiments, model 270 may be configured to apply a SoftMax activation function and/or the connection layers 276 may be configured to apply a cross-entropy loss function over a plurality of selected portions of RF radiation data 106. In some embodiments, the cross-entropy loss function may have coefficients resulting from IOU loss penalties during training.

As shown in FIG. 3, the output from the trained model 270 may indicate the presence of RF signals 104a and 104b in the RF radiation data 106 (e.g., shown in the power spectral density graph of FIG. 2B) as well as the operating frequency band $\Delta F_1$ and center frequency $f_{C1}$ of RF signal 104a and the operating frequency band $\Delta f_2$ and center frequency $f_{C2}$ of RF signal 104b. It should be appreciated that, while the RF signals 104a and 104b are shown indicated in power spectral density graphs, the RF signals 104a and 104b may be alternatively or additionally indicated in digital samples, a spectrogram, and/or other time, frequency, and/or power level representation.

In some embodiments, model 270 may be trained using various RF signals having different frequencies, power levels, and/or modulation characteristics. For example, different frequencies and/or modulation characteristics may be learned using different types of RF sources to transmit the RF signals, and different power levels may be learned by moving the RF source to different locations within the operating environment 102 to introduce reflections and/or attenuation due to the nature of the particular operating environment 102, which will acclimate the model 270 to the operating environment 102. In some embodiments, model 270 may be trained using labeled RF radiation data generated based on real RF signals received in the operating environment 102, thereby simulating training model 270 on a large dataset of RF signals while using only a small number of real RF signals. Alternatively or additionally, model 270 may be trained using labeled RF radiation data generated based on simulated RF signals.

Figure 4:
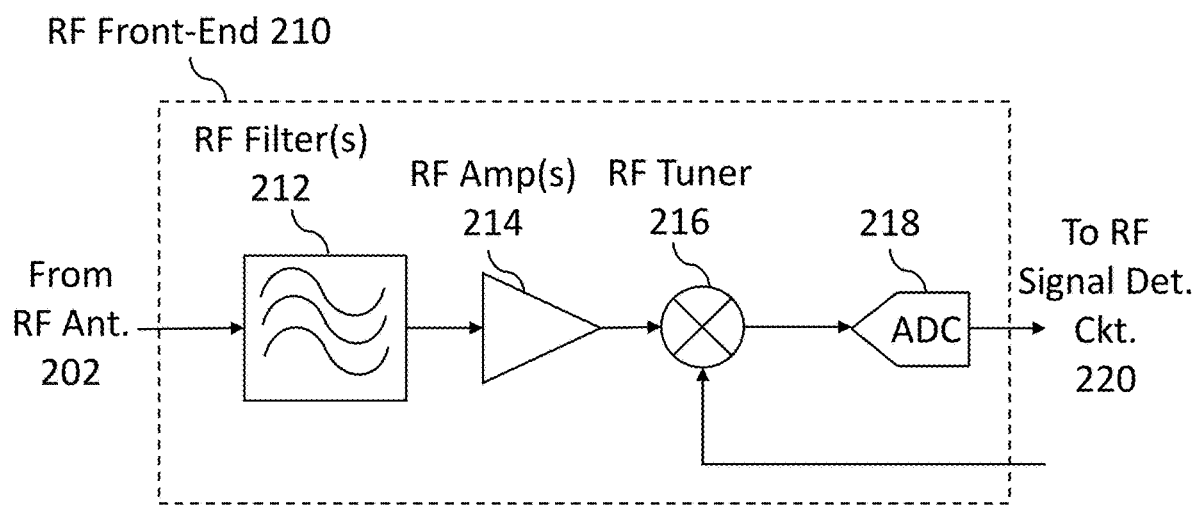
FIG. 4 is a circuit diagram of example RF front-end circuitry that may be included in the RF sensor of FIG. 2A, according to some embodiments.

FIG. 4 is a circuit diagram of example RF front-end circuitry 210 that may be included in RF sensor 200, according to some embodiments. As shown in FIG. 4, RF front-end circuitry 210 may include one or more filters 212, amplifiers 214, RF tuners 216, and/or ADC(s) 218. In some embodiments, filter(s) 212 may include one or more low pass, high pass, band-pass, and/or band-stop filters configured to isolate certain portions of RF radiation received via RF antenna 202. In some embodiments, amplifier(s) 214 may be configured to provide low-noise amplification to increase the power level of the received and filtered RF radiation for providing to RF tuner(s) 216. In some embodiments, RF tuner(s) 216 may be configured to demodulate and/or down-convert and provide received RF radiation to ADC(s) 218. In some embodiments, ADC(s) 218 may be configured to digitally sample RF radiation to provide digital samples to RF signal detection circuitry 220.

In some embodiments, RF front-end circuitry 210 may include one filter 212, amplifier 214, tuner 216, and/or ADC 218 for conditioning RF radiation received in a single frequency band, and/or for each frequency band at which RF sensor 200 is configured to receive RF radiation. In some embodiments, the ADC(s) 218 may be coupled earlier in the RF front-end circuitry 210. For example, amplification and/or RF tuning may be performed using a processor coupled to the ADC(s) 218.

In some embodiments, RF front-end circuitry 210 may include an SDR that includes a processor. For example, the SDR may be configured to receive and digitally sample and/or demodulate RF radiation in the frequency range from 20 MHz to 1.7 GHz, with a channel bandwidth of up to 2.5 MHz. In the same or another example, the SDR may be configured to output 8-bit digital samples of received RF radiation. One SDR that may be suitable is the RTL-SDR dongle available from www.rtl-sdr.com Other SDRs may be used, such as high-grade SDRs capable of digitally sampling large frequency ranges, such as between 1 MHz and 6 GHz, and/or using high digital sampling rates, such as up to 100 million 16-bit complex samples per second (Msps) (e.g., 16 real bits and 16 imaginary bits for 32 total bits per sample). In some embodiments, the SDR may have an adjustable RF tuner and/or digital sampling rate controllable using processing circuitry 220. For example, processing circuitry 220 may be configured to adjust the frequency range and/or digital sampling rate of the SDR in response to instructions from computer 300.

In some embodiments, RF tuner(s) 216 may be configured to adjustably down-convert received RF radiation from various receive frequency bands to baseband (e.g., a lower frequency more suitable for signal processing using a general purpose processor than for wireless transmission). For example, RF tuner(s) 216 may be adjustable among multiple receive frequencies, such as by adjusting the frequency of a local oscillator coupled to a mixer of the RF tuner(s) 216.

Alternatively or additionally, in some embodiments, RF tuner(s) 216 may be configured to scan among multiple channels within a receive frequency band. For example, RF tuner(s) 216 may be adjustable among multiple channel frequencies, such as for several 22 MHz channels near a center frequency of 2.4 GHz, by providing down- and/or up-conversion by a discrete number of channel bands. In the same or another example, tuner(s) 216 may be configured to scan within the frequency range from 20 MHz to 1.7 GHz. In some embodiments, RF tuner(s) 216 may be configured to generate and provide I/Q samples and/or demodulated digital samples of RF radiation, such as using multiple frequency mixers tuned to the same local oscillator frequency and out of phase from one another by 90 degrees. In some embodiments, RF tuner(s) 216 may include baseband and/or channel filters configured to remove image frequencies generated via up- and/or down-conversion. In some embodiments, ADC(s) 218 may be configured to generate digital samples of RF radiation received and/or demodulated via RF tuner(s) 216. In some embodiments, processor 222 may be configured to digitally reconstruct I/Q samples to their originally received digital representation for transmission as RF characteristic data. For example, MAC addresses (e.g., of Bluetooth devices) may be discerned among digital samples of RF radiation once digitally reconstructed.

In some embodiments, RF front-end circuitry 210 may include low-cost electronics (e.g., onboard and/or coupled to an SDR) such as RF tuner(s) 216 that do not rely on ultra-precise clock synchronization. For example, RF front-end circuitry 210 may be configured to sample received RF radiation using clock references that are allowed to drift by 50 ns, 100 ns, or more (e.g., as high as 1, 100, or even 500 milliseconds), with respect to clock references of other RF sensors 200 deployed in the operating environment 102, without impacting signal detection, RF source type determination, RF source operating condition determination, and/or RF source location determination. Alternatively or additionally, RF front-end circuitry 210 may be configured to sample received RF radiation using clock references that are allowed to drift in frequency with respect to clock references of other RF sensors deployed in the operating environment 102. In some embodiments, ADC(s) 218 may be configured to use a digital sampling rate of 100 Msps, 50 Msps, 20 Msps, or lower, without impacting such RF determinations. It should be appreciated that any suitable digital sampling rate may be used, depending on the application.

In some embodiments, processor(s) 222 may be configured to synchronize the timing of digital samples of RF radiation using RF signals among the RF radiation having a known time base and/or location. For example, an RF signal among the RF radiation having a known source (e.g., an FM radio signal from a public broadcasting station) may be used to synchronize the time of reception of RF radiation containing the same RF signal. In some embodiments, computer 300 may be configured to synchronize timing similarly, such as when RF signals are indicated in RF characteristic data from multiple RF sensors, and each contains the same known RF signal for reference. In some embodiments, a known RF signal may be alternatively or additionally used to aid in localizing an RF source, such as by comparing a determined (e.g., regressed) location of the RF source of the known RF signal to a known location of the RF source (e.g., stored as a reference in memory). Alternatively or additionally, in some embodiments, processor 222 and/or computer 300 may be configured to synchronize the timing of digital samples of RF radiation using one or more Internet-based timing protocols.

In some embodiments, computer 300 of system 100 may be alternatively or additionally configured to detect the presence of RF signals 104 among RF radiation received by an RF sensor 200. For example, the RF sensor 200 may be configured to transmit RF characteristic data 112 indicating characteristics of received RF radiation and/or including digital samples of received RF radiation to computer 300, and a processor of computer 300 may be configured to execute a trained model (e.g., model 270). In this example, the trained model may be configured to detect the presence of the RF signal(s) and/or classify and/or regress the operating frequency of the received RF signal(s) as described herein for the trained model executed by RF sensor 200.

Figure 5:
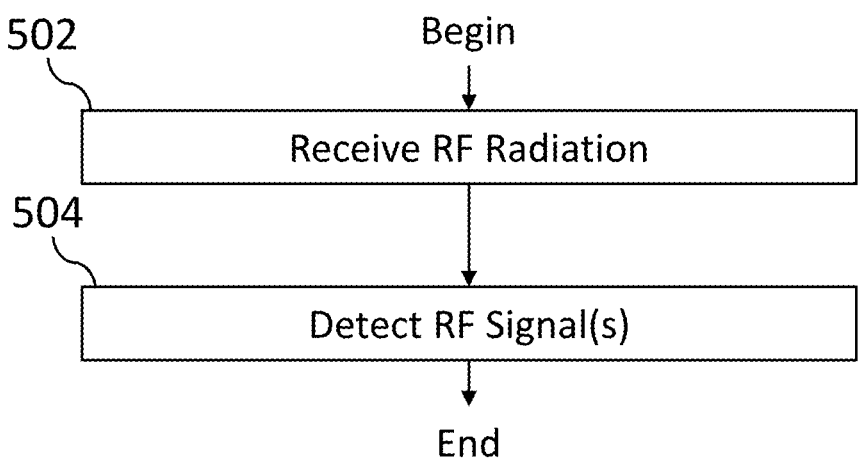
FIG. 5 is a flow diagram of an example method of RF signal classification and/or regression that may be performed using the RF sensor of FIG. 2A, according to some embodiments.

FIG. 5 is a flow diagram of an example method 500 of RF signal detection that may be performed using RF sensor 200 of system 100, according to some embodiments. As shown in FIG. 5, method 500 may include receiving RF radiation at step 502 and detecting the presence of one or more RF signals among the RF radiation at step 504. For example, method 500 may be performed using RF signal detection circuitry 220 of RF sensor 200 while RF sensor 200 is positioned in the operating environment 102 of system 100. In some embodiments, method 500 may be performed using RF sensor 200 and computer 300 of system 100, such as by performing step 502 using RF sensor 200 and performing step 504 using computer 300. In some embodiments, a non-transitory computer-readable medium may be encoded thereon with instructions that, when executed by at least one processor of an RF sensor, cause the RF sensor to perform method 500.

In some embodiments, receiving the RF radiation at step 502 may include receiving the RF radiation at RF antenna 202 of RF sensor 200. For example, the RF antenna 202 can provide the received RF radiation to RF front-end circuitry 210 for conditioning, demodulating, and/or digitizing before providing the RF radiation (e.g., digital samples) to RF signal detection circuitry 220. In some embodiments, receiving the RF radiation at step 502 may include tuning the RF front-end circuitry 210 of RF sensor 200 to a predetermined receive frequency and/or channel. For example, multiple RF sensors 200 may be tuned to the same receive frequency and/or channel to scan for a particular RF signal and/or to different frequencies and/or channels to scan for various RF signals.

In some embodiments, detecting the presence of the RF signal(s) among the RF radiation at step 504 may include processor 222 of RF signal detection circuitry 220 executing a trained model and providing, as input to the trained model, RF radiation data indicating characteristics of the RF radiation received at step 502. For example, processor 222 may provide digital samples and/or frequency domain values (e.g., obtained via DFT) of the RF radiation, and/or a time-frequency representation of the RF radiation (e.g., spectrogram) to the trained model as the RF radiation data. In some embodiments, the presence of the RF signal(s) may be detected using the output of the trained model. For example, processor 222 may execute model 270, which may output an indication of which portion(s) of the RF radiation data correspond to the RF signal(s). In some embodiments, the output of the trained model may indicate the operating frequency of the RF signal(s), such as the center, uppermost, and/or lowermost frequencies of RF signal(s) and/or power levels of the RF signal(s) at such frequencies.

In some embodiments, method 500 may further include transmitting RF characteristic data 112, indicating characteristics of received RF signals, to computer 300 over communication network 400. For example, the RF characteristic data 112 may include outputs from the trained model, indications of the time period, frequency range, and/or power levels indicating the RF signals, and/or digital samples of RF radiation that include the RF signals. In some embodiments, computer 300 may determine the type, location, and/or operating condition of the RF source that transmitted the RF signal using the RF characteristic data 112.

IV. RF Source Classification Techniques

The inventors have also developed RF source classification techniques that may be implemented using system 100 of FIG. 1. For example, such techniques may be implemented using a trained model executed by RF sensor 200 and/or computer 300, as described further herein.

Figure 6:
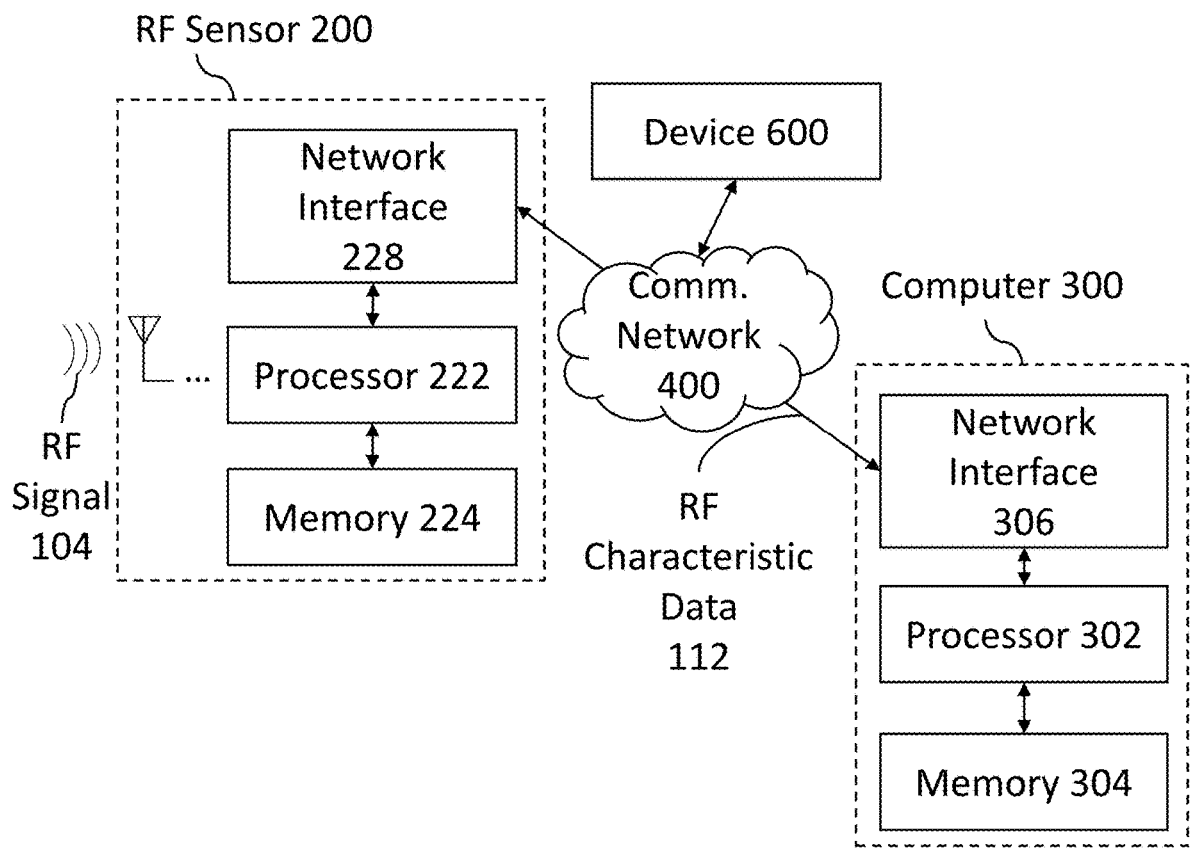
FIG. 6 is a block diagram illustrating an RF sensor, computer, and network-connected device that may be included in the system of FIG. 1, according to some embodiments.

FIG. 6 is a block diagram illustrating an RF sensor 200 and computer 300 that may be included in system 100, according to some embodiments. In FIG. 6, RF sensor 200 is shown including processor 222 operatively coupled to memory 224 and a network interface 228 that may be configured to connect to communication network 400. Also shown in FIG. 6 is computer 300 including processor 302, memory 304, and a network interface 306 that may be configured to connect to communication network 400. Also shown in FIG. 6 is a network-connected device 600 that may be configured to connect to communication network 400. For example, device 600 may include a personal computer and/or mobile device with a user interface for alerting a user that a non-associated RF source is present in operating environment 102. In some embodiments, RF sensor 200 may be configured to send RF characteristic data 112, indicating characteristics of RF radiation received by RF sensor 200, to computer 300, such as described herein including in connection with FIGS. 1-5. In some embodiments, computer 300 may be configured to classify the source of RF signal(s) 104 included in the RF radiation using RF characteristic data 112, as described further herein. Alternatively or additionally, in some embodiments, computer 300 may be configured to determine an operating condition of the RF source, such as whether the operating condition of the RF source has deviated from a predetermined operating condition.

In some embodiments, processor 302 of computer 300 may be configured to classify the source of the RF signal(s) 104 using RF characteristic data 112. For example, processor 302 may be configured to execute a trained model and input the RF characteristic data 112 to the trained model. In this example, the trained model may be configured to output a classification of the RF source that transmitted the RF signal(s) 104. In some embodiments, RF characteristic data 112 may include outputs from a trained model executed by processor 222 of RF sensor 200 that indicate the presence of RF signal(s) 104 among received RF radiation, an indication of a time period, frequency range, and/or power level of the RF signal(s) 104, and/or digital samples of the RF radiation generated by RF front-end circuitry 210 of RF sensor 200.

In some embodiments, processor 302 of computer 300 may be configured to determine and/or classify RF anomalies in operating environment 102, such as one or more RF sources (e.g., associated with the operating environment 102) and/or RF sensors 200 deviating from predetermined operating conditions. As one example of an RF anomaly, a non-associated RF source may be present in operating environment 102 and interfering with one or more RF sources associated with the operating environment, which may be apparent in RF radiation received by one or more RF sensors 200. For instance, the interference may be apparent by detection of a distorted RF signal from the associated RF source, and/or a low SNR of the detected RF signal (e.g., due to an elevated noise floor from the non-associated RF source radiation). In some embodiments, trained models (e.g., executed by computer 300) may be configured to classify anomalous conditions, such as the presence of an interfering RF source, at least in part due to training on RF radiation expected to be present in the operating environment and/or training (e.g., facilitating classification of anomalous conditions by contrast).

In some embodiments, processor 302 of computer 300 may be further configured to instruct one or more RF sensors 200 to selectively transmit RF characteristic data corresponding to the received RF signal(s) 104. For example, in response to determining that an RF signal 104 was transmitted from a non-associated RF source (e.g., a cell phone belonging to an unauthorized person in operating environment 102), processor 302 may be configured to instruct RF sensors 200 (e.g., other than the RF sensor 200 that received RF signal 104) to transmit RF characteristic data including and/or indicating characteristics of digitally sampled RF radiation having the time period of reception, frequency range, and/or power level of RF signal 104, such that the RF sensors 200 may each receive the RF signal 104, such as in different locations. In this example, by having multiple RF sensors 200 transmitting RF characteristic data corresponding to the received RF signal 104, versions of the RF signal 104 received at multiple RF sensors 200 positioned in different locations may be subsequently used to determine the location of the RF source that transmitted the RF signal 104, as described further herein. Alternatively or additionally, classification and/or operating condition determination may be performed iteratively using multiple versions of the RF signal 104 as received by different RF sensors 200, such as with different SNR (e.g., indicated in the RF characteristic data).

In some embodiments, computer 300 may be configured to operate with RF sensors 200 having heterogeneous processing resources and/or connected over low-bandwidth network links of communication network 400. For example, in some embodiments, a first RF sensor 200 may have an SDR with a higher digital sampling rate than a second RF sensor 200. In this example, the first RF sensor 200 may have a faster processing speed than the second RF sensor 200, facilitating processing a large number of digital samples generated by the high-sampling rate SDR. In some embodiments, the first RF sensor 200 may be configured to execute a trained model and select digital samples from among RF radiation data indicating RF radiation received by the first RF sensor 200, such as to identify and/or classify one or more RF signals received by the first RF sensor 200, an RF source of the RF signal(s), and/or the operating condition of the RF source. For example, the first RF sensor 200 may be configured with high processing resources to select small, targeted subsets of digital samples, trained model outputs, and/or indications of RF signal and/or RF source characteristics for transmission, facilitating use of a low-bandwidth link.

In contrast, in some embodiments, the second RF sensor 200 may be configured to select digital samples according to predetermined RF radiation selection criteria (e.g., time period of reception, frequency range, and/or power level) stored in memory, and/or according to instructions received from computer 300 (e.g., in response to an RF sensor 200 detecting an RF signal, classifying an RF source, etc.). For example, the second RF sensor 200 may be configured to perform less processing and transmit a large quantity of digital samples (e.g., over a moderate to high bandwidth link) and/or a targeted set of digital samples and/or characteristics thereof (e.g., over a low-bandwidth link), with the second RF sensor 200 having low processing resources facilitating low power operation.

In some embodiments, RF sensors 200 of system 100 may have varying levels of processing resources, according to the application and the desired operation of the particular RF sensor 200. For example, a first RF sensor 200 may have a single-core processor 222 capable of processing 4 Msps. In the same or another example, a second RF sensor 200 may have a multi-core processor 222 capable of processing 30 Msps. In the same or yet another example, a third RF sensor 200 may have a multi-core processor 222 capable of processing 50 Msps, or even 200 Msps. In some embodiments, multiple processors 222 may be used, such as described herein, with a first component (e.g., GPU, FPGA, ASIC, etc.) configured to execute a trained model and/or process digital samples and a second component (e.g., CPU) configured to package and/or transmit RF characteristic data over communication network 400.

In some embodiments, processor 302 of computer 300 may be configured to notify a user when an RF signal is detected, an RF source is classified (e.g., a non-associated RF source), an RF source is determined to have deviated from its predetermined operating condition (e.g., power transmission level), and/or an RF source is located (e.g., in a new location). For example, in any or each of these cases, processor 302 may be configured to transmit a message to device 600 over communication network 400 for device 600 to alert a user. In some embodiments, computer 300 and/or device 600 may store (e.g., in memory) a list of associated RF sources, operating condition data for the RF source(s) (e.g., a predetermined operating condition and/or recent operating condition data obtained via RF sensors 200), classifications of the RF source(s) (e.g., type of RF source and/or a potential threat level of the type of RF source), and/or locations of the associated (and/or non-associated) RF sources (e.g., obtained using RF characteristic data from RF sensors 200). In some embodiments, device 600 may be configured to present the data to a user audio-visually (e.g., using a graphical user interface and/or sound alerts). It should be appreciated that other types of alerts, such as text message, phone call, email, and/or haptic alerts, may be used according to the particular application.

In some embodiments, memory 304 may include non-volatile memory storing instructions that, when executed by processor 302, cause processor 302 to execute a trained model. According to various embodiments, processor 302 may include a general purpose processor (e.g., a central processing unit), a RISC processor, an application specific processor (e.g., an ASIC), and/or a reprogrammable processor (e.g., an FPGA). In some embodiments, processor 302 may include volatile memory such as RAM configured to load instructions from memory 304 for executing a trained model.

Figure 7:
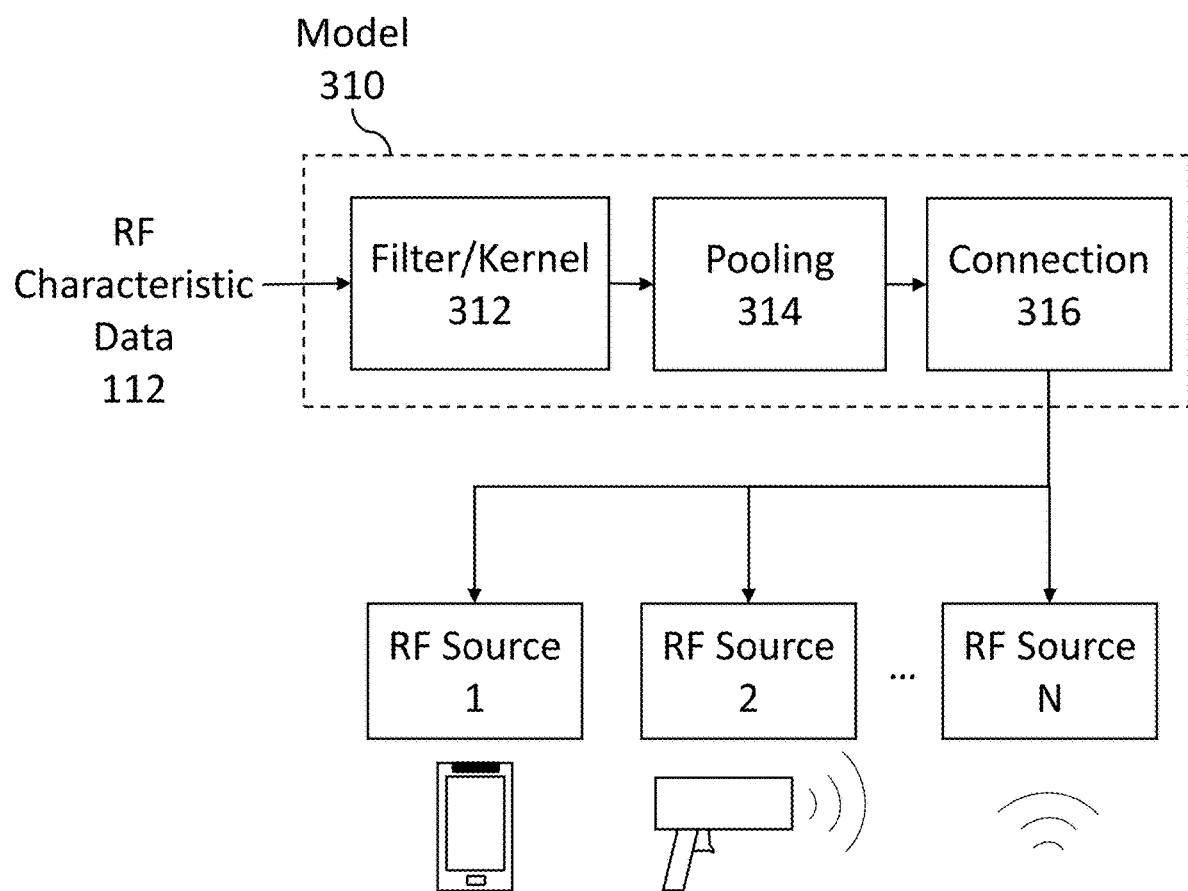
FIG. 7 is a block diagram of an example RF source classification model that may be executed by one or more processors of the computer of FIG. 6, according to some embodiments.

FIG. 7 is a block diagram of an example RF source classification model 310 that may be executed by one or more processors 302 of computer 300, according to some embodiments. In some embodiments, model 310 may be configured to classify the type of RF source that transmitted RF signal(s) 104 using RF characteristic data 112. For example, as shown in FIG. 7, model 310 may include filter and/or kernel layers 312, pooling layers 314, and connection layers 316.

In some embodiments, filter and/or kernel layers 312 may include one or more weighted vectors for applying to (e.g., convolving with) RF characteristic data 112. For example, the filter and/or kernel layers 312 may be configured with weights set when training model 310 such that, when applied to RF characteristic data 112, the outputs of filter and/or kernel layers 312 indicate characteristics of the RF source that transmitted the RF signal(s) 104, such as using the frequency, phase, power level, and/or modulation characteristics indicated in RF characteristic data 112. In some embodiments, the filter and/or kernel layers 312 may be applied to (e.g., convolved with) time domain samples of RF radiation that include the RF signal(s) 104, each indicating the power level of the RF radiation at the sampled moment in time. Alternatively or additionally, the filter and/or kernel layers 312 may be applied to other portions of the RF characteristic data 112. In some embodiments, outputs from multiple filter and/or kernel layers 312 may be pooled using pooling layers 314 to highlight portions of RF characteristic data 112 that are most indicative of the type of RF source that transmitted RF signal(s) 104.

For example, the connection layers 316 may be configured to classify the type of RF source that transmitted RF signal(s) 104 from among a plurality of types of RF sources, such as from among the types of RF sources the model 310 was trained to classify. In the example shown in FIG. 7, the plurality of types of RF sources may include RF sources 1-N. As shown, RF source 1 may be to a mobile communication device that transmits RF signals in the frequency range(s) around 900 MHz and/or 2.4 GHz, RF source 2 may be a vehicle speed radar device that transmits RF signals in the frequency range around 24 GHz, and RF source N may be a Wi-Fi router (e.g., 802.11a, b, g, n, and/or ac) that transmits RF signals in the frequency range(s) around 2.4 GHz and/or 5 GHz. Referring to the example of FIGS. 2A-3, model 310 may be configured to classify RF signal 104a as transmitted by RF source 1 and RF signal 104b as transmitted by RF source 2 based on RF characteristic data 112 indicating characteristics of the RF radiation that includes RF signals 104a and 104b. It should be appreciated that the RF source types illustrated herein are intended as examples and, according to various embodiments, model 31 may be configured to classify any suitable type of RF source. In some embodiments, model 270 may be configured to apply a SoftMax activation function, and the connection layers 316 may be configured to apply a cross-entropy loss function to outputs from pooling layers 314 to classify portions of RF characteristic data 112 as being transmitted by RF sources. In some embodiments, connection layers 316 may be further configured to provide a confidence score. For example, during training, model 270 may be more highly rewarded for outputting accurate results with high confidence scores and/or more severely penalized for outputting inaccurate results with high confidence scores.

In some embodiments, model 310 may be trained using various RF signals from different types of RF sources having different frequencies, power levels, and/or modulation characteristics. Alternatively or additionally, during training, the RF source may be moved to different locations within the operating environment 102 to introduce reflections and/or attenuation due to the nature of the particular operating environment 102, which will acclimate the model 310 to classifying the types of RF sources in the operating environment 102. In some embodiments, model 310 may be trained using RF characteristic data generated based on real RF signals received in the operating environment 102, thereby simulating training model 310 on a large dataset of RF signals while only using data from a small number of real RF signals. Alternatively or additionally, model 310 may be trained using RF characteristic data generated based on simulated RF signals.

Figure 8:
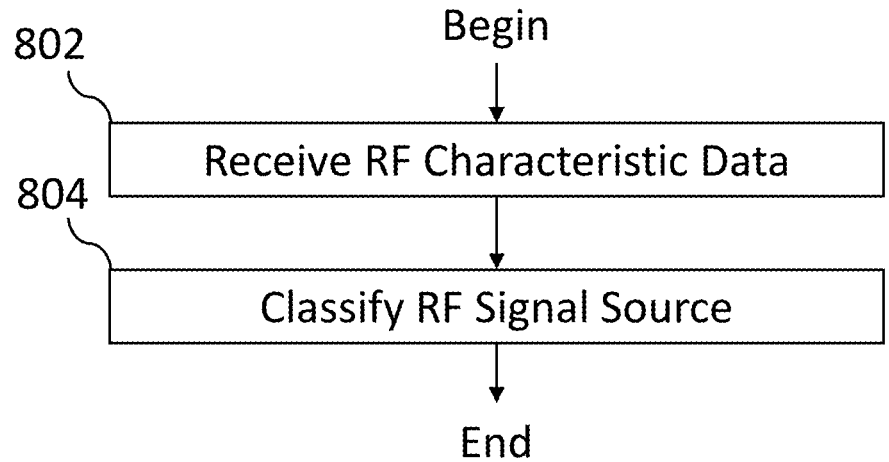
FIG. 8 is a flow diagram of an example method of RF source classification that may be performed using the computer of FIG. 6, according to some embodiments.

FIG. 8 is a flow diagram of an example method 800 of RF source classification that may be performed using computer 300 of system 100, according to some embodiments. As shown in FIG. 8, method 800 may include receiving RF characteristic data (e.g., RF characteristic data 112) indicating characteristics of received RF radiation at step 802 and classifying the RF source of the RF signal at step 804. For example, method 800 may be performed using processor 302 of computer 300 using RF characteristic data 112 received from one or more RF sensors 200 positioned in the operating environment 102 of system 100. In some embodiments, a non-transitory computer-readable medium may be encoded with instructions thereon that, when executed by at least one processor (e.g., processor 302), cause the processor(s) to perform method 800.

In some embodiments, receiving the RF characteristic data at step 802 may include receiving the RF characteristic data 112 at processor 302 of computer 300 from the RF sensor(s) 200 over communication network 400. For example, the RF characteristic data 112 may include outputs from a trained model executed onboard the RF sensor(s) 200, and/or digital samples of RF radiation received by the RF sensor(s) 200, such as described herein including in connection with method 500.

In some embodiments, classifying the RF source of the RF signal(s) at step 804 may include processor 302 of computer 300 executing a trained model and providing RF characteristic data 112 received at step 802 as input to the trained model. For example, processor 302 may provide outputs from the trained model(s) executed onboard the RF sensor(s) 200 that received RF signal(s) 104, and/or digital samples of the RF radiation generated by the RF sensor(s) 200, to the trained model executed by processor 302 as input(s). In some embodiments, the RF source may be classified using the output of the trained model executed by processor 302 generated in response to providing the RF characteristic data 112 as an input. For example, processor 302 may execute model 310, which may classify the RF source of RF signal(s) 104 using RF characteristic data 112 based on RF characteristic data from various RF sources used to train the model 310.

V. RF Source Localization Techniques

Figure 9A:
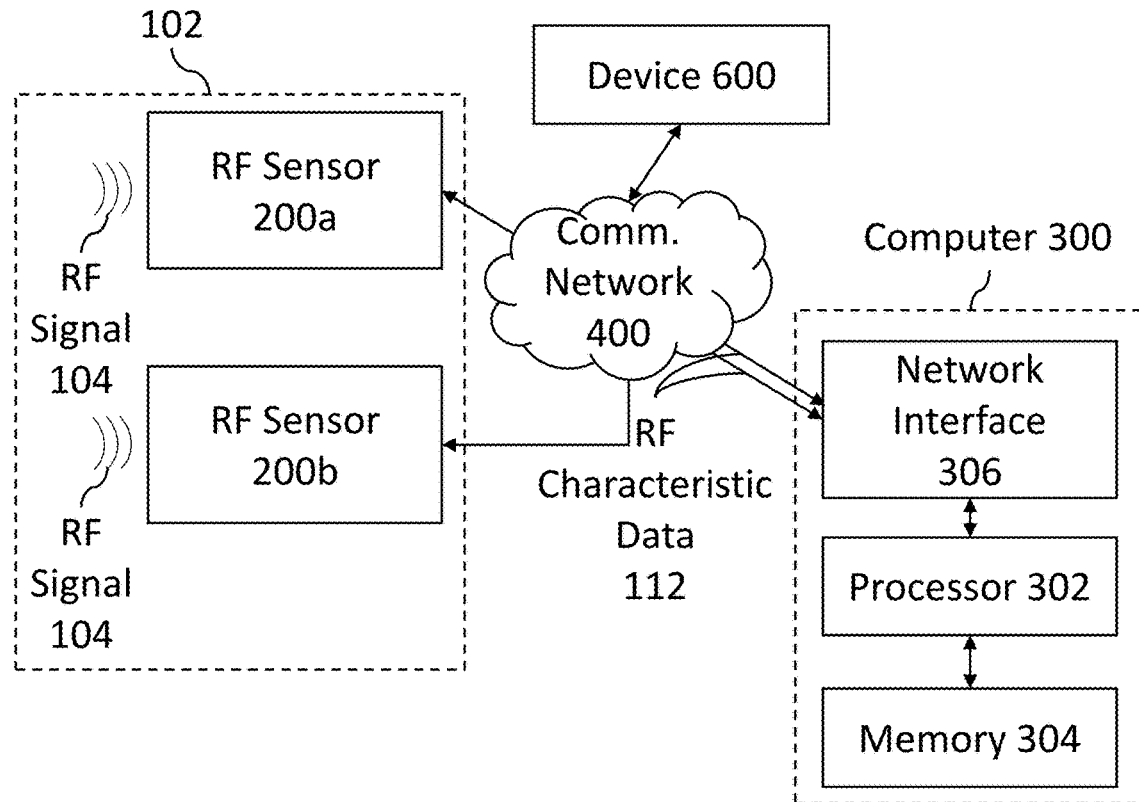
FIG. 9A is a block diagram illustrating a plurality of RF sensors, a computer, and network connected-device that may be included in the system of FIG. 1, according to some embodiments.

FIG. 9A is a block diagram illustrating RF sensors 200a and 200b and computer 300 that may be included in system 100, according to some embodiments. In FIG. 9A, two RF sensors 200a and 200b, which may be configured in the manner described herein for RF sensor 200. For example, RF sensors 200a and 200b are shown in FIG. 9A receiving an RF signal 104 among other RF radiation. In some embodiments, RF sensors 200a and 200b may be positioned in multiple respective locations within the operating environment 102 of system 100. For example, RF sensors 200a and 200b may be positioned at different heights and/or at different longitudinal and/or latitudinal geographic coordinates. Also shown in FIG. 9A, computer 300 may be communicatively coupled to each RF sensor 200a, 200b via communication network 400. For example, in FIG. 9A, computer 300 is shown receiving RF characteristic data 112 from RF sensors 200a and 200b indicating characteristics of RF radiation received at each RF sensor 200a and 200b.

In some embodiments, computer 300 may be configured to determine the location of the RF source of RF signal(s) 104 using RF characteristic data 112 received from RF sensors 200a and 200b. For example, processor 302 of computer 300 may be configured to receive RF characteristic data 112 from RF sensors 200a and 200b over communication network 400 and, based on the characteristics of the RF radiation indicated in the RF characteristic data 112, determine the location of the RF source. In some embodiments, processor 302 may be configured to execute a trained model and provide the RF characteristic data 112 to the trained model as an input, the trained model being configured to classify and/or regress the location of the RF source in response to receiving the RF characteristic data 112 as an input. For example, the RF characteristic data 112 may include digital samples of the received RF radiation, a time period, frequency range, and/or power level of the RF radiation (and/or of an RF signal therein), and/or the outputs of trained models executed by RF sensors 200a and 200b that indicate the presence of the RF signal(s) 104 among the RF radiation. In some embodiments, the RF characteristic data 112 may alternatively or additionally identify the RF sensors 200a and 200b that received the RF signal(s) 104 and/or their respective locations.

In some embodiments, prior to receiving RF characteristic data 112, computer 300 may be configured to instruct RF sensors 200a and 200b to select a subset of RF radiation data (e.g., digital samples) to which RF characteristic data 112 corresponds, thereby indicating RF signal(s) 104. For example, in response to RF sensor 200a receiving the RF signal(s) 104 and RF sensor 200a and/or computer 300 classifying the RF source of the RF signal(s) 104 and/or determining the operating condition of the RF source, computer 300 may be configured to instruct RF sensor 200b to select digital samples having a time period of reception, frequency range, and/or power level of RF signal(s) 104 for locating the RF source. In some embodiments, computer 300 may be configured to perform localization iteratively, such as receiving RF characteristic data 112 from an RF sensor (e.g., 200a), localizing an RF source (e.g., using RF sensors 200a and 200b), and then localizing the RF source again (e.g., using the same and/or one or more alternative or additional RF sensors) to confirm and/or update the location of the RF source. For example, RF sensors may be chosen and instructed to select corresponding RF characteristic data for transmitting to computer 300 based on the location(s) of the RF sensors (e.g., in relation to an estimated location of the RF source and/or an RF sensor that detected an RF signal from the RF source). In some embodiments, computer 300 may be configured to select from among multiple localization results based on SNR of received RF signals and/or operating condition of the RF sensor(s) that received the RF signals.

It should be appreciated that RF characteristic data 112 in the examples of FIGS. 6 and 9 may vary depending on whether computer 300 is configured to classify the type of RF source that transmitted RF signal(s) 104, determine the operating condition of the RF source, and/or determine the location of the RF signals. For example, different RF characteristic data 112 may be used for each classification and/or regression. In some embodiments, trained models executed by RF sensors 200 may be configured to generate RF characteristic data 112 that may be used for each classification and/or regression described herein.

Figures 9B, 9C:
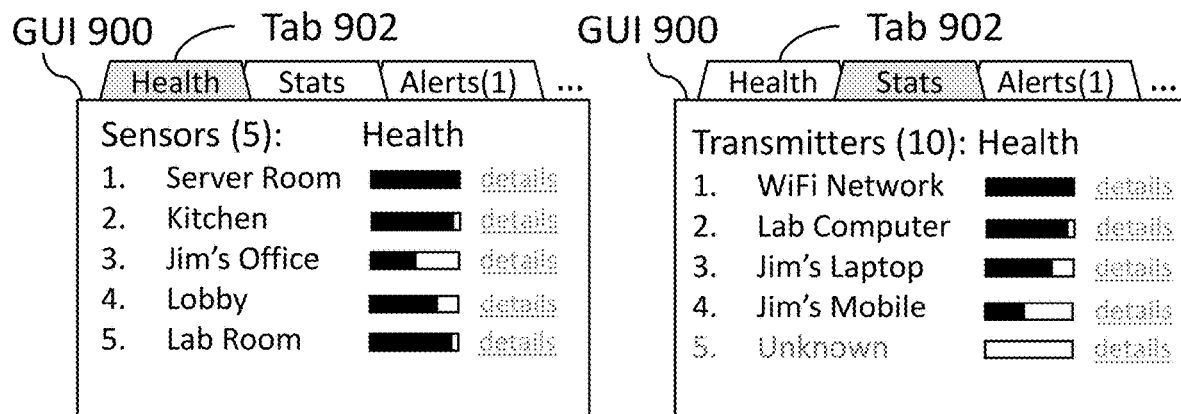
FIG. 9B is a first view of a graphical user interface (GUI) that may be displayed on the network-connected device of FIG. 9A, according to some embodiments.
FIG. 9C is a second view of the GUI of FIG. 9B, according to some embodiments.
Figure 9D:
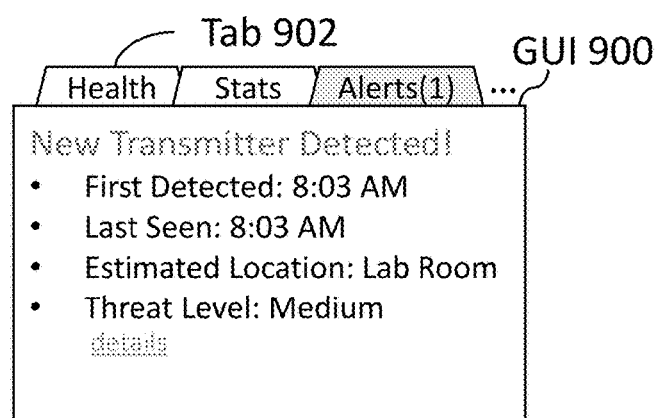
FIG. 9D is a third view of the GUI of FIG. 9B, according to some embodiments.

FIG. 9B is a first view of a graphical user interface (GUI) 900 that may be displayed by device 600, according to some embodiments. FIG. 9C is a second view of the GUI 900, according to some embodiments. FIG. 9D is a third view of the GUI 900, according to some embodiments.

In some embodiments, device 600 may be configured to display GUI 900 to a user to provide information about received RF signals, RF sources, and/or the locations and/or operating conditions of the RF sources. In some embodiments, GUI 900 may have multiple views, such as tabs 902 shown in FIGS. 9B-9D. For example, a user may switch between views (e.g., pages) by selecting from among tabs 902.

In some embodiments, a first view of GUI 900 may include an RF sensor operating condition page, such as the "Health" page shown in FIG. 9B. In FIG. 9B, the operating condition page includes a list of RF sensors 200 labeled by name (e.g., indicating location) and with a bar indicating the operating condition of each RF sensor 200. For example, the operating condition of each RF sensor 200 may be determined as a result of the RF sensor 200 detecting and/or failing to detect an RF signal known to be present (e.g., confirmed by another RF sensor 200). Alternatively or additionally, the RF sensor 200 may be configured to provide an SNR among RF characteristic data 112, from which the operating condition of the RF sensor 200 may be determined (e.g., with low SNR indicating a deviated operating condition of the RF sensor 200). In some embodiments, a user may access data for each RF sensor 200 (e.g., logs of received RF characteristic data and/or past operating condition determinations) by selecting the corresponding "details" link.

In some embodiments, a second view of GUI 900 may include an RF source page, such as the "Stats" page shown in FIG. 9C. In FIG. 9C, the RF source page includes a list of RF sources in the operating environment labeled by name (e.g., indicating the type of RF source) and with a bar indicating the operating condition of each RF source. For example, the operating condition of each RF source may be determined using RF characteristic data transmitted by the RF sensors 200. In some embodiments, the RF source tab may further identify RF sources detected in the operating environment that are not associated with the operating environment, such as the RF source labeled "Unknown" in FIG. 9C. In some embodiments, an RF source may be determined to be not associated with the operating environment based on a classification of the RF source by an RF sensor 200 and/or computer 300. In some embodiments, a user may access data for each RF source (e.g., logs of received RF characteristic data, past operating condition determinations, and/or location data) by selecting the corresponding "details" link.

In some embodiments, a third view of GUI 900 may include an alerts page, such as the "Alerts" page shown in FIG. 9D. In FIG. 9D, the alerts page includes a warning that a new RF source has been detected in the operating condition, as well as information about the new RF source that was detected. For example, following detection of an RF signal and classification of the RF source by RF sensor 200 and/or computer 300, GUI 900 may update the alerts page to list the new RF source and associated information. In this or another example, a user may be notified audio visually and/or by text message, email, and/or haptic alert. As shown in FIG. 9D, the alerts page may show a time the RF source was first detected and/or last seen, as well as a location of the RF source and a threat level of the RF source. For example, the location of the RF source may be classified (e.g., within a particular room as shown in FIG. 9D) and/or regressed (e.g., shown visually on a map of the operating environment). In some embodiments, a user may access data for the new RF source (e.g., logs of received RF characteristic data and/or past location data) by selecting the "details" link.

While a single RF source is shown on the alerts page in FIG. 9D, it should be appreciated that any number of detected RF sources may be shown on the alerts page.

In some embodiments, the threat level of the RF source may be determined based on a classification of the RF source. For example, a short-wave communications device (e.g., walkie talkie) may be classified as a low threat level (e.g., due to low risk of interference and/or hacking) whereas a cell phone and/or laptop may be classified as a medium threat level (e.g., due to medium risk of interference and/or hacking), and an RF jammer may be classified as a high threat level. In some embodiments, users may only be alerted of RF sources having a particular classification, such as a particular type of RF source and/or having at least a certain threat level. It should be appreciated that other methods of classifying RF sources by threat level may be used, depending on the particular application.

Figure 10:
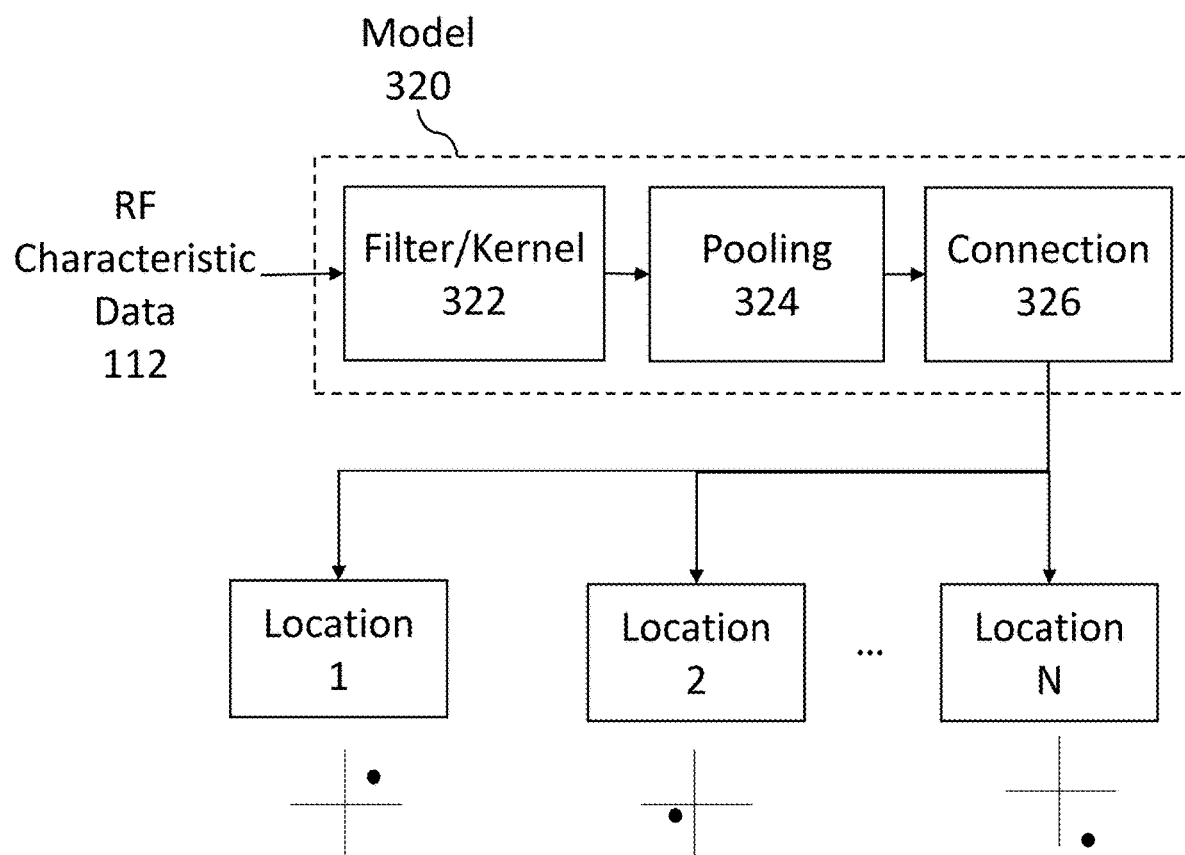
FIG. 10 is a block diagram of an example RF source localization model that may be executed by one or more processors of the computer of FIG. 9A, according to some embodiments.

FIG. 10 is a block diagram of an example RF source localization model 320 that may be executed by one or more processors 302 of computer 300, according to some embodiments. In some embodiments, model 320 may be configured to classify and/or regress the location of the RF source that transmitted RF signal(s) 104 using RF characteristic data 112. For example, as shown in FIG. 10, model 320 may include filter and/or kernel layers 322, pooling layers 324, and connection layers 326.

In some embodiments, filter and/or kernel layers 322 may include one or more weighted vectors for applying to (e.g., convolving with) RF characteristic data 112. For example, the filter and/or kernel layers 322 may be configured with weights set when training model 320 such that, when applied to RF characteristic data 112, the outputs of filter and/or kernel layers 322 indicate likely locations of the RF source of RF signal(s) 104 within the operating environment 102 of system 100, such as using the operating frequency, power level(s), and/or modulation characteristics of the RF signal(s) 104 indicated in the RF characteristic data 112. In some embodiments, the filter and/or kernel layers 322 may be applied to (e.g., convolved with) digital (e.g., time domain) samples of received RF radiation that include RF signal(s) 104, each indicating the power level of the RF signal(s) 104 at the sampled moment in time. Alternatively or additionally, in some embodiments the filter and/or kernel layers 322 may be applied to other portions of the RF characteristic data 112. In some embodiments, outputs from multiple filter and/or kernel layers 322 may be pooled using pooling layers 324 to highlight samples of RF signal(s) 104 and/or portions of RF characteristic data 112 that most indicate the location of the RF source of RF signal(s) 104.

In some embodiments, connection layers 326 may be configured to regress and/or classify the location of the RF source of RF signal(s) 104 based on outputs from pooling layers 324. For example, the connection layers 326 may be configured to apply a loss function, used to train the model 320, to the outputs from pooling layers 324 to predict the location (e.g., in a one, two, or three dimensional space) of the RF source of RF signal(s) 104. In some embodiments, connection layers 326 may be configured to output a confidence score for the regressed location output. In some embodiments, the predicted location may be projected onto a map of the operating environment 102 to obtain a predicted location of the RF source of RF signal(s) 104 in the operating environment 102. In some embodiments, connection layers 326 may be configured to apply a Euclidean distance loss function trained to minimize distance between the selected location and the actual location of the RF source. For example, the Euclidean distance loss function may result from training the model 320 to minimize the two-dimensional and/or three-dimensional distance between selected and labeled RF source locations. In some embodiments, connection layers 326 may be further configured to apply a function that increases loss non-linearly with distance, which may penalize larger distance errors more strongly than closer distance errors. Alternatively or additionally, connection layers 326 may be configured to apply a step function that applies constant penalties within concentric circles about labeled RF source locations, which may cause some selected locations having different distances to the labeled RF source locations to be equally penalized.

Alternatively or additionally, in some embodiments, the connection layers 326 may be configured to determine the location of the RF source of RF signal(s) 104 from among a plurality of locations, such as those locations the model 320 was trained to classify. In the example shown in FIG. 10, the plurality of locations may include locations 1-N. As shown, location 1 may be classified as located in the upper right quadrant of a two-dimensional space, location 2 may be classified as located in the lower left quadrant of the space, and location N may be classified as located in the lower right quadrant of the space. For instance, the quadrants of the two-dimensional space may correspond to different rooms within the operating environment 102. In some embodiments, locations 1-N may be classified more precisely than in quadrants, such as at the respective points within the quadrants as shown in FIG. 10. It should be appreciated that the locations illustrated herein are intended as examples and, according to various embodiments, model 320 may be configured to classify any locations of RF sources in suitable spaces.

Figure 11:
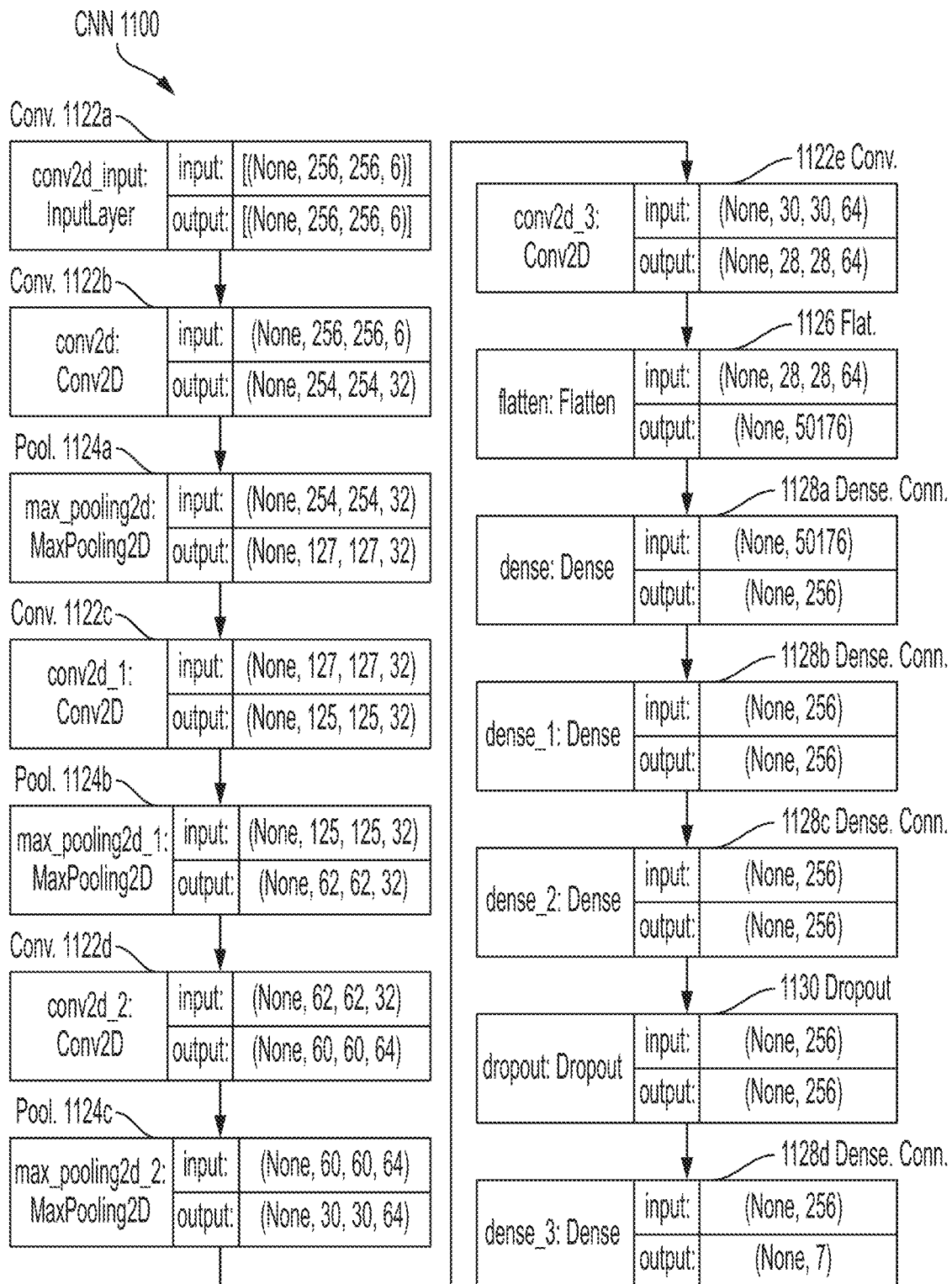
FIG. 11 is a block diagram of an example convolutional neural network (CNN) model that may be executed by one or more processors of the computer of FIG. 9A, according to some embodiments.

FIG. 11 is a block diagram of an example feed-forward convolutional neural network (CNN) model 1100 that may be executed by one or more processors 302 of computer 300, according to some embodiments. In some embodiments, model 1100 may be configured to classify and/or regress the location of the RF source that transmitted one or more RF signals based on RF characteristic data input to model 1100 indicating characteristics of the RF signal(s). As shown in FIG. 11, model 1100 may include filter and/or kernel layers such as convolution layers 1122a-e, pooling layers 1124a-c, and connection layers such as flattening layer 1126, densely connected layers 1128a-d, and dropout layer 1130.

As shown in FIG. 11, model 1100 may be configured to start with the first and second convolution layers 1122a and 1122b followed by the first pooling layer 1124a, then proceed sequentially to the third convolution layer 1122c and second pooling layer 1124b, the fourth convolution layer 1122d and the fourth pooling layer 1124c, and the fifth convolution layer 1122e. Also shown in FIG. 11, model 1100 may be configured to then proceed to the output layers, flattening layer 1126 followed sequentially by first, second, and third densely connected layers 1128a-c, dropout layer 1130, and fourth densely connected layer 1128d.

In some embodiments, convolution layers 1122a-e may be configured in the manner described herein for filter and/or kernel layers 322 including in connection with FIG. 10. For example convolution layers 1122a-e may be configured to apply vectors having weights set during training of model 1100 such that outputs of convolution layers 1122a-e indicate likely locations of the RF source of the RF signal(s).

In some embodiments, pooling layers 1124a-c may be configured in the manner described herein for pooling layers 324 including in connection with FIG. 10. For example, pooling layers 1124a-c may be configured as maximum pooling layers that output only portions output by convolution layers 1122a-d having maximum values. In FIG. 10, the first pooling layer 1124a is shown configured to pool an input having dimensions of 254×254×32 into an output having dimensions of 127×127×32, the second pooling layer 1124b is shown configured to pool an input having dimensions of 125×125×32 into an output having dimensions of 62×62×32, and the third pooling layer 1124c is shown configured to pool an input having dimensions of 60×60×64 into an output having dimensions of 30×30×64.

In some embodiments, flattening layer 1126 may be configured to convert the multidimensional vector output from the fifth convolution layer 1122e into a one dimensional output for densely connected layer 1128a. For example, in FIG. 11, flattening layer 1126 is shown configured to convert an input having dimensions of 28×28×64 to a one dimensional vector output having a size of 50,176. In some embodiments, densely-connected layers 1128a-d may be configured to output a one dimensional indication of the location of the RF source of the received RF signals. For example, in some embodiments, densely-connected layers 1128a-d may be configured to output a classification of the location of the RF source. Alternatively or additionally, in some embodiments, densely-connected layers 1128a-d may be configured to output a regressed prediction of the location of the RF source that may be projected onto a map of the operating environment 102 to locate the RF source. In some embodiments, dropout layer 1130 may be configured to randomly drop data from preceding layers, thereby approximating the outputs of multiple different model architectures during training of model 1100.

While Model 1100 is shown in FIG. 11 having an input size of 256×256×6 and an output size of 7, five convolution layers 1122a-e, and three pooling layers 1124a-c, it should be appreciated that models described herein may have any suitable input or output size, and any suitable number of convolution, pooling, and connection layers, as embodiments described herein are not so limited.

Figure 12A:
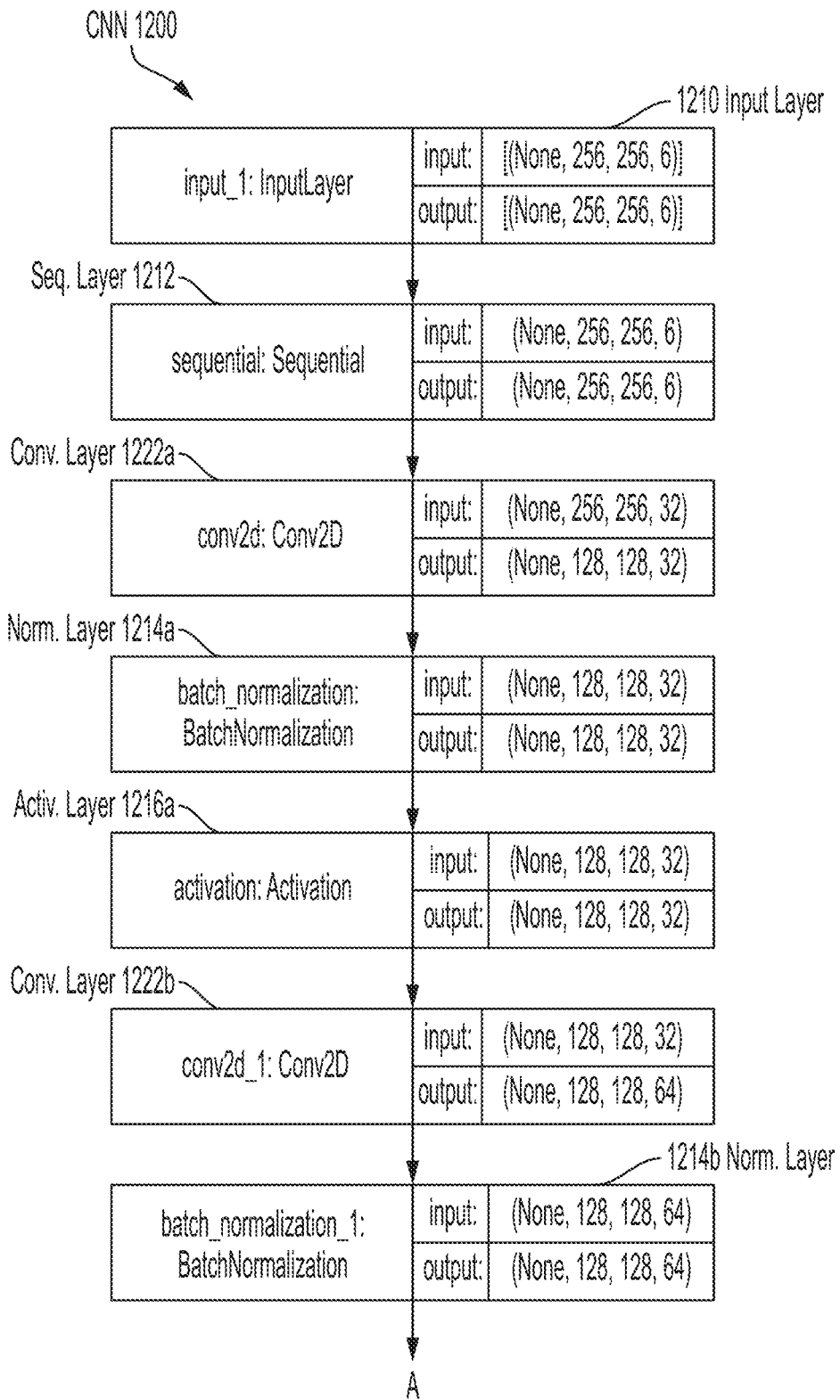
FIG. 12A is a block diagram of a first portion of an alternative example CNN model that may be executed by one or more processors of the computer of FIG. 9A, according to some embodiments.
Figure 12B:
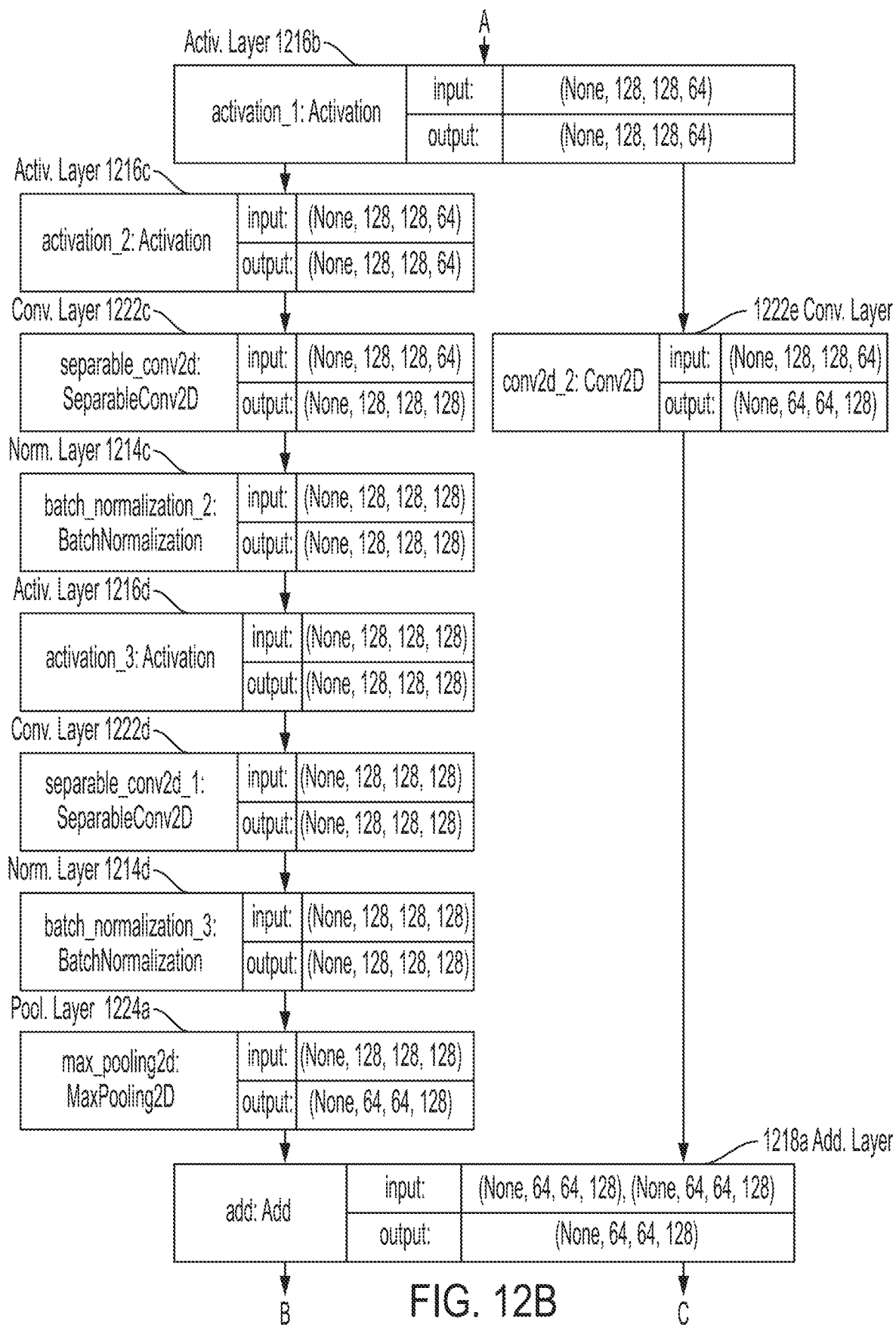
FIG. 12B is a block diagram of a second portion of the CNN model of FIG. 12A, according to some embodiments.
Figure 12C:
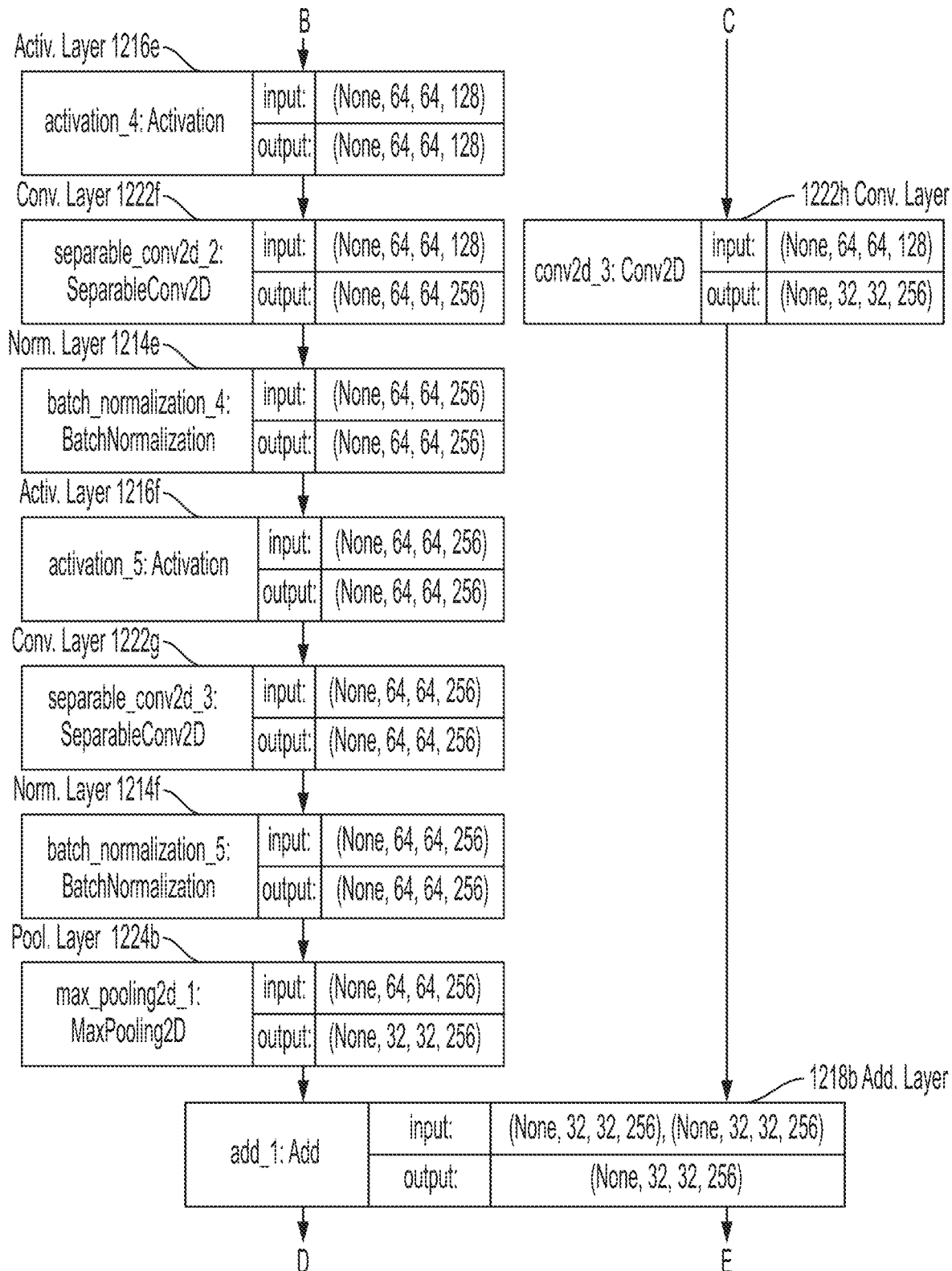
FIG. 12C is a block diagram of a third portion of the CNN model of FIG. 12A, according to some embodiments.
Figure 12D:
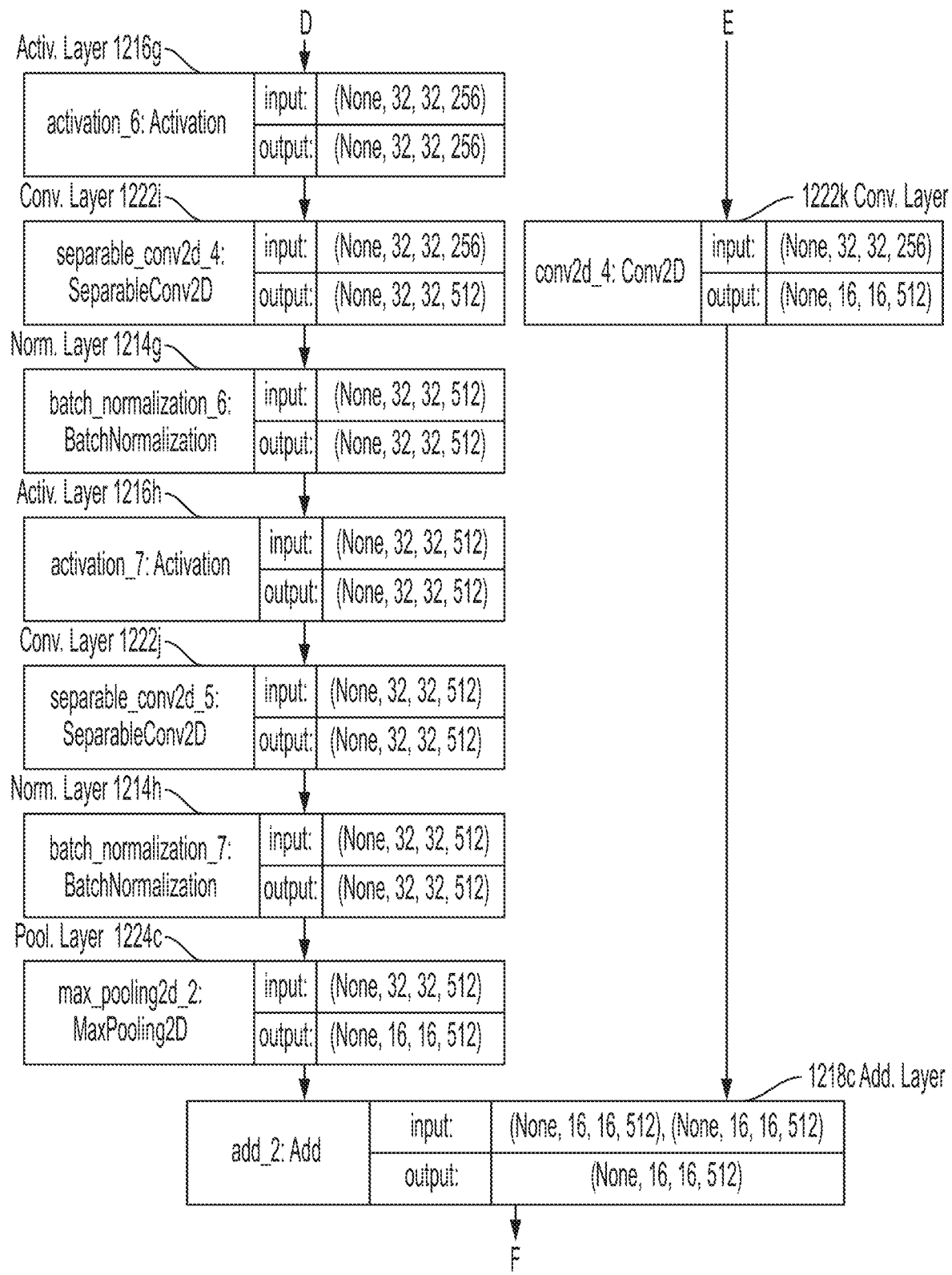
FIG. 12D is a block diagram of a fourth portion of the CNN model of FIG. 12A, according to some embodiments.
Figure 12E:
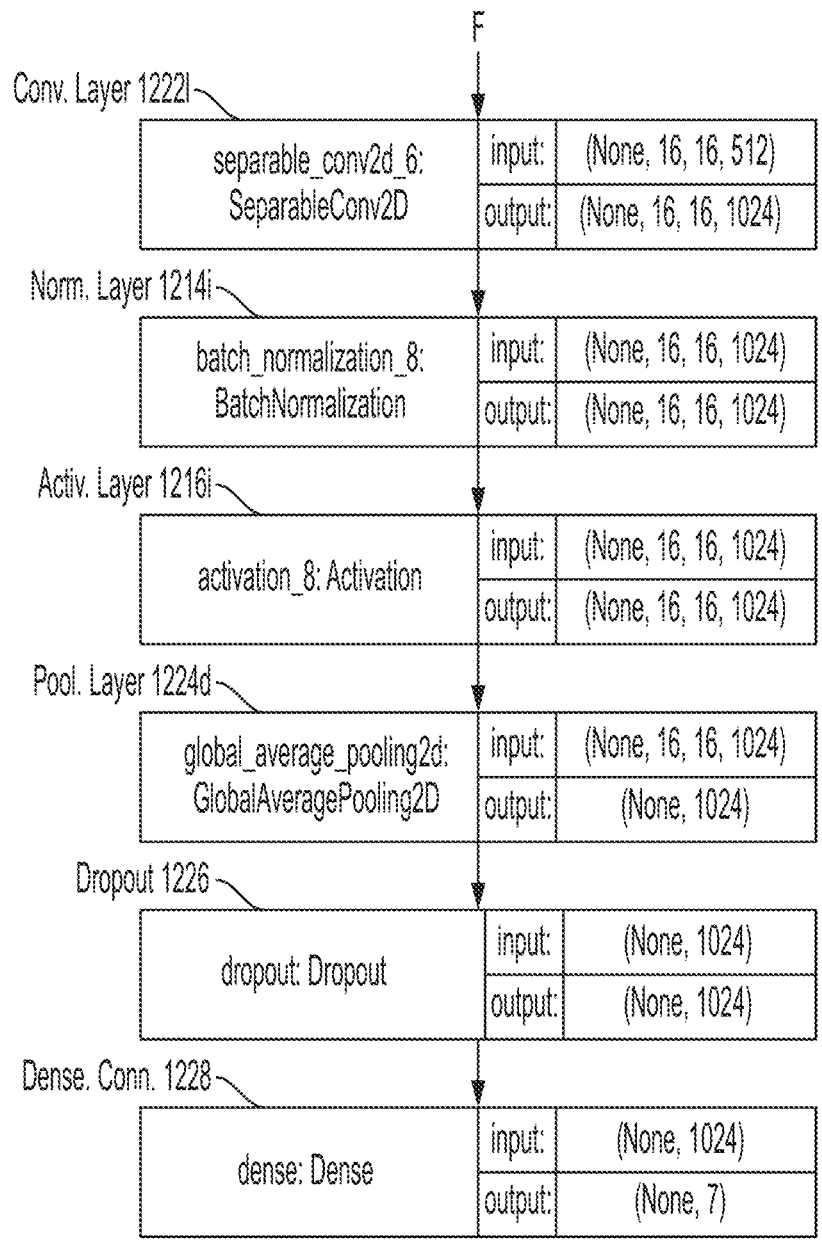
FIG. 12E is a block diagram of a fifth portion of the CNN model of FIG. 12A, according to some embodiments.

FIG. 12A is a block diagram of a first portion of an alternative example feed-forward CNN model 1200 that may be executed by one or more processors 302 of computer 300, according to some embodiments. FIG. 12B is a block diagram of a second portion of CNN model 1200, according to some embodiments. FIG. 12C is a block diagram of a third portion of CNN model 1200, according to some embodiments. FIG. 12D is a block diagram of a fourth portion of CNN model 1200, according to some embodiments. FIG. 12E is a block diagram of a fifth portion of CNN model 1200, according to some embodiments. In some embodiments, model 1200 may be configured to determine the location of an RF source of one or more RF signals, such as described herein for models 320 and 1100 including in connection with FIGS. 10-11.

The inventors recognized that feed-forward models, such as a feed-forward CNN may be advantageous for applications where a wide variety of RF signals and/or RF sources are present. In some embodiments, feedback models (e.g., RCNNs) may be alternatively or additionally used, such as for real-time detection and/or classification at high speed.

In some embodiments, model 1200 may include filter and/or kernel layers, such as convolution layers 1222a-1222l, which may be configured in the manner described herein for filter and/or kernel layers 322 and/or convolution layers 1122a-e. As shown in FIG. 12A, an input layer 1210 and a sequential layer 1212 may precede the first convolution layer 1222a, and a first normalization layer 1214a and activation layer 1216 may follow the first convolution layer 1222a. As shown in FIGS. 12A-12B, the second convolution layer 1222*b* may follow the first activation layer 1216*a*, and may be followed sequentially by a second normalization layer 1214*b* and a second activation layer 1216*b*.

As shown in FIG. 12B, model 1200 may be configured to split into two branches after the second activation layer 1216*b*, with the first branch proceeding to a third activation layer 1216*c*, the third convolution layer 1222*c*, a third normalization layer 1214*c*, a fourth activation layer 1216*d*, the fourth convolution layer 1222*d*, and a fourth normalization layer 1214*d*. Also shown in FIG. 12B, the first branch may terminate with a first pooling layer 1224*a*, which may be configured in the manner described herein for pooling layers 324 and/or 1124*a-c*, and the second branch may include a fifth convolution layer 1222*e* followed by a first addition layer 1218*a* that combines the fifth convolution layer 1222*e* output with the output from the first pooling layer 1224*a*.

As shown in FIG. 12C, model 1200 may be configured to split again into two branches following the first addition layer 1218*a*, with the first and second branches being configured in the manner described herein in connection with FIG. 12B. For example, as shown in FIG. 12C, the first branch may include, sequentially, a fifth activation layer 1216*e*, a sixth convolution layer 1222*f*, a fifth normalization layer 1214*e*, a sixth activation layer 1216*f*, a seventh convolution layer 1222*g*, a sixth normalization layer 1214*f*, and a second pooling layer 1224*b*, and the second branch may include an eighth convolution layer 1222. As shown in FIG. 12C, the first and second branches can terminate in a second addition layer 1218*b*.

As shown in FIG. 12D, model 1200 may be configured to split yet again into two branches following the second addition layer 1218*b*, with the first and second branches being configured in the manner described herein in connection with FIGS. 12B-12C. For example, as shown in FIG. 12D, the first branch may include, sequentially, a seventh activation layer 1216*g*, a ninth convolution layer 1222*i*, a seventh normalization layer 1214*g*, an eighth activation layer 1216*h*, a tenth convolution layer 1222*j*, an eighth normalization layer 1214*h*, and a third pooling layer 1224*c*, and the second branch may include an eleventh convolution layer 1222*k*. As shown in FIG. 12D, the first and second branches may terminate in a third addition layer 1218*c*.

As shown in FIG. 12E, model 1200 may conclude with a twelfth convolution layer 12221 followed sequentially by a ninth normalization layer 1214*i*, a ninth activation layer 1216*i*, and a fourth pooling layer 1224*d*. In some embodiments, model 1200 may include connection layers such as dropout layer 1226 and densely connected layer 1228, which may be configured in the manner described herein for dropout layer 1130 and densely connected layers 1128*a-d*.

In some embodiments, model 320, 1100, and/or 1200 may be trained using various RF signals transmitted by RF sources positioned in different locations within the operating environment 102, which may introduce reflections and/or attenuation due to the nature of the particular operating environment 102, thereby acclimating the model to locating the RF sources in the operating environment 102. In some embodiments, different types of RF sources having different frequencies, power levels, and/or modulation characteristics may be used to acclimate the model to locating various types of RF sources in the operating environment 102. In some embodiments, model 320, 1100, and/or 1200 may be trained using RF characteristic data generated based on real RF signals received in the operating environment 102, thereby simulating training model 310 on a large dataset of RF signals while only using data from a small number of real RF signals. In some embodiments, one or more RF sources may be carried by (e.g., mounted on) a vehicle moving around the operating environment with the location of the vehicle being recorded as training data for training the model(s). Alternatively or additionally, model 320, 1100, and/or 1200 may be trained using RF characteristic data generated based on simulated RF signals.

Figure 13:
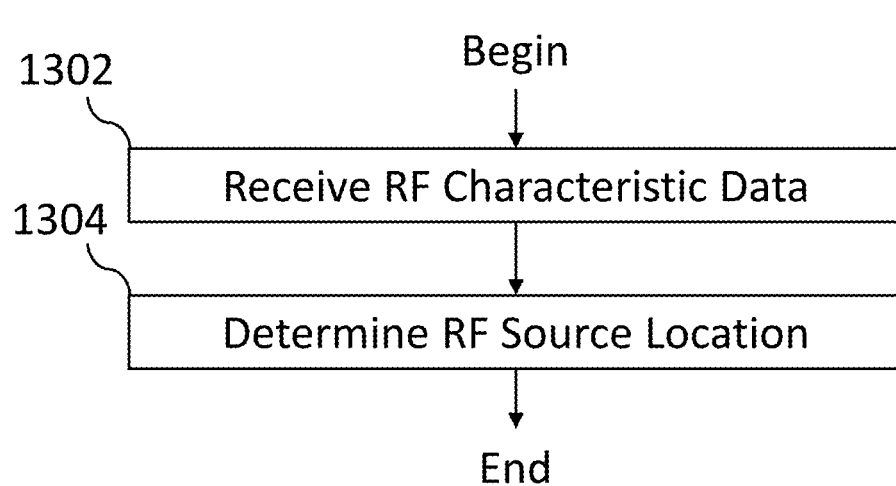
FIG. 13 is a flow diagram of an example method of RF source localization that may be performed using the computer of FIG. 9A, according to some embodiments.

FIG. 13 is a flow diagram of an example method 1300 of RF source localization that may be performed using computer 300, according to some embodiments. As shown in FIG. 13, method 1300 may include receiving RF characteristic data (e.g., RF characteristic data 112) at step 1302 indicating a received RF signal (e.g., RF signal 104) and determining the location of the RF source of the received RF signal at step 1304. For example, method 1300 may be performed using processor 302 of computer 300 using RF characteristic data 112 received from one or more RF sensors 200 positioned in the operating environment 102 of system 100.

In some embodiments, receiving the RF characteristic data at step 1302 may include receiving the RF characteristic data 112 at processor 302 of computer 300 from the RF sensor(s) 200 over communication network 400. For example, the RF characteristic data 112 may include outputs from a trained model executed onboard the RF sensor(s) 200, and/or digital samples of RF radiation received by the RF sensor(s) 200, such as described herein including in connection with method 500.

In some embodiments, determining the location of the RF source of the received RF signal at step 804 may include processor 302 of computer 300 executing a trained model and providing RF characteristic data 112 received at step 1302 as input to the trained model. For example, processor 302 may provide outputs from the trained model(s) executed onboard the RF sensor(s) 200 that received RF signal(s) 104, and/or digital samples of the received RF radiation generated by the RF sensor(s) 200, to the trained model executed by processor 302 as input(s). In some embodiments, the location of the RF source may be determined using the output of the trained model executed by processor 302, generated in response to providing the RF characteristic data 112 as an input. For example, processor 302 can execute model 320, 1100, and/or 1200, which may classify and/or regress the location of the RF source of RF signal(s) 104 using RF characteristic data 112 based on RF characteristic data from various RF sources used to train the model.

Figure 14:
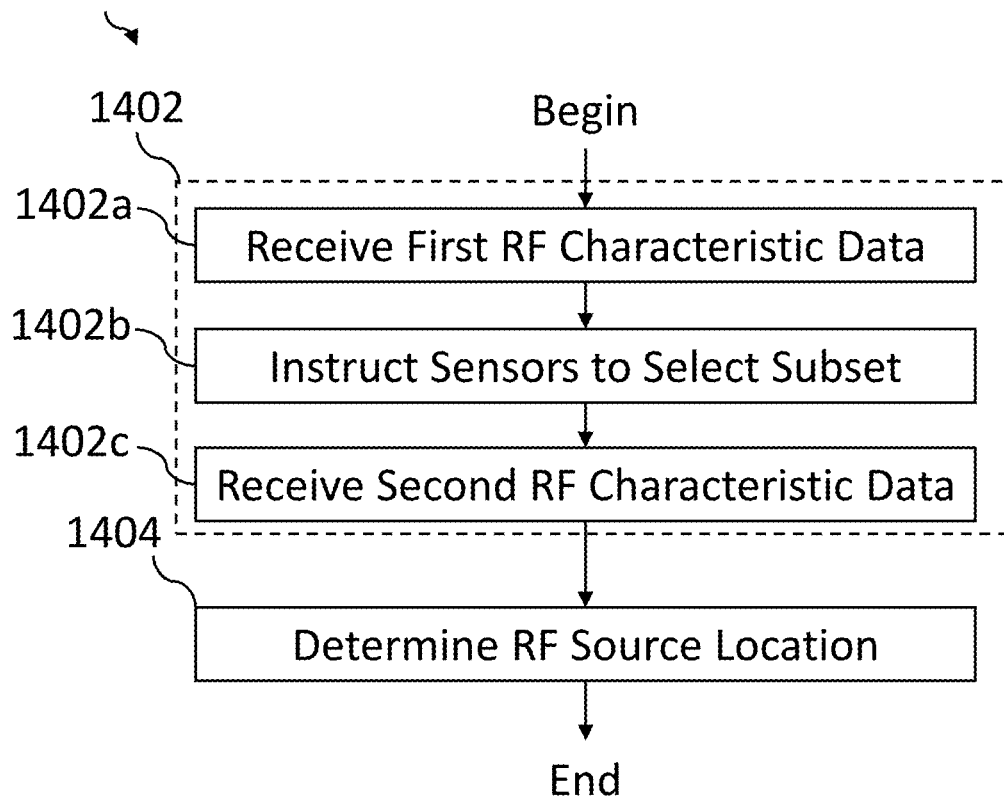
FIG. 14 is a flow diagram of an alternative example method of RF source localization that may be performed using the computer of FIG. 9A, according to some embodiments.

FIG. 14 is a flow diagram of an alternative example method 1400 of RF source localization that may be performed using computer 300, according to some embodiments. In some embodiments, method 1400 may be performed in the manner described herein for method 1300, such as by receiving RF characteristic data (e.g., RF characteristic data 112) at step 1402 indicating characteristics of received RF radiation, including an RF signal (e.g., RF signal 104), and determining the location of the RF source of the received RF signal at step 1404. Alternatively or additionally, in FIG. 14, receiving RF characteristic data at step 1402 may include receiving first RF characteristic data at sub-step 1402*a* indicating characteristics of received RF radiation including an RF signal, instructing one or more RF sensors to select a subset of RF radiation data corresponding to the RF signal at sub-step 1402*b*, and receiving second RF characteristic data at sub-step 1402*b* indicating characteristics of RF radiation including another received RF signal.

In some embodiments, receiving the first RF characteristic data at sub-step 1402*a* may include receiving, at the processor(s) 302 of computer 300 from a first RF sensor

200a over communication network 400, RF characteristic data 112 indicating characteristics of RF radiation received by the first RF sensor 200a. For example, the first RF sensor 200a may be configured to select digital samples corresponding to the time period of reception, frequency range, and/or power level of the RF signal 104 when receiving the RF radiation and may provide characteristics of the RF radiation (e.g., including the time period, frequency range, power level, and/or digital samples of the RF signal) to computer 300 in the first RF characteristic data 112.

In some embodiments, instructing the RF sensor(s) to select a subset of RF radiation data corresponding to the received RF signal at sub-step 1402b may include processor 302 instructing a second RF sensor 200b to select digital samples corresponding to the time period, frequency range, and/or power level of the RF signal indicated in the first RF characteristic data 112 received at sub-step 1402a. For example, processor 302 may send the instructions to the second RF sensor 200b in response to receiving the first RF characteristic data 112 and/or classifying the type of RF source that transmitted the received RF signal 104. In some embodiments, the instructions may override a predetermined selection of RF radiation criteria stored in the memory of the second RF sensor 200b. In some embodiments, the instructions may cause the second RF sensor 200b to transmit RF characteristic data corresponding to previously received RF radiation, such as received at the same and/or a similar time as when the first RF sensor 200a received the RF signal 104 (e.g., allowing for delays in propagation between the first and second RF sensors 200a and 200b).

In some embodiments, receiving the second RF characteristic data at sub-step 1402c may include receiving, at the processor(s) 302 of computer 300 from the second RF sensor 200b over communication network 400, RF characteristic data 112 indicating characteristics of RF radiation received by the second RF sensor 200b including the RF signal 104. For example, computer 300 may proceed to step 1404 to determine the location of the RF source of the RF signal 104 using the first and second RF characteristic data received at sub-steps 1402a and 1402c.

Figure 15:
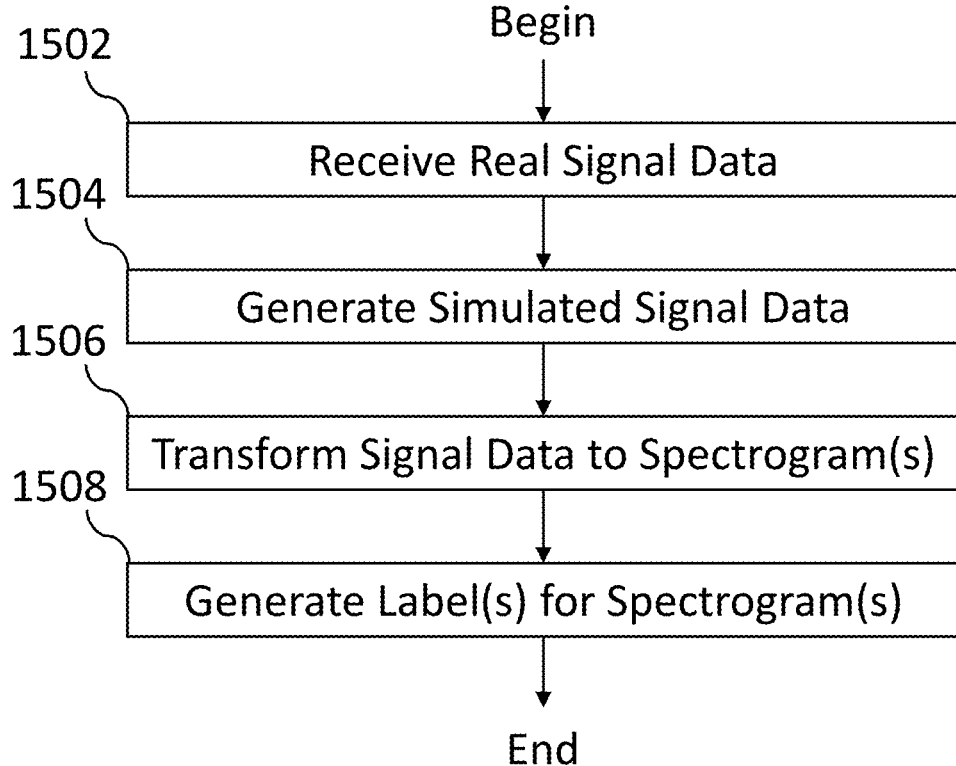
FIG. 15 is a flow diagram of an example method of generating RF radiation and/or characteristic data for training a model, according to some embodiments.

FIG. 15 is a flow diagram of an example method 1500 of generating RF radiation and/or characteristic data for training one or more trained models, according to some embodiments. In some embodiments, method 1500 may be performed by one or more processors described herein, and/or by a computer separate from system 100 (e.g., as a calibration step prior to deploying system 100 for use in the operating environment 102). As shown in FIG. 15, method 1500 may include receiving real signal data at step 1502, generating simulated signal data using the real signal data at step 1504, transforming the signal data to one or more spectrograms at step 1506, and generating one or more labels for the spectrogram(s) at step 1508. In some embodiments, RF radiation and/or characteristic data generated by method 1500 may be used as RF radiation data for training model 270 and/or as RF characteristic data for training any or each of models 310, 320, 1100, and 1200.

In some embodiments, receiving the real signal data at step 1502 may include the processor(s) receiving the signal data based on one or more RF signals received by an RF sensor 200. For example, the signal data may include digital samples of received RF radiation, time-frequency representations (e.g., spectrograms), and/or other data that indicates characteristics of the received RF signal(s). In some embodiments, the RF signal(s) may be received by the RF sensor 200 while the RF sensor 200 is located in the operating environment 102. For example, the RF signal(s) may be transmitted using one or more transmitters located in the operating environment 102. Alternatively or additionally, the RF signal(s) may be received by a different RF sensor 200. In some embodiments, step 1502 may include RF sensors 200 receiving and digitally sampling RF radiation (e.g., targeting a plurality of frequencies and/or using a plurality of polarizations and/or antenna orientations) to generate a set of real signal data from which to generate simulated signal data at step 1504.

In some embodiments, generating simulated signal data at step 1504 may include the processor(s) generating the simulated signal data based on the real signal data received at step 1502. For example, the processor(s) may generate versions of the real signal data that differ from the real signal data in certain predefined characteristics, such as power level, SNR, frequency, and/or time. In this example, the processor(s) may receive configuration data indicating the predefined characteristics of the real signal data to vary to generate the simulated signal data such that the simulated signal data shares qualities of the real signal data that are useful for training models described herein. In some embodiments, the configuration data may include a total number of simulated signals for which to generate simulated signal data (e.g., at least 5,000, 10,000, or 50,000 signals). In some embodiments, the configuration data may include a number of signals to include in each unit of simulated data (e.g., corresponding to a single spectrogram generated at step 1506). For example, units of simulated data may include no signals (e.g., only noise), one signal, or multiple signals. In the example of simulated data that does not include any signals, the configuration data may include a preset power level at the noise floor. According to various embodiments, the configuration data may include a modulation type, power level (e.g., relative to the noise floor), frequency bandwidth, and/or timing (e.g., portion of a sampled time period during which the signal is present) of each signal. In some embodiments, step 1504 may include randomly selecting combinations from the configuration data to generate the simulated signal data.

In some embodiments, generating simulated signal data 1504 may be performed using a trained model, such as by providing real signal data to the trained model, and the trained model outputting simulated signal data sharing at least some characteristics of the real signal data. For example, a generative adversarial network (GAN) and/or a deep convolutional GAN (DCGAN) model may be used.

In some embodiments, transforming the simulated signal data to spectrogram(s) at step 1506 may include performing a DFT on the simulated signal data to obtain power spectral density data of the simulated signal data over different frequencies, from which the processor(s) may obtain the spectrograms. It should be appreciated that some embodiments generate the simulated signal data at step 1504 as one or more spectrograms, such as based on spectrograms of one or more real RF signals.

In some embodiments, generating the label(s) for the spectrogram(s) at step 1508 may include generating an output for a trained model to be used to train the model using the spectrograms. For example, to train a model to detect the presence of the RF signal(s), the label(s) may indicate which time and/or frequency components of the spectrogram(s) correspond to the RF signal(s). As another example, to train a model to classify the type of RF source that transmitted the RF signal(s), the label(s) may indicate which type of RF source transmitted the RF signal(s) in the spectrogram(s). Similarly, to train a model to locate the RF source that transmitted the RF signal(s), the label(s) may indicate the location of the RF source in the operating environment 102.

While method 1500 is shown in FIG. 15 including receiving real signal data at step 1502, it should be appreciated that some embodiments may include receiving simulated rather than real signal data at step 1502. For example, the simulated signal data may include one or more simulated RF signals having characteristics in common with real RF signals, such as having an operating frequency (e.g., center frequency, lowermost and/or uppermost frequency, etc.) and/or modulation type. In this example, the simulated RF signals may be capable of labeling as described herein for step 1508, such that generating additional simulated signal data at step 1504 results in a large dataset of simulated RF signals based on only a small number of simulated RF signals.

In some embodiments, a non-transitory computer-readable medium may be encoded with instructions thereon that, when executed by at least one processor (e.g., processor 302), cause the processor(s) to execute method 1400 and/or method 1500.

Figure 16:
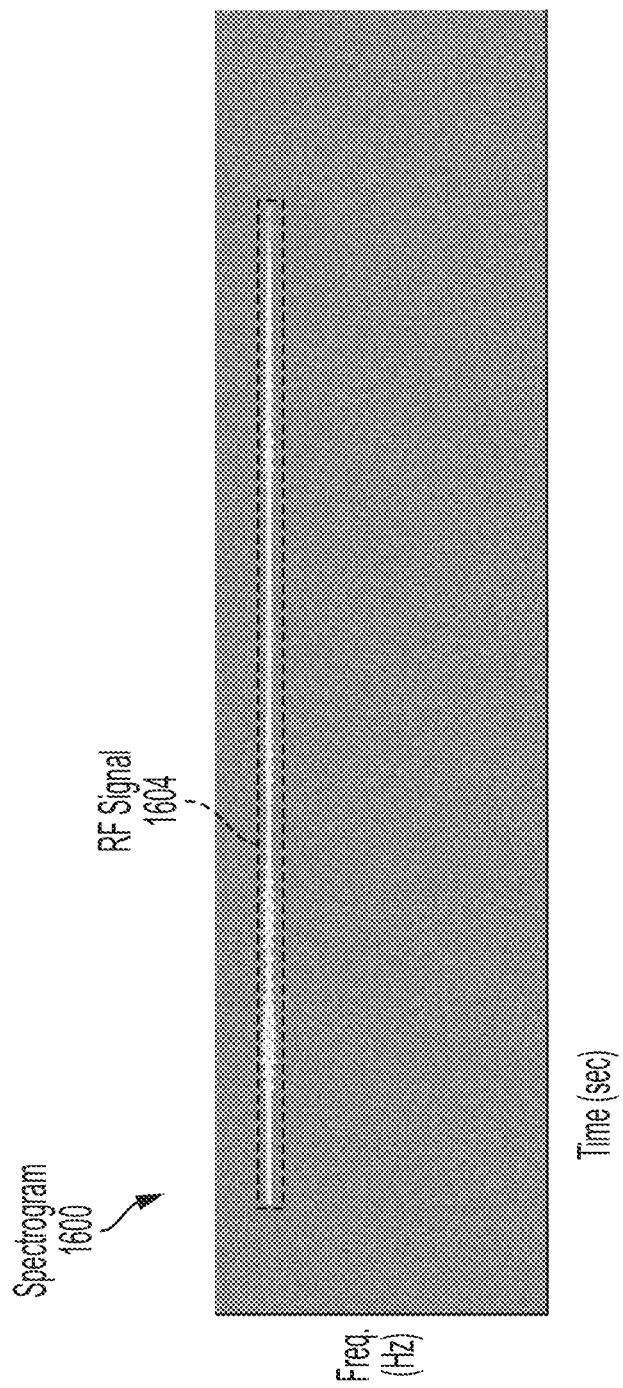
FIG. 16 is a spectrogram of a first example of RF radiation data that may be generated using the method of FIG. 15, according to some embodiments.

FIG. 16 is a spectrogram 1600 of a first example of RF radiation data that may be generated using method 1500, according to some embodiments. For example, spectrogram 1600 may be generated at step 1504 or 1506 and/or output at step 1508 of method 1500. As shown in FIG. 16, spectrogram 1600 includes RF signal 1604, which is bounded by a broken line. In some embodiments, the broken line bounding RF signal 1604 in FIG. 16 may be output as a label for training a model to detect the presence of RF signal 1604 in spectrogram 1600.

Figure 17:
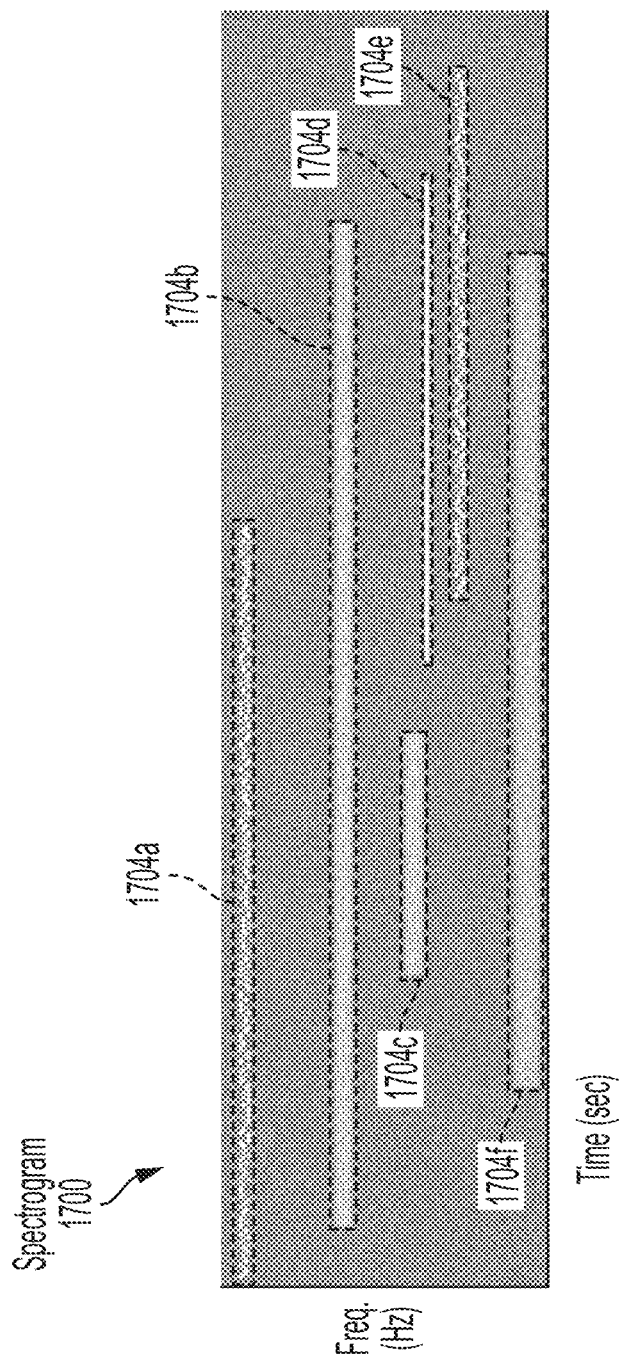
FIG. 17 is a spectrogram of a second example of RF radiation data that may be generated using the method of FIG. 15, according to some embodiments.

FIG. 17 is a spectrogram 1700 of a second example of RF radiation data that may be generated using method 1500, according to some embodiments. For example, spectrogram 1700 may be generated at step 1504 or 1506 and/or output at step 1508 of method 1500. As shown in FIG. 17, spectrogram 1700 includes multiple RF signals 1704*a*, 1704*b*, 1704*c*, 1704*d*, 1704*e*, and 1704*f*, each of which is bounded by a respective broken line. In some embodiments, the broken lines bounding each or some of RF signals 1704*a-f* may be output as a label for training a model to detect the presence of the respective RF signal 1704*a-f* in spectrogram 1700.

Figure 18:
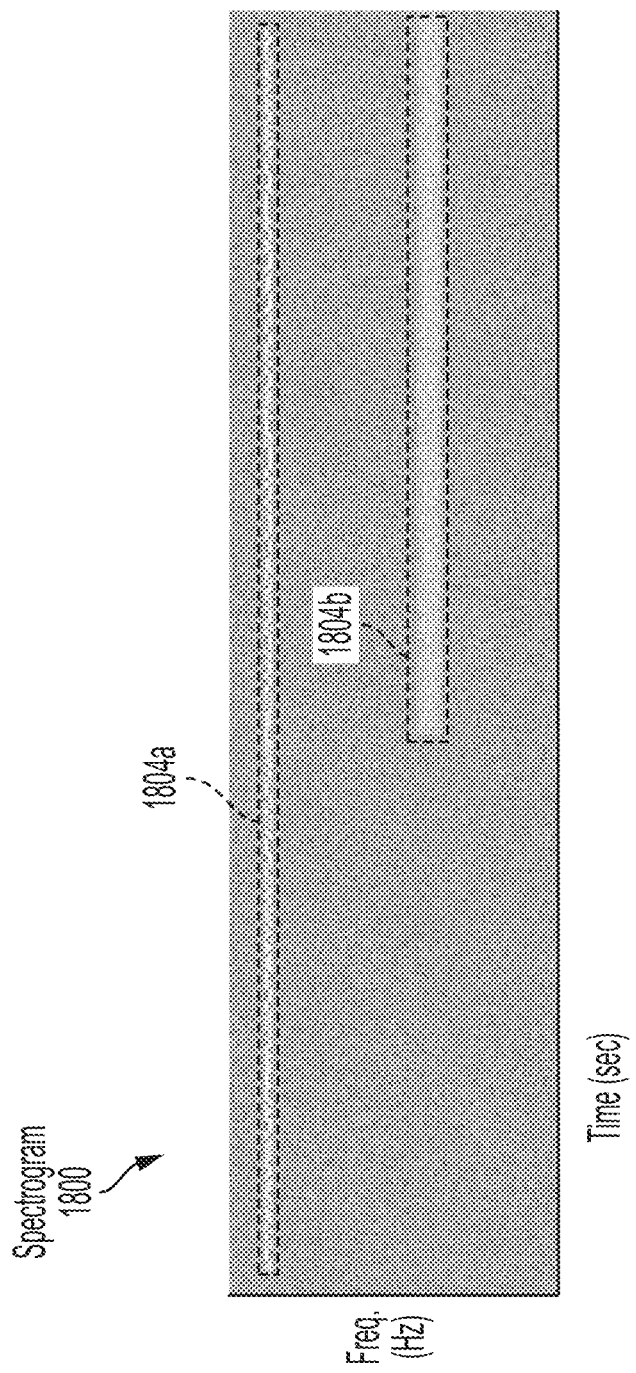
FIG. 18 is a spectrogram of a third example of RF radiation data that may be generated using the method of FIG. 15, according to some embodiments.

FIG. 18 is a spectrogram 1800 of a third example of RF radiation data that may be generated using method 1500, according to some embodiments. For example, spectrogram 1800 may be generated at step 1504 or 1506 and/or output at step 508 of method 1500. As shown in FIG. 18, spectrogram 1800 includes multiple RF signals 1804*a* and 1804*b*, each bounded by a respective broken line. In some embodiments, the broken line bounding RF signal 1804*a* and/or 1804*b* may be output as a label for training a model to detect the presence of the respective RF signal 1804*a* or 1804*b* in spectrogram 1800.

It should be appreciated that, while method 1500 is described herein generating one or more spectrograms for training a model, other training data may be generated for training a model such as other time-frequency representations, power spectral density data over different frequencies, and/or digital samples in the time and/or frequency domain.

VI. Example Configurations

In a first example configuration, an RF signal determination system comprises a first RF sensor, comprising a first RF antenna and at least one first processor operatively coupled to a first memory and configured to select, from among first RF radiation data indicating first RF radiation received by the first RF antenna, a first subset of the first RF radiation data and transmit, over a communication network, first RF characteristic data indicating the first subset of the first RF radiation data. The RF signal determination system further comprises a second RF sensor, comprising a second RF antenna and at least one second processor operatively coupled to a second memory and configured to select, from among second RF radiation data indicating second RF radiation received by the second RF antenna, a second subset of the second RF radiation data and transmit, over the communication network, second RF characteristic data indicating the second subset of the second RF radiation data.

In some embodiments, the first RF radiation data comprises first digital samples, the first subset of the first RF radiation comprises a first subset of the first digital samples, the second RF radiation data comprises second digital samples, and the second subset of the second RF radiation data comprises a second subset of the second digital samples. In some embodiments, the first digital samples and/or the second digital samples comprise spectrally filtered samples. In some embodiments, the first digital samples and/or the second digital samples comprise in-phase and/or quadrature (I/Q) samples. In some embodiments, the first digital samples and/or the second digital samples comprise demodulated samples.

In some embodiments, the first subset of the first digital samples corresponds to a first time period, frequency range, and/or power level, and the second subset of the second digital samples corresponds to a second time period, frequency range, and/or power level. In some embodiments, the at least one first processor is configured to select the first subset of the first digital samples according to first predetermined RF radiation selection criteria stored in the first memory, and the at least one second processor is configured to select the second subset of the second digital samples according to second predetermined RF radiation selection criteria stored in the second memory. In some embodiments, the first RF antenna is configured to receive the first RF radiation, at least in part, at a same time the second RF antenna is configured to receive the second RF radiation.

In some embodiments, the first subset of the first digital samples and the second subset of the digital samples correspond to a same time period, frequency range, and/or power level. In some embodiments, the at least one first processor is configured to select the first subset of the first digital samples in response to receiving a first command over the communication network, and/or the at least one second processor is configured to select the second subset of the second digital samples in response to receiving a second command over the communication network.

In some embodiments, the at least one first processor is configured to input the first digital samples to a trained model, identify, based on an output from the trained model generated in response to receiving the first digital samples as an input, the first subset of the first digital samples as indicating an RF signal among the first RF radiation, and select the first subset of the first digital samples in response to identifying the first subset of the first digital samples as indicating the RF signal. In some embodiments, the at least one second processor is configured to select the second subset of the second digital samples according to predetermined RF radiation selection criteria stored in the second memory.

In some embodiments, the second subset of the second digital samples comprises a larger quantity of data than the first subset of the first digital samples. In some embodiments, the at least one first processor is configured to transmit the first RF characteristic data over the communication network at a higher data rate than the at least one second processor is configured to transmit the second RF characteristic data over the communication network. In some embodiments, the first RF sensor further comprises a first software-defined radio (SDR) configured to provide the first digital samples, and the second RF sensor further comprises a second SDR configured to provide the second digital samples, and the first SDR is configured to provide the first digital samples at a faster sampling rate than the second SDR is configured to provide the second digital samples.

In some embodiments, the at least one first processor comprises a field programmable gate array (FPGA), graphical processing unit (GPU), and/or application specific integrated circuit (ASIC) configured to select the first subset of the first digital samples and a general purpose processor configured to transmit the first RF characteristic data over the communication network. In some embodiments, the at least one first processor is configured to process the first digital samples at a faster processing rate than the at least one second processor is configured to process the second digital samples.

In some embodiments, the first RF sensor further comprises a first battery configured to provide power for operating the first RF sensor and the second RF sensor further comprises a second battery configured to provide power for operating the second RF sensor.

In a second example configuration, an RF signal classification system comprises at least one RF sensor configured to receive RF radiation from an operating environment and at least one processor operatively coupled to a memory and configured to classify an RF source of an RF signal among the RF radiation based on an output from a trained model, the output generated by the trained model in response to receiving RF characteristic data indicating characteristics of the RF radiation as an input, determine, based on an RF source class of the RF source, whether the RF source is among a plurality of known RF sources associated with the operating environment, and in response to determining that the RF source is not among the plurality of RF sources associated with the operating environment, notify at least one device that the RF source is present in the operating environment.

In some embodiments, the RF characteristic data comprises digital samples of the RF radiation. In some embodiments, the RF characteristic data comprises a spectrogram of the digital samples of the RF radiation. In some embodiments, the RF characteristic data comprises an indication of a time period of reception, frequency range, and/or power level of the RF radiation.

In some embodiments, the trained model comprises a trained statistical classifier (TSC) configured to classify the RF source from among a plurality of RF source classes. In some embodiments, the TSC comprises a convolutional neural network.

In some embodiments, the at least one RF sensor comprises a first RF sensor and a second RF sensor, the first RF sensor configured to receive the RF radiation and generate the RF characteristic data indicating, at least in part, a time period of reception, power level, and/or frequency range of the RF signal, the at least one processor is further configured to, in response to classifying the RF source, send instructions to the second RF sensor that cause the second RF sensor to provide RF characteristic data indicating, at least in part, at least one of the time period of reception, power level, and/or frequency range of the RF signal.

In some embodiments, the at least one processor is configured to send the instructions to the second RF sensor to override the second RF sensor from scanning a predetermined frequency range. In some embodiments, the at least one processor is configured to send the instructions to the second RF sensor based on a location of the second RF sensor. In some embodiments, the at least one processor is configured to send the instructions to the second RF sensor based on a time period of reception, power level, and/or frequency range of RF radiation previously received by the second RF sensor.

In some embodiments, the at least one RF sensor comprises a first processor of the at least one processor, the first processor is configured to detect the RF signal among the RF radiation received by the at least one RF sensor and transmit the RF characteristic data, over a communication network, to a second processor of the at least one processor, and the second processor is configured to classify the RF source of the RF signal.

In some embodiments, the at least one RF sensor comprises a first processor of the at least one processor, the first processor is configured to transmit the RF characteristic data, over a communication network, to a second processor of the at least one processor, and the second processor is configured to detect the RF signal among the RF radiation received by the at least one RF sensor and classify the RF source of the RF signal.

In a third example configuration, an RF source localization system comprises a processor operatively coupled to a memory and configured to receive RF characteristic data from first and second RF sensors over a communication network, the RF characteristic data indicating characteristics of RF radiation received at the first and second RF sensors and determine a location of an RF source of an RF signal present in the RF radiation based on an output from a trained model, wherein the output of the trained model is generated in response to providing the RF characteristic data as an input to the trained model.

In some embodiments, the trained model comprises a trained statistical classifier (TSC) configured to classify the location of the RF source from among a plurality of locations. In some embodiments, the TSC is configured to classify the location of the RF source based on power levels of the RF radiation received at the first and second RF sensors.

In some embodiments, the trained model comprises a trained regression model configured to output an indication of the location of the RF source.

In some embodiments, the first RF sensor is positioned in a first location, the second RF sensor is positioned in a second location different from the first location, and the RF characteristic data identifies the first and second RF sensors.

In some embodiments, the RF characteristic data comprises first RF characteristic data indicating characteristics of RF radiation received at the first RF sensor and second RF characteristic data indicating characteristics of second RF radiation received at the second RF sensor and the processor is further configured to, in response to receiving the first RF characteristic data from the first RF sensor, send instructions to the second RF sensors that causes the second RF sensor to provide the second RF characteristic data.

In some embodiments, the RF source localization system further comprises the first and second RF sensors, wherein at least one of the first and second RF sensors is configured to detect the RF signals among the RF radiation received at the first and second RF sensors and provide the RF characteristic data to the processor. In some embodiments, the RF radiation has a frequency greater than or equal to 1 megahertz (MHz), and wherein the first and second RF sensors comprise software defined radios (SDRs) configured to digitally sample the RF radiation at a digital sampling rate that is less than 50 million samples per second (Msamp/sec). In some embodiments, the processor is configured to determine the location of the RF source based on the RF characteristic data even when the first and second RF sensors have respective first and second reference clocks that are offset in time by more than 100 nanoseconds (ns) from one another.

In some embodiments, the processor is further configured to classify the RF source of the RF signals from among a plurality of RF sources.

In a fourth example configuration, an RF signal determination system comprises a processor operatively coupled to a memory and configured to receive RF characteristic data indicating characteristics of RF radiation received at an RF sensor, input the RF characteristic data to at least one trained feed-forward model, and based on an output from the at least one trained feed-forward model, perform at least one of: (1) detecting at least one RF signal among the RF radiation; (2) classifying, among a plurality of RF sources, an RF source of at least one RF signal that is present among the RF radiation; and/or (3) determining a location of an RF source of at least one RF signal that is present among the RF radiation.

In some embodiments, the at least one trained feed-forward model comprises a feed-forward convolutional neural network (CNN).

In some embodiments, the RF signal determination system comprises the RF sensor, and the RF sensor comprises the processor, an RF antenna configured to receive the RF radiation, and a software-defined radio (SDR) configured to receive the RF radiation from the RF antenna and provide the RF characteristic data to the processor, the RF characteristic data comprising digital samples of the RF radiation.

In some embodiments, the RF signal determination system comprises the RF sensor, and the RF sensor comprises an RF antenna configured to receive the RF radiation, an SDR configured to receive the RF radiation from the RF antenna and generate the RF characteristic data comprising digital samples of the RF radiation, and a second processor configured to transmit the RF characteristic data to the processor over a communication network.

In some embodiments, the digital samples comprise spectrally filtered samples. In some embodiments, the digital samples comprise in-phase and/or quadrature (I/Q) samples. In some embodiments, the digital samples comprise demodulated samples.

In a fifth example configuration, an RF signal determination system comprises a processor operatively coupled to a memory and configured to generate, using RF radiation data corresponding to RF radiation received by at least one RF sensor, simulated RF signal data. The processor is further configured to train at least one model, using the simulated RF signal data, to perform at least one of: detecting an RF signal among the simulated RF signal data; classifying an RF source of an RF signal among the RF signal data; and/or determining whether an operating condition of an RF source of an RF signal among the RF signal data has deviated from a predetermined operating condition.

In some embodiments, the RF radiation data comprises digital samples of the RF radiation. In some embodiments, the RF radiation data comprises a spectrogram of the RF radiation. In some embodiments, the simulated RF signal data comprises a spectrogram. In some embodiments, the RF signal determination system further comprises an RF sensor that comprises the processor and an RF antenna configured to receive the RF radiation and provide the RF radiation data to the processor. In some embodiments, the RF sensor further comprises an SDR configured to digitally sample the RF radiation and provide digital samples of the RF radiation to the processor.

In some embodiments, the RF signal determination system further comprises an RF sensor comprising an RF antenna configured to receive the RF radiation and a processor configured to generate and transmit the RF radiation data to the processor over a communication network.

In some embodiments, the processor is configured to generate the simulated RF signal data by providing the RF radiation data to a trained model configured to output the simulated RF signal data in response to receiving the RF radiation data as an input. In some embodiments, the trained model is trained to output the simulated RF signal data having a time period of reception, frequency range, power level, and/or signal-to-noise ratio (SNR) based on a time period of reception, frequency range, power level, and/or SNR of at least one signal in the RF radiation data. In some embodiments, the trained model includes a generative adversarial network (GAN). In some embodiments, the trained model includes a deep convolutional GAN (DC-GAN).

In some embodiments, the processor is configured to train the at least one model by labeling the simulated RF signal data as including an RF signal, including an RF signal from a labeled class of RF source, and/or including an RF signal from an RF source having a labeled operating condition.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments may be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media may be transportable, such that the program or programs stored thereon may be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices may be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A radio-frequency (RF) sensor, comprising:
    an RF antenna; and
    a processor operatively coupled to a memory, the processor configured to:
        receive digital samples of RF radiation received via the RF antenna;
        select, from among RF radiation data indicating the RF radiation received via the RF antenna, a subset of the RF radiation data, wherein the processor is configured to select a subset of the digital samples; and
        transmit, over a communication network, RF characteristic data indicating the subset of the RF radiation data, wherein the processor is configured to transmit the subset of the digital samples over the communication network.

2. The RF sensor of claim 1, wherein the digital samples comprise demodulated samples.

3. The RF sensor of claim 1, wherein the processor is configured to select the subset of the digital samples based on a time period of reception of the subset of the digital samples.

4. The RF sensor of claim 1, wherein the processor is configured to select the subset of the digital samples based on a frequency range of the subset of the digital samples.

5. The RF sensor of claim 1, wherein the processor is configured to select the subset of the digital samples based on a power level of the subset of the digital samples.

6. The RF sensor of claim 1, wherein the processor is configured to select the subset of the digital samples based on instructions, received over the communication network, indicating a time period of reception, frequency range, and/or power level for selection.

7. An RF signal determination system, comprising:
    the RF sensor of claim 6; and
    a second processor operatively coupled to a second memory, the second processor configured to:
        send, over the communication network to the RF sensor, the instructions indicating the time period of reception, frequency range, and/or power level for selection;
        receive, over the communication network from the RF sensor, the subset of the digital samples; and
        detect, among the subset of the digital samples, an RF signal.

8. The RF sensor of claim 1, wherein the processor is configured to:
    input the digital samples of the RF radiation to a trained model;
    identify, based on an output from the trained model generated in response to receiving the digital samples as an input, the subset of the digital samples as indicating an RF signal among the RF radiation; and
    select the subset of the digital samples in response to identifying the subset of the digital samples as indicating the RF signal.

9. The RF sensor of claim 8, wherein the processor is configured to identify the subset of the digital samples based on a time period of reception, frequency range, and/or power level of the digital samples indicated in the output of the trained model.

10. A method, comprising:
    receiving, by a processor of a radio-frequency (RF) sensor, digital samples of RF radiation received via an RF antenna of the RF sensor;
    selecting, by the processor, from among RF radiation data indicating the RF radiation received via the RF antenna of the RF sensor, a subset of the RF radiation data, wherein selecting the subset of the RF radiation data comprises selecting a subset of the digital samples; and
    transmitting, over a communication network, RF characteristic data indicating the subset of the RF radiation data, wherein transmitting the RF characteristic data comprises transmitting the subset of the digital samples.

11. The method of claim 10, wherein the digital samples comprise demodulated samples.

12. The method of claim 10, wherein selecting the subset of the digital samples is based on a time period of reception of the subset of the digital samples.

13. The method of claim 10, wherein selecting the subset of the digital samples is based on a frequency range of the subset of the digital samples.

14. The method of claim 10, wherein selecting the subset of the digital samples is based on a power level of the subset of the digital samples.

15. The method of claim 10, further comprising:
    receiving instructions over the communication network indicating a time period of reception, frequency range, and/or power level for selection,
    wherein selecting the subset of the digital samples is based on the instructions.

16. The method of claim 15, further comprising:
    sending, by a second processor over the communication network to the RF sensor, the instructions indicating the time period of reception, frequency range, and/or power level for selection;
    receiving, by the second processor over the communication network from the RF sensor, the subset of the digital samples; and
    detecting, by the second processor among the subset of the digital samples, an RF signal.

17. The method of claim 10, further comprising, by the processor:
    inputting the digital samples of the RF radiation to a trained model;
    identifying, based on an output from the trained model generated in response to receiving the digital samples as an input, the subset of the digital samples as indicating an RF signal among the RF radiation; and
    selecting the subset of the digital samples in response to identifying the subset of the digital samples as indicating the RF signal.

18. The method of claim 17, wherein identifying the subset of the digital samples is based on a time period of reception, frequency range, and/or power level of the digital samples indicated in the output of the trained model.

* * * * *